United States Patent [19]
Zandi et al.

[11] Patent Number: 5,748,786
[45] Date of Patent: May 5, 1998

[54] APPARATUS FOR COMPRESSION USING REVERSIBLE EMBEDDED WAVELETS

[75] Inventors: Ahmad Zandi, Cupertino, Calif.; James D. Allen, Saphanhin A. Watsingh. J. Chainat, Thailand; Edward L. Schwartz, Sunnyvale; Martin Boliek, San Francisco, both of Calif.

[73] Assignees: Ricoh Company, Ltd., Tokyo, Japan; Ricoh Corporation, Menlo Park, Calif.

[21] Appl. No.: 310,146

[22] Filed: Sep. 21, 1994

[51] Int. Cl.$^6$ ............................ G06K 9/36; G06K 9/46
[52] U.S. Cl. ........................ 382/240; 382/246; 382/248
[58] Field of Search ............................ 382/240, 239, 382/244, 247, 248, 276, 277, 246; 364/715.02, 715.03

[56] References Cited

U.S. PATENT DOCUMENTS

| | | | |
|---|---|---|---|
| 4,751,742 | 6/1988 | Meeker | 382/240 |
| 4,894,713 | 1/1990 | Delongne et al. | 348/403 |
| 4,922,544 | 5/1990 | Stansfield et al. | 382/166 |
| 4,999,705 | 3/1991 | Puri | 348/412 |
| 5,014,134 | 5/1991 | Lawton et al. | 358/261.3 |
| 5,109,451 | 4/1992 | Aono et al. | 382/166 |
| 5,235,434 | 8/1993 | Wober | 358/448 |
| 5,241,395 | 8/1993 | Chen | 358/261.3 |
| 5,315,670 | 5/1994 | Shapiro | 382/240 |
| 5,321,776 | 6/1994 | Shapiro | 382/240 |
| 5,335,016 | 8/1994 | Nakagawa | 348/405 |
| 5,379,355 | 1/1995 | Allen | 382/240 |
| 5,381,145 | 1/1995 | Allen et al. | 341/107 |

FOREIGN PATENT DOCUMENTS

| | | | |
|---|---|---|---|
| 0510933A1 | 10/1992 | European Pat. Off. | |
| 0593013A2 | 4/1994 | European Pat. Off. | |
| 0611051A1 | 8/1994 | European Pat. Off. | |
| 2211691 | 7/1989 | United Kingdom | |
| 2285374A | 7/1995 | United Kingdom | |
| WO8810049 | 12/1988 | WIPO | |
| WO9103902 | 3/1991 | WIPO | |
| 9118361 | 11/1991 | WIPO | G06G 7/00 |

OTHER PUBLICATIONS

Amir Said et al ... "Image Compression Using the Spacial-Orientation Tree", IEEE 1993 p. 279-282.

Antonini, e al., "Image Coding using Wavelet Transform", IEEE Transactions on Image Processing, vol. 1, No. 2, Apr. 1992, pp. 205-220.

Komatsu, et al., Reversible Subband Coding of Images, pp. 429-436 (Japanese), 1995.

Langdon, Jr., Glen G., "Sunset: A Hardware-Oriented Algorithm for Lossless Compression of Gray Scale Images", SPIE vol. 1444, Image Capture, Formatting, and Display, 1991, pp. 272-282.

Howard et al., "Fast and Efficient Lossless Image Compression", IEEE, 1993, pp. 351-360.

Lux, P., "A Novel Set of Closed Orthogonal Functions for Picture Code", 1977, pp. 267-274.

Shah, et al., "A Chip Set for Lossless Image Compression", IEEE Journal of Solid-State Circuits vol. 26, No. 3, Mar. 1991, pp. 237-244.

Shapiro, J.M., "An Embedded Hierarchical Image Coder Using Zerotrees of Wavelet Coefficients", IEEE, 1993, pp. 214-223.

Villasenor, et al., "Filter Evaluation and Selection in Wavelet Image Compression", IEEE, 1994, pp. 351-360.

*Primary Examiner*—Leo Boudreau
*Assistant Examiner*—Phuoc Tran
*Attorney, Agent, or Firm*—Blakely, Sokoloff, Taylor & Zafman

[57] ABSTRACT

A method and apparatus for encoding and decoding data is described. The present invention includes a method and apparatus for generating transformed signals in response to input data. In one embodiment, the transformed signals are generated using a reversible wavelet transform. The present invention also includes a method and apparatus for compressing the transformed signals into data representing a losslessly compressed version of the input data. In one embodiment, the present invention decomposes the input data using a non-minimal length reversible filter. The decomposition may be performed using multiple one-dimension filters.

29 Claims, 42 Drawing Sheets

| 0 | 1 | 0 | 1 | 0 | 1 |
|---|---|---|---|---|---|
| 1 | 0 | 1 | 0 | 1 | 0 |
| 0 | 1 | 0 | 1 | 0 | 1 |
| 1 | 0 | 1 | 0 | 1 | 0 |
| 0 | 1 | 0 | 1 | 0 | 1 |
| 1 | 0 | 1 | 0 | 1 | 0 |

...

| 0 | 1 | 2 | 3 | 0 | 1 |
|---|---|---|---|---|---|
| 1 | 2 | 3 | 0 | 1 | 2 |
| 2 | 3 | 0 | 1 | 1 | 3 |
| 3 | 0 | 1 | 2 | 3 | 0 |
| 0 | 1 | 2 | 3 | 0 | 1 |
| 1 | 2 | 3 | 0 | 1 | 2 |

...

| 0 |   | 2 |   |
|---|---|---|---|
| 1 |   | 3 |   |
| 4 |   | 6 |   |
| 5 |   | 7 |   |

LEVEL 1
HORIZONTAL

| 2 | 3 | 4 | 5 |
|---|---|---|---|
| 6 | 7 | 8 | 9 |

LEVEL 1
VERTICAL

| 8  |   |
|----|---|
| 10 |   |

LEVEL 0
HORIZ.

| 11 | 12 |
|----|----|

LEVEL 0
VERT.

APPARATUS FOR COMPRESSION USING REVERSIBLE EMBEDDED WAVELETS

FIELD OF THE INVENTION

The present invention relates to the field of data compression and decompression systems; particularly, the present invention relates to a method and apparatus for lossless and lossy encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially or temporally), two-dimensional (e.g., data changing in two spatial directions (or one spatial and one temporal dimension)), or multi-dimensional/multi-spectral data. If the compression is successful, the codewords are represented in fewer bits than the number of bits required for the uncoded input symbols (or intensity data). Lossless coding methods include dictionary methods of coding (e.g., Lempel-Ziv), run length encoding, enumerative coding and entropy coding. In lossless image compression, compression is based on predictions or contexts, plus coding. The JBIG standard for facsimile compression and DPCM (differential pulse code modulation—an option in the JPEG standard) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Recent developments in image signal processing continue to focus attention on a need for efficient and accurate forms of data compression coding. Various forms of transform or pyramidal signal processing have been proposed, including multiresolution pyramidal processing and wavelet pyramidal processing. These forms are also referred to as subband processing and hierarchical processing. Wavelet pyramidal processing of image data is a specific type of multi-resolution pyramidal processing that may use quadrature mirror filters (QMFs) to produce subband decomposition of an original image. Note that other types of non-QMF wavelets exist. For more information on wavelet processing, see Antonini, M., et al., "Image Coding Using Wavelet Transform", *IEEE Transactions on Image Processing*, Vol. 1, No. 2, April 1992; Shapiro, J., "An Embedded Hierarchical Image Coder Using Zerotrees of Wavelet Coefficients", *Proc. IEEE Data Compression Conference*, pgs. 214–223, 1993.

One problem associated with much of prior art wavelet processing is that a large memory is required to store all of the data while it is being processed. In other words, in performing wavelet processing, all of the data must be examined before encoding is performed on the data. In such a case, there is no data output until at least one full pass has been made through all of the data. In fact, wavelet processing typically involves multiple passes through the data. Because of this, a large memory is often required. It is desirable to utilize wavelet processing, while avoiding the requirement of a large memory. Furthermore, it is desirable to perform wavelet processing using only a single pass through the data.

Many wavelet or subband transform implementations require filters in a particular canonical form. For example, low and high-pass filters must be the same length, the sum of the squares of the coefficients must be one, the high-pass filter must be the time and frequency reverse of the low-pass filter, etc. (See U.S. Pat. No. 5,014,134 issued May 1991 to Lawton et al.). It is desirable to allow a wider class of filters. That is, it is desirable to provide wavelet or subband transform implementations that use low and high-pass filters that are not the same length, the sum of the squares of the coefficients need not be one, the high-pass filter need not be the time and frequency reverse of the low-pass filter, etc.

The present invention provides lossy and lossless compression using a transform that provides good energy compaction. The present invention also provides for modeling of joint spatial/frequency domain data (wavelet transform domain) to permit efficient compression. Also provided is progressive transmission with rate or distortion being selectable by the user after encoding.

SUMMARY OF THE INVENTION

A method and apparatus for encoding and decoding data is described. The present invention includes a method and apparatus for generating transformed signals in response to input data. In one embodiment, the transformed signals are generated using a reversible wavelet transform. The present invention also includes a method and apparatus for compressing the transformed signals into data representing a losslessly compressed version of the input data. In one embodiment, the present invention decomposes the input data using a non-minimal length reversible filter. The decomposition may be performed using multiple one-dimension filters.

The present invention also includes a method and apparatus to perform embedded coding of the transformed signals. The embedded coding of the present invention includes ordering the series of coefficients and performing bit significance embedding on the transformed signals.

The present invention also includes a method and apparatus for decompressing the losslessly compressed version of the input data into transformed signals. The present invention also provides for lossy compression of input signals by truncation of losslessly compressed data. The present invention also includes a method and apparatus for generating the input data from the transformed signals into a reconstructed version of the input data using an inverse reversible wavelet transform.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6B and 6B-1 (continued) is a flow chart of one embodiment of the single list zerotree modeling for encoding in the present invention using reduced flag memory.

DETAILED DESCRIPTION OF THE INVENTION

Figure 1A:
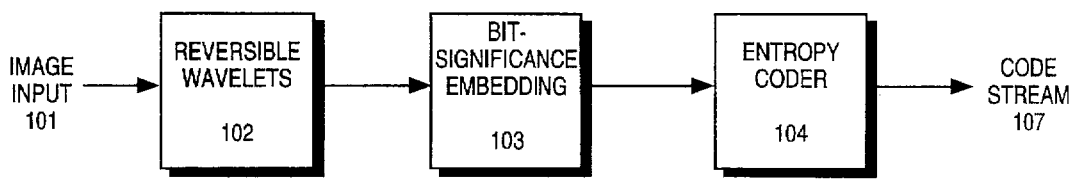
FIG. 1A is a block diagram of one embodiment of the encoding portion of the coding system of the present invention.

A method and apparatus for compression and decompression is described. In the following detailed description of the present invention numerous specific details are set forth, such as types of coders, numbers of bits, signal names, etc., in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

The present invention provides a compression/decompression system having an encoding portion and a decoding portion. The encoding portion is responsible for encoding input data to create compressed data, while the decoding portion is responsible for decoding previously encoded data to produce a reconstructed version of the original input data. The input data may comprise a variety of data types, such as image (still or video), audio, etc. In one embodiment, the data is digital signal data; however, analog data digitized, text data formats, and other formats are possible. The source of the data may be a memory or channel for the encoding portion and/or the decoding portion.

In the present invention, elements of the encoding portion and/or the decoding portion may be implemented in hardware or software, such as that used on a computer system. The present invention provides a lossless compression/decompression system. The present invention may also be configured to perform lossy compression/decompression.

FIG. 1A is a block diagram of one embodiment of the encoding portion of the system. Note the decoding portion of the system operates in reverse order, along with the data flow. Referring to FIG. 1A, an input image data 101 is received by wavelet transform block 102. The output of wavelet transform block 102 is coupled to a bit-significance embedding block 103. In response to the output from wavelet transform block 102, the bit-significance embedding block 103 produces at least one bit stream that is received by an entropy coder 104. In response to the input from bit-significance embedding 103, entropy coder 104 produces a code stream 107.

Figure 1B:
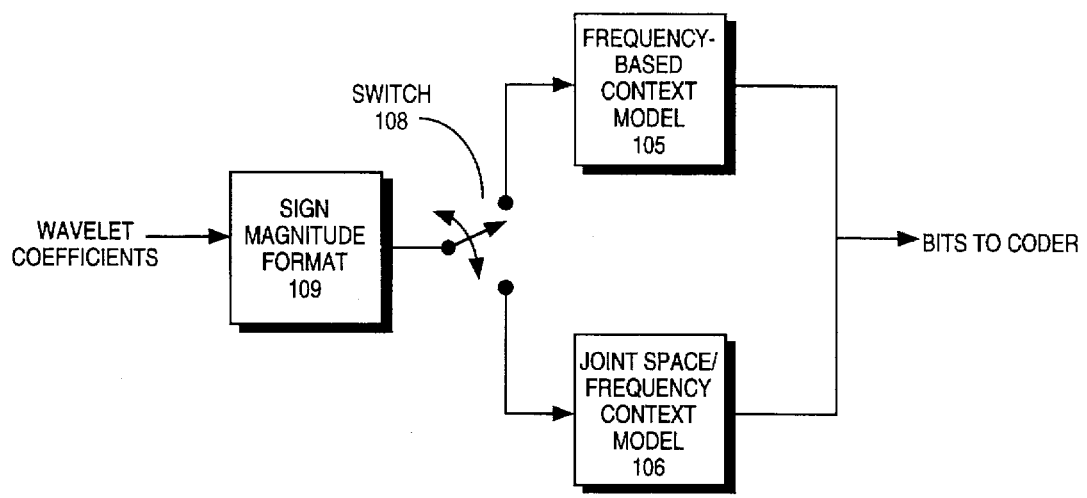
FIG. 1B is a block diagram of one embodiment of the bit significance embedding of the present invention.

In one embodiment, the bit significance embedding block 103 comprises a sign magnitude formatting unit 109, a frequency-based context model 105 and a joint space/frequency context model 106, such as shown in FIG. 1B. In one embodiment, the joint space/frequency context model 106 comprises a horizon context model. In some embodiments, frequency-based context model block 105 comprises a zerotree model. In another embodiment, frequency-based context model 105 comprises significance tree model. The sign-magnitude unit 109, frequency-based context model 105 and the joint space/frequency (JSF) context model 106 perform bit-significance embedding in the present invention. The input of the sign magnitude unit 109 is coupled to the output of the wavelet transform coding block 102. The output of sign magnitude unit 109 is coupled to a switch 108. Switch 108 is coupled to provide the output of the sign magnitude unit 109 to an input of either frequency-based modeling block 105 or joint space/frequency modeling block 106. The output of frequency-based coding block 105 and horizon order coding block 106 are coupled to the input of entropy coder 104. Entropy coder 104 produces the output code stream 107.

Referring back to FIG. 1A, in the present invention, the image data 101 is received and transform coded using reversible wavelets in wavelet transform block 102 as defined later below, to produce a series of coefficients representing a multi-resolution decomposition of the image. These coefficients are received by the bit-significance embedding 103.

The bit significant embedding 103 orders and converts the coefficients into sign-magnitude format and, based on their significance (as described below later), the formatted coefficients are subjected to a combination of different embedded modeling methods. In the present invention, the formatted coefficients are subjected to either one of two embedded modeling methods (e.g., frequency-based modeling and JSF modeling).

In one embodiment, the formatted coefficients are subjected to either frequency-based modeling or joint spatial/frequency modeling. When the input data comprises image data having multiple bitplanes, in the present invention, a number of bitplanes are encoded with frequency-based modeling, while the remaining bitplanes are encoded with JSF modeling. The decision as to which method to use on which bitplanes may be a user parameter. In one embodiment, the high-order bitplanes of the coefficients are ordered and coded with the frequency-based modeling of the present invention. In the frequency-based context model method of the present invention, the prediction of significance of the coefficient bits is related to the pyramidal structure of the wavelet. The low-order coefficient bitplanes are ordered and encoded with the joint space/frequency context model of the present invention. The JSF modeling, for example horizon modeling, provides advantages over the frequency-based encoding for bitplanes that are less correlated with respect to the frequency domain coefficient relations.

The results of bit-significance embedding is decisions (or symbols) to be coded by the entropy coder. In one embodiment, all decisions are sent to a single coder. In another embodiment, decisions are labeled by significance, and decisions for each significance level are processed by different (physical or virtual) multiple coders.

The bit streams resulting from the frequency-based context model block 105 and JSF context model block 106 are encoded in order of significance using entropy coder 104. In an embodiment, entropy coder 104 comprises a binary entropy coder. In one embodiment, entropy coder 104 comprises a Q-coder, a B-coder defined in U.S. Pat. No. 5,272,478, or a coder such as described in U.S. patent application Ser. No. 08/016,035, entitled "Method and Apparatus for Parallel Decoding and Encoding of Data", filed Feb. 10, 1993. For more information on the Q-coder, see Pennebaker, W. B., et al., "An Overview of the Basic Principles of the Q-coder Adaptive Binary Arithmetic," *IBM journal of Research and Development*, Vol. 32, pg. 717–26, 1988. In one embodiment, a single coder produces a single output code stream. In another embodiment, multiple (physical or virtual) coders produce multiple (physical or virtual) data streams.

Wavelet Decomposition

The present invention initially performs decomposition of an image (in the form of image data) or another data signal using reversible wavelets. In the present invention, a reversible wavelet transform comprises an implementation of an exact-reconstruction system in integer arithmetic, such that a signal with integer coefficients can be losslessly recovered. By using reversible wavelets, the present invention is able to provide lossless compression with finite precision arithmetic. The results generated by applying the reversible wavelet transform to the image data are a series of coefficients. In one embodiment of the present invention, the reversible wavelet transform is implemented using a set of filters. In one embodiment, the filters are a two-tap low-pass filter and a six-tap high-pass filter. In one embodiment, these filters are implemented using only addition and subtraction operations (plus hardwired bit shifting). Also, in the present invention, the high-pass filter generates its output using the results of the low-pass filter. The resulting high-pass coefficients are only a few bits greater than the pixel resolution and the low-pass coefficients are the same as the pixel resolution. Because only the low-pass coefficients are repeatedly filtered in a pyramidal decomposition, resolution is not increased in multi-level decompositions.

Figure 2A:
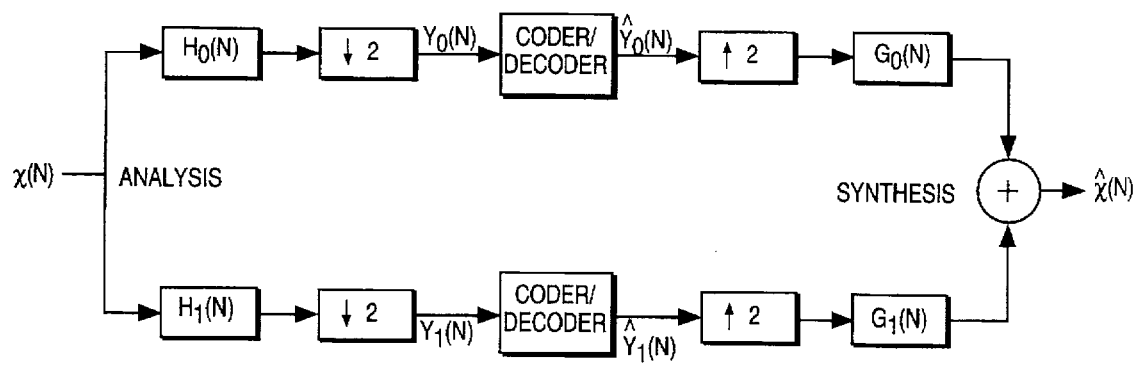
FIG. 2A is a block diagram of a wavelet analysis/synthesis system.

A wavelet transform system is defined by a pair of FIR analysis filters $h_0(n)$, $h_1(n)$, and a pair of FIR synthesis filters $g_0(n)$, $g_1(n)$. In the present invention, $h_0$ and $g_0$ are the low-pass filters and $h_1$ and $g_1$ are the high-pass filters. A block diagram of the wavelet system is shown in FIG. 2A. Referring to FIG. 2A, for an input signal, $x(n)$, the analysis filters $h_0$ and $h_1$ are applied and the outputs are decimated by 2 (critically subsampled) to generate the transformed signals $y_0(n)$ and $y_1(n)$, referred to herein as low-passed and high-passed coefficients respectively. The analysis filters and their corresponding decimation, or subsampling, blocks form the analysis portion of the wavelet transform system. The coder/decoder contain all the processing logic and routines performed in the transformed domain (e.g., prediction, quantization, coding, etc.). The wavelet system shown in FIG. 2A also includes a synthesis portion in which the transformed signals are upsampled by 2 (e.g., a zero is inserted after every term) and then passed through synthesis filters, $g_0(n)$ and $g_1(n)$. The low-passed coefficients $y_0(n)$ are passed through the low-pass synthesis filter $g_0$ and the high-passed $y_1(n)$ are passed through the high-passed filter $g_1$. The output of filters $g_0(n)$ and $g_1(n)$ are combined to produce $\hat{x}(n)$.

While downsampling and upsampling are performed in some embodiments, in other embodiments, filters are used such that computations which are unneeded due to downsampling and upsampling are not performed.

The wavelet system may be described in terms of the Z-transform, where $X(Z)$, $\hat{X}(Z)$ are the input and output signals respectively, $Y_0(Z)$, $Y_1(Z)$ are the low-passed and high-passed transformed signals, $H_0(Z)$, $H_1(Z)$ the low-pass and the high-pass analysis filters and finally $G_0(Z)$, $G_1(Z)$ are the low-pass and the high-pass synthesis filters. If there is no alteration or quantization in the transform domain, the output $\hat{X}(Z)$ in FIG. 2, is given by $$\hat{X}(Z) = \frac{1}{2} [H_0(Z)G_0(Z) + H_1(Z)G_1(Z)]X(Z) +$$

$$\frac{1}{2} [H_0(-Z)G_0(Z) + H_1(-Z)G_1(Z)]X(-Z).$$

In the present invention, the second term of $\hat{X}(Z)$, referred to as the "aliasing" term, is canceled because the synthesis filters are defined to be the quadrature mirror of the analysis filters, i.e., $$\begin{cases} G_0(Z) = H_1(-Z) \\ G_1(Z) = -H_0(-Z) \end{cases}$$

In terms of the filter coefficients, $$\begin{cases} g_0(n) = (-1)^n h_1(n) \\ g_1(n) = -(-1)^n h_0(n) \end{cases}$$

Therefore, for a quadrature mirror filter pairs, after substitution, the output is:

$$\hat{X}(z) = \frac{1}{2} [H_0(Z)H_1(-Z) - H_1(Z)H_0(-Z)]X(Z).$$

Figure 4A:
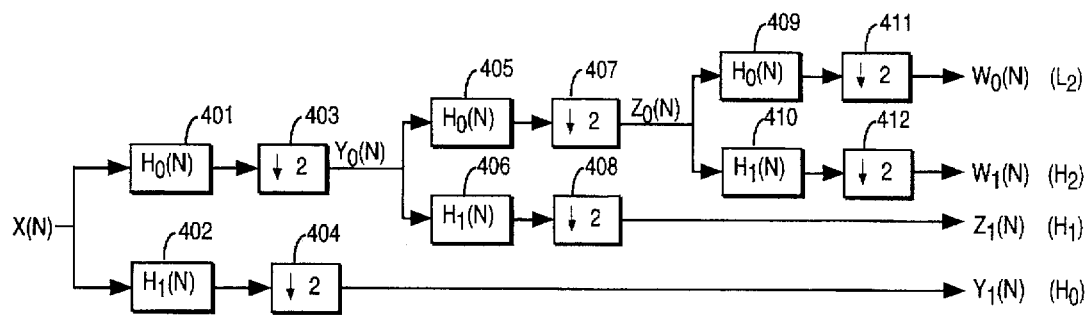
FIG. 4A is a block diagram of a three-level pyramidal transform.

Thus, in the quadrature mirror system of the present invention, the output is defined in terms of the analysis filters only. The wavelet transform is applied recursively to the transformed signals in that the outputs generated by the filters are used as inputs, directly or indirectly, into the filters. In the described embodiment, only the low-passed transformed component $y_0(n)$ is recursively transformed such that the system is pyramidal. An example of such a pyramidal system is shown in FIG. 4A.

The Z transform is a convenient notation for expressing the operation of hardware and/or software on data. Multiplication by $Z^{-m}$ models a m clock cycle delay in hardware, and an array access to the mth previous element in software. Such hardware implementations include memory, pipestages, shifters, registers, etc.

In the present invention, the signals, $x(n)$ and $\hat{x}(n)$, are identical up to a multiplicative constant and a delay term, i.e. in terms of the Z-transform, $$\hat{X}(Z) = cZ^{-m}X(Z).$$

This is called an exact reconstruction system. Thus, in one embodiment of the present invention, the wavelet transform initially applied to the input data is exactly reconstructable.

One embodiment of the present invention using the Hadamard Transform is an exact reconstruction system, which in normalized form has the following representation in the Z-domain:

$$\begin{cases} H_0(Z) = \frac{1}{\sqrt{2}} (1 + Z^{-1}) \\ H_1(Z) = \frac{1}{\sqrt{2}} (1 - Z^{-1}) \end{cases}$$

After substitution, the output is $$\hat{X}(Z) = Z^{-1} X(Z),$$

which is clearly an exact-reconstruction. For more information on the Hadamard Transform, see Anil K. Jain, Fundamentals of Image Processing, pg. 155.

A reversible version of the Hadamard Transform is referred to herein as the S-transform. For more information on S-transform, see Said, A. and Pearlman, W. "Reversible Image Compression via Multiresolution Representation and Predictive Coding," Dept. of Electrical, Computer and Systems Engineering, Renssealaer Polytechnic Institute, Troy, N.Y. 1993. Since the Hadamard Transform is an exact reconstruction transform, the following unnormalized version (which differs from the Hadamard Transform by constant factors) is also an exact reconstruction transform:

$$\begin{cases} h_0(Z) = \frac{1}{2} (1 + Z^{-1}) \\ h_1(Z) = 1 - Z^{-1} \end{cases}$$

Given the samples of the input signal as $x_0$, $x_1$, the S-transform is a reversible implementation of this system as, $$\begin{cases} y_0(0) = \lfloor (x(0) + x(1))/2 \rfloor \\ y_1(0) = x(0) - x(1) \end{cases}$$

The notation $\lfloor . \rfloor$ means to round down or truncate and is sometimes referred to as the floor function. Similarly, the ceiling function $\lceil . \rceil$ means round up to the nearest integer.

The proof that this implementation is reversible follows from the fact that the only information lost in the approximation is the least significant bit of $x(0)+x(1)$. But since the least significant bits of $x(0)+x(1)$ and $x(0)-x(1)$ are identical, this can be recovered from the high-pass output $y_1(0)$. In other words, $$\begin{cases} x(0) = y_0(0) + \lfloor (y_1(0) + 1)/2 \rfloor \\ x(1) = y_0(0) - \lceil (y_1(0) - 1)/2 \rceil \end{cases}$$

The S-transform is a non-overlapping transform using minimal length reversible filters. Minimal length filters comprise a pair of filters, where both filters have two taps. Minimal length transforms do not provide good energy compaction. Minimal length filters implement a non-overlapped transform because the length of the filters is equal to the number of filters. Overlapped transforms use at least one filter which has length greater than the number of filters. Overlapped transforms using longer (non-minimal length) filters can provide better energy compaction. The present invention provides non-minimal length reversible filters which permits an overlapped transform.

Another example of an exact-reconstruction system comprises the Two/Six (TS)-Transform which has the Z-domain definition, $$\begin{cases} H_0(Z) = \frac{1}{\sqrt{2}} (1 + Z^{-1}) \\ H_1(Z) = \frac{1}{8\sqrt{2}} (-1 - Z^{-1} + 8Z^{-2} - 8Z^{-3} + Z^{-4} + Z^{-5}) \end{cases}$$

After substitution, the output is $$\hat{X}(Z) = 2Z^{-3} X(Z),$$

which is an exact-reconstruction transform.

The rational unnormalized version of the TS-transform comprises:

$$\begin{cases} h_0(Z) = \frac{1}{2} (1 + Z^{-1}) \\ h_1(Z) = \frac{1}{8} (-1 - Z^{-1} + 8Z^{-2} - 8Z^{-3} + Z^{-4} + Z^{-5}) \end{cases}$$

If $x(0), x(1), \ldots x(5)$ are six samples of the signal, then the first three low-passed coefficients $y_0(0)$, $y_0(1)$, $y_0(2)$ and the first high-passed coefficient $y_1(0)$ are given by:

$$\begin{cases} y_0(0) = \lfloor (x(0) + x(1))/2 \rfloor \\ y_0(1) = \lfloor (x(2) + x(3))/2 \rfloor \\ y_0(2) = \lfloor (x(4) + x(5))/2 \rfloor \end{cases}$$

$$y_1(0) = \lfloor (-(x(0) + x(1))) + 8(x(2) - x(3)) + (x(4) + x(5))/8 \rfloor.$$

However, the straight forward implementation of the rational unnormalized version of the TS-transform is not reversible. The following example shows that the implementation is non-reversible locally. A longer sequence can be constructed as an example for the global case. Since $-(x(0)+x(1))+(x(4)+x(5)) \neq -y_0(0)+y_0(2)$ because of rounding to compute $y_0(0)$ and $y_0(2)$, this transform is not reversible using local information.

For example, if $x(0)=1$, $x(1)=1$, $x(2)=3$, $x(3)=1$, $x(4)=1$, $x(5)=1$, then $y_0(0) = \lfloor (1+1)/2 \rfloor = 1$ $y_0(1) = \lfloor (3+1)/2 \rfloor = 2$ $y_0(2) = \lfloor (1+1)/2 \rfloor = 1$ $y_1(0) = \lfloor [-(1+1)+8(3-1)+(1+1)]/8 \rfloor = \lfloor (-2+16+2)/8 \rfloor = 2$ and if $x(0)=1$, $x(1)=2$, $x(2)=4$, $x(3)=1$, $x(4)=1$, $x(5)=1$, then $y_0(0) = \lfloor (1+2)/2 \rfloor = 1$ $y_0(1) = \lfloor (4+1)/2 \rfloor = 2$ $y_0(2) = \lfloor (1+1)/2 \rfloor = 1$ $y_1(0) = \lfloor [-(1+2)+8(4-1)+(1+1)]/8 \rfloor = \lfloor (-3+24+2)/8 \rfloor = \lfloor 23/8 \rfloor = 2$ Since $y_0(0)$, $y_0(1)$, $y_0(2)$ and $y_1(0)$ are the same for two different sets of inputs $x(0) \ldots x(5)$, the transform is not reversible, since given $y_0(0), \ldots y_1(0)$ it cannot be determined from this local information which of the two sets were input. (Note that it can be proved that the transform is not reversible using global information from all coefficients.)

Now consider a reversible TS-transform, which is referred to herein as an RTS-transform, which provides a different high-pass filtering operation.

If $x(0), x(1), x(2), x(3), x(4), x(5)$ are 6 samples of the signal, then the first three low-passed coefficients $y_0(0)$, $y_0(1)$, $y_0(2)$ and the first high-passed coefficient $y_1(0)$ are given by, $$\begin{cases} y_0(0) = \lfloor (x(0)+x(1))/2 \rfloor \\ y_0(1) = \lfloor (x(2)+x(3))/2 \rfloor \\ y_0(2) = \lfloor (x(4)+x(5))/2 \rfloor \end{cases}$$

$$\begin{aligned} y_1(0) &= \lfloor (-\lfloor x(0)+x(1))/2 \rfloor + 4(x(2)-x(3)) + \lfloor (x(4)+x(5))/2 \rfloor )/4 \rfloor \\ &= \lfloor (-y_0(0)+4(x(2)-x(3))+y_0(2))/4 \rfloor. \end{aligned}$$

Since $$x(2)-x(3)=y_1(0)-\lfloor(-y_0(0)+y_0(2))/4\rfloor$$

then $x(2)-x(3)$ is completely known. With $y_0(1)=\lfloor(x(2)+x(3))/2\rfloor$ and $x(2)-x(3)$ and $x(2)-x(3)$ defined above, $x(2)$ and $x(3)$ may be recovered because the least significant bits of $x(0)+(1)$ and $x(0)-x(1)$ are identical.

Specifically, let $$d(0)=x(2)-x(3)=y_1(0)-\lfloor(-y_0(0)+y_0(2)/4)\rfloor$$

$$x(2)=y_0(1)+\lfloor(d(0)+1)/2\rfloor$$

$$x(3)=y_0(1)+\lceil(d(0)-1)/2\rceil$$

One embodiment of the forward filter for the RTS-transform is shown in Appendix A implemented in the programming language "C". Note that mathematically the equation:

$$\frac{1}{8}(-1-Z^{-1}+8Z^{-2}-8Z^{-3}+Z^{-4}+Z^{-5})$$

and the equation:

$$\frac{1}{4}\left(\frac{1}{2}(-1-Z^{-1})+4(Z^{-2}-Z^{-3})+\frac{1}{2}(Z^{-4}+Z^{-5})\right)$$

are the same when performed with infinite precision arithmetic. The reason the second equation represents a reversible filter is apparent when physically implemented with integer arithmetic. Exemplary hardware implementations of the low-pass filter and the high-pass filter are described in conjunction with FIGS. 10 and 11.

Note that in both the S-transform and the RTS-transform, the low-pass filter is implemented so that the range of the input signal $x(n)$ is the same as the output signal $y_0(n)$. For example, if the signal is an 8-bit image, the output of the low-pass filter is also 8 bits. This is an important property for a pyramidal system where the low-pass filter is successively applied because in prior art systems the range of the output signal is greater than that of the input signal, thereby making successive applications of the filter difficult. In addition, the low-pass filter has only two taps which makes it a non-overlapping filter. This property is important for the hardware implementation, as is described below later.

In one embodiment, with reference to the RTS-transform, the low-pass filter and high-pass filter are defined as:

$$\begin{cases} h_0(Z) = \frac{1}{2}(1+Z^{-1}) \\ h_1(Z) = \frac{1}{4}\left(-\frac{1}{2}(1+Z^{-1})+4(Z^{-2}-Z^{-3})+\frac{1}{2}(Z^{-4}+Z^{-5})\right) \end{cases}$$

Thus, the results from the low-pass filter may be used twice (in the first and third terms) in the high-pass filter. Therefore, only two other additions need to be performed to arrive at the results of the high-pass filter.

Figure 2B:
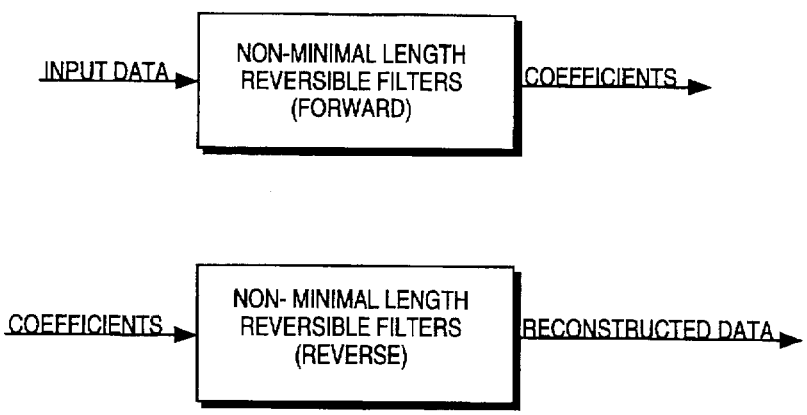
FIG. 2B illustrates forward and reverse representations of transform systems for filtering with non-overlapped minimal length reversible filters.

Many overlapped, non-minimal length reversible filters may be used in the present invention. Such forward and inverse representations of the transform system for filtering with non-overlapped minimal length reversible filters is shown in FIG. 2B. For instance, the following class of filters may be used in the present invention. For an integer $L \geq z$, $$d(0)=x(2\lfloor L/2 \rfloor+1))-x(2\lfloor L/2 \rfloor+1)+1)$$

and $$y_0(0)=\lfloor(x(0)+x(1))/2\rfloor$$

$$y_0(1)=\lfloor(x(2)+x(3))/2\rfloor$$

$$y_0(L-1)=\lfloor(x(2\lfloor(L-1)/2\rfloor)+x(2\lfloor(L-1)/2\rfloor+1))/2\rfloor$$

and $$y_1(0) = \frac{\sum_{i=0}^{\lfloor L/2 \rfloor} a_i y_0(i) + bd(0) + \sum_{j=\lfloor L/2 \rfloor+2}^{L-1} c_i y_0(j)}{k}$$

The length of the high-pass filter is 2L. If L is odd, the filter may be closer to a symmetric filter. If $a_i$, b, $c_i$ and k are integers and $k \leq b$, then the filter is reversible. If $a_i$, b, $c_i$, and k are powers of two (or the negative or complement of a power of two), then the implementation of the filter may be simplified. If k=b (regardless of the values of $a_i$ and $c_i$) then the range of the output of the high-pass filter $y_i$ is minimized. For each $a_i$, if there is exactly one $c_j$ where $a_i=-c_j$, then the high-pass filter will have no response to a constant input. If $a_i=-c_j$ when j-(L-1)=i, then the filter may be closer to a symmetric filter.

Another useful property is $$\sum_{i=0}^{\lfloor L/2 \rfloor} [(a_i)(2i)^m + (a_i)(2i+1)^m] + (b)(2(\lfloor L/2 \rfloor)+1))^m -$$

$$(b)(2(\lfloor L/2 \rfloor)+1)+1)^m + \sum_{j=\lfloor L/2 \rfloor+2}^{L-1} [c_j(2j)^m + c_j(2j+1)^m] = 0$$

This makes the high-pass filter have no response to a linearly changing input when m=1 and a quadratically changing input when m=2, etc., where m is the moment condition. This property is the principle reason that the RTS-transform has better energy compaction than the S-transform.

While filters must meet the minimum constraints for reversibility, for different applications, filters may be used that meet none, some or all of the other properties. In some embodiments, one of the following example high-pass filters is used. The filters are listed in a notation that just lists the interger coefficients of the rational version of the filter, to avoid obscuring the invention.

1 1 −4 −4 16 −16 4 4 −1 −1

1 1 −3 −3 8 −8 3 3 −1 −1

−1 −1 0 0 16 −16 0 0 1 1

−1 −1 4 4 −16 −16 256 −256 16 16 −4 −4 1 1 3 3 −22 −22 128 −128 22 22 −3 −3

The last filter is referred to as the (Two/Ten) TT-filter, and it has the property that it has no response to a cubically increasing function. Note-that since 22=16+2×3 and 3=2+1, this filter can be implemented with a total of seven additions and subtractions.

The strict reversibility requirements for filters can be relaxed by noting the following. High pass coefficients are encoded and decoded in the some order. Pixel values corresponding to previously decoded high pass coefficients are known exactly, so they can be used in current high pass filtering. For example, the following filter can be used when a raster order is used.

$$H_I(Z) = \left\lfloor \frac{1}{4} \left( \left\lfloor -\frac{1}{2} (1+Z^{-1}) \right\rfloor + \left\lfloor \frac{1}{2} (8(Z^{-2}-Z^{-3}) + (Z^{-4}+Z^{-5})) \right\rfloor \right) \right\rfloor$$

The use of a single fixed high-pass filter is not required. Adaptive filters may be used or multiple filters may be used. The data used to adapt or select among multiple filters must be restricted to data that is available in the decoder prior to a particular inverse filtering operation.

One way to use multiple filters is to process the high-pass coefficients progressively. Alternate high-pass filtering operations ($y_1(0), y_1(2), y_1(4), \ldots$) may be processed first with a reversible filter such as the RTS high-pass filter. The remaining processing ($y_1(1), y_1(3), y_1(5), \ldots$) may use a non-reversible filter of up to six taps, because the exact values of the inputs to the overlap portion of the filter are known. For example, any of the following filters may be used.

```
-1  3 -3  1
-1  4 -4  1
-3  8 -8  3
 1 -5 10 -10  5 -1
 1 -4  8 -8  4 -1
```

In some embodiments, the high pass filter may be replaced with a prediction/interpolation operation. A predictor/interpolator may predict the difference between a pair of inputs using any data that is available in the decoder prior to a particular prediction/interpolation operation. The predicted difference is subtracted from the actual difference of the inputs and is output. In one embodiment, prior art prediction methods used in DPCM, progressive coding or spatial domain coding are used.

Using the low-pass and high-pass filters of the present invention, a multi-resolution decomposition is performed. The number of levels of composition is variable and may be any number; however, currently the number of decomposition levels equals from two to five levels.

Figure 3A:
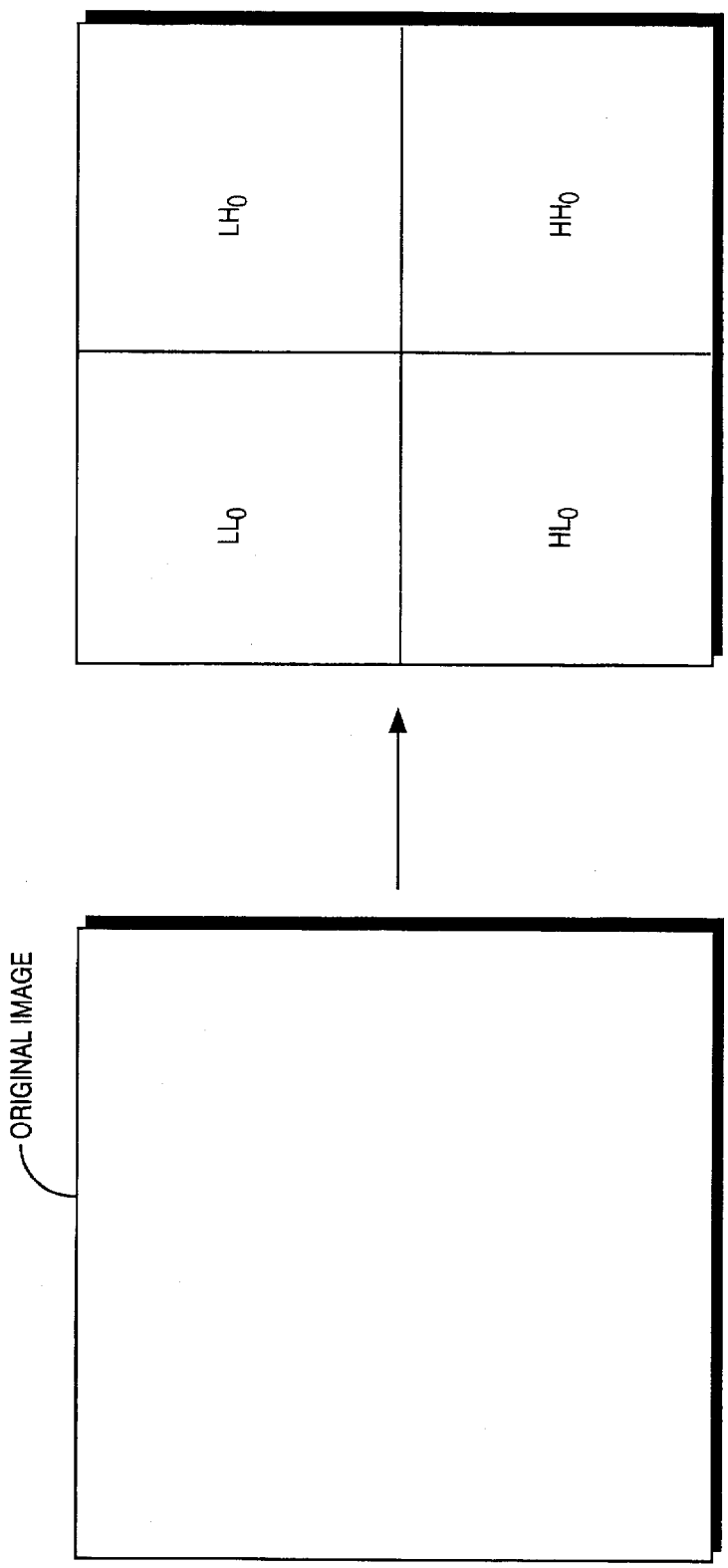
FIGS. 3A–D illustrate results of performing a four level decomposition.
Figure 3C:
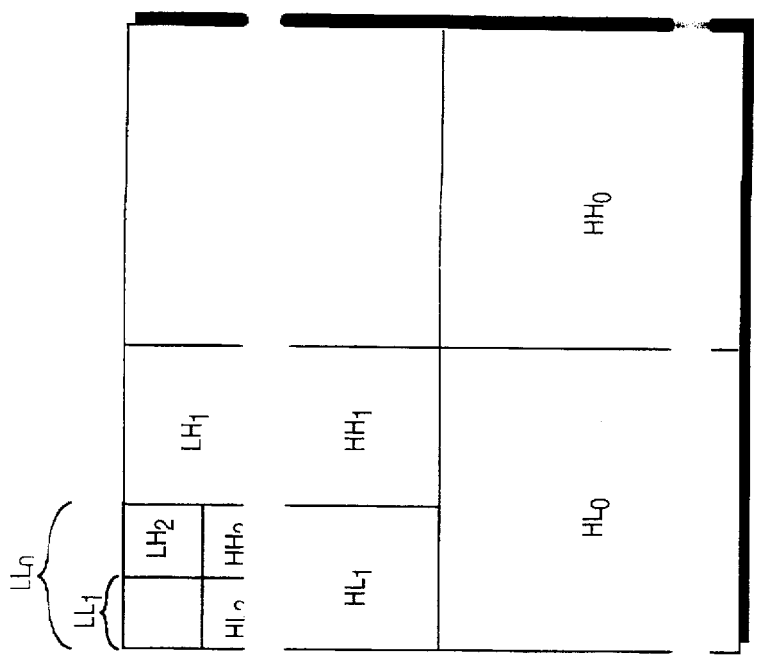
Figure 3B:
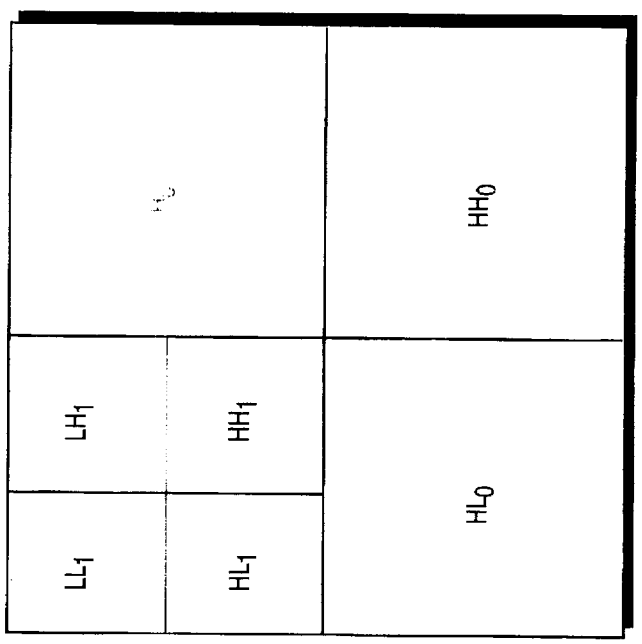

For example, if the reversible wavelet transform is recursively applied to an image, the first level of decomposition operates on the finest detail, or resolution. At a first decomposition level, the image is decomposed into four sub-images (e.g., subbands). Each subband represents a band of spatial frequencies. The first level subbands are designated $LL_0$, $LH_0$, $HL_0$ and $HH_0$. The process of decomposing the original image involves subsampling by two in both horizontal and vertical dimensions, such that the first level subbands $LL_0$, $LH_0$, $HL_0$ and $HH_0$ each have one-fourth as many coefficients as the input has pixels (or coefficients) of the image, such as shown in FIG. 3A.

Subband $LL_0$ contains simultaneously low frequency horizontal and low frequency vertical information. Typically a large portion of the image energy is concentrated in this subband. Subband $LH_0$ contains low frequency horizontal and high frequency vertical information (e.g., horizontal edge information). Subband $HL_0$ contains high frequency horizontal information and low frequency vertical information (e.g., vertical edge information). Subband $HH_0$ contains high frequency horizontal information and high frequency vertical information (e.g., texture or diagonal edge information).

Figure 3D:
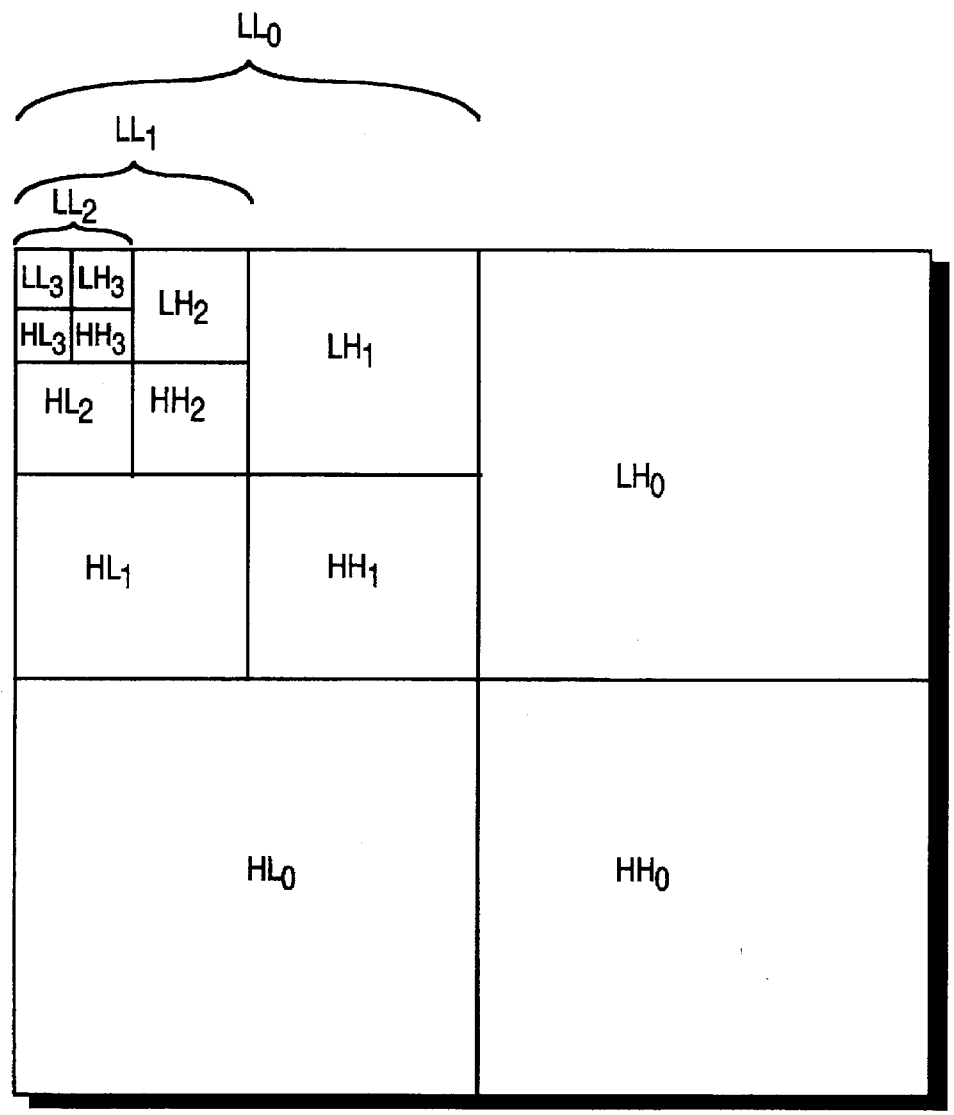

Each of the succeeding second, third and fourth lower decomposition levels is produced by decomposing the low frequency LL subband of the preceding level. This subband $LL_0$ of the first level is decomposed to produce subbands $LL_1$, $LH_1$, $HL_1$ and $HH_1$ of the moderate detail second level. Similarly, subband $LL_1$ is decomposed to produce coarse detail subbands $LL_2$, $LH_2$, $HL_2$ and $HH_2$ of the third level. Also, subband $LL_2$ is decomposed to produce coarser detail subbands $LL_3$, $LH_3$, $HL_3$ and $HH_3$ of the third level, as shown in FIG. 3D. Due to subsampling by two, each second level subband is one-sixteenth the size of the original image. Each sample (e.g., pel) at this level represents moderate detail in the original image at the same location. Similarly, each third level subband is 1/64 the size of the original image. Each pel at this level corresponds to relatively coarse detail in the original image at the same location. Also, each fourth level subband is 1/256 the size of the original image.

Since the decomposed images are physically smaller than the original image due to subsampling, the same memory used to store the original image can be used to store all of the decomposed subbands. In other words, the original image and decomposed subbands $LL_0$ and $LL_1$ are discarded and are not stored in a three level decomposition.

A parent-child relationship exists between a subband component representative of coarse detail relative to a corresponding subband component at the next finer detail level.

Although only four subband decomposition levels are shown, additional levels could be developed in accordance with the requirements of a particular system. Also, with other transformations such as DCT or linearly spaced subbands, different parent-child relationships may be defined.

The process of multi-resolution decomposition may be performed using a filtering system, such as that depicted in FIG. 4A. An input signal representing a one-dimensional signal with length L is low-pass and high-pass filtered by filter units 401 and 402 before being subsampled by two via units 403 and 405. A subsampled output signal from unit 403 is low-pass and high-pass filtered by units 405 and 406 before being subsampled by two via units 407 and 408, respectively. Subband components L and H appear at respective outputs of units 407 and 408. Similarly, the output signal from unit 405 is low-pass and high-pass filtered by units 409 and 410 before being subsampled by two via units 411 and 412, respectively. Subband components L and H appear at respective outputs of units 411 and 412. As described above, the filters in one embodiment of the present invention used in subband decomposition are digital quadrature mirror filters for splitting the horizontal and vertical frequency bands into low frequency and high frequency bands.

Figure 4B:
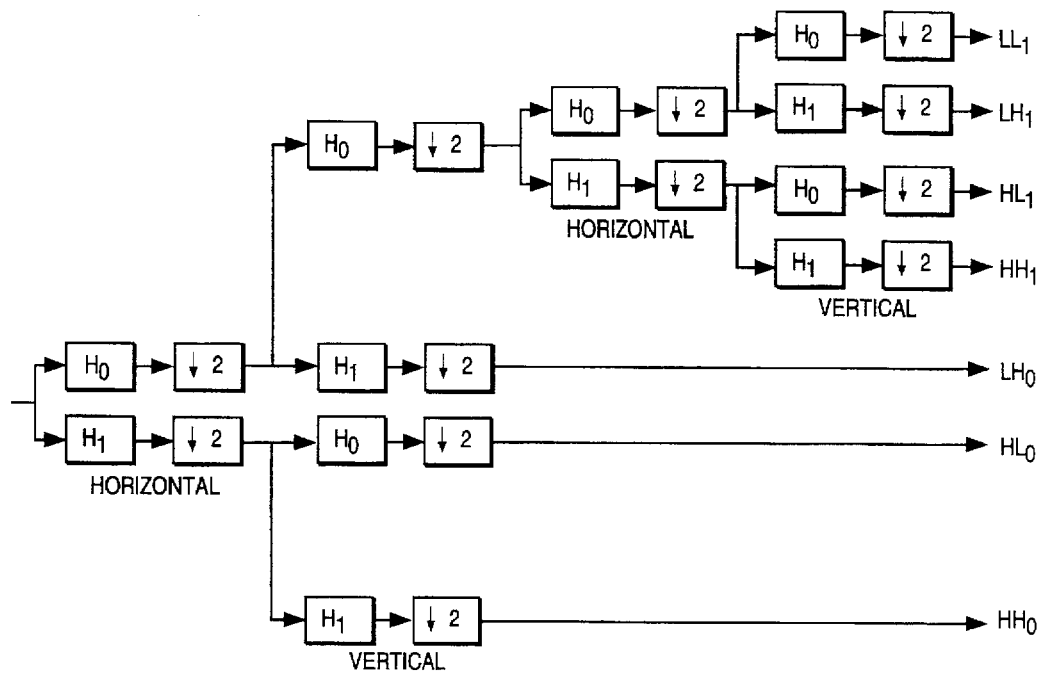
FIG. 4B is a block diagram of a two-dimensional, two level transform.
Figure 4C:
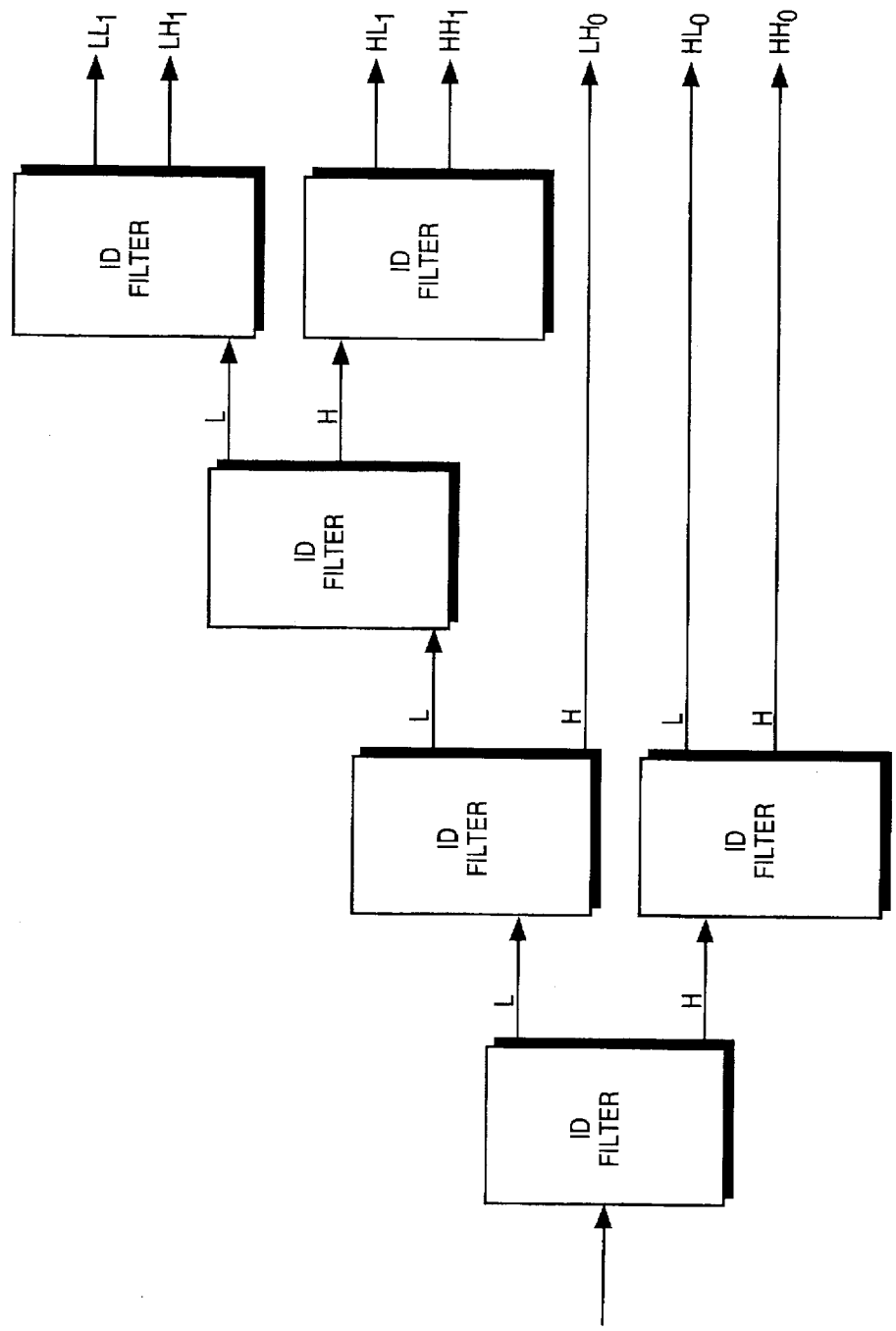
FIG. 4C is a block diagram illustrating one-dimensional filters performing a multi-resolution decompression.

FIG. 4B illustrates a two-dimensional, two-level transform. FIG. 4C also illustrates a two-dimensional, two-level transform implemented using one-dimensional filters, such as those shown in FIGS. 10 and 11. The one-dimensional filters are applied at every other position, to avoid computation rendered unnecessary by subsampling. In one embodiment, one-dimensional filters share computation between low-pass and high-pass computation.

Figures 4D, 4E:
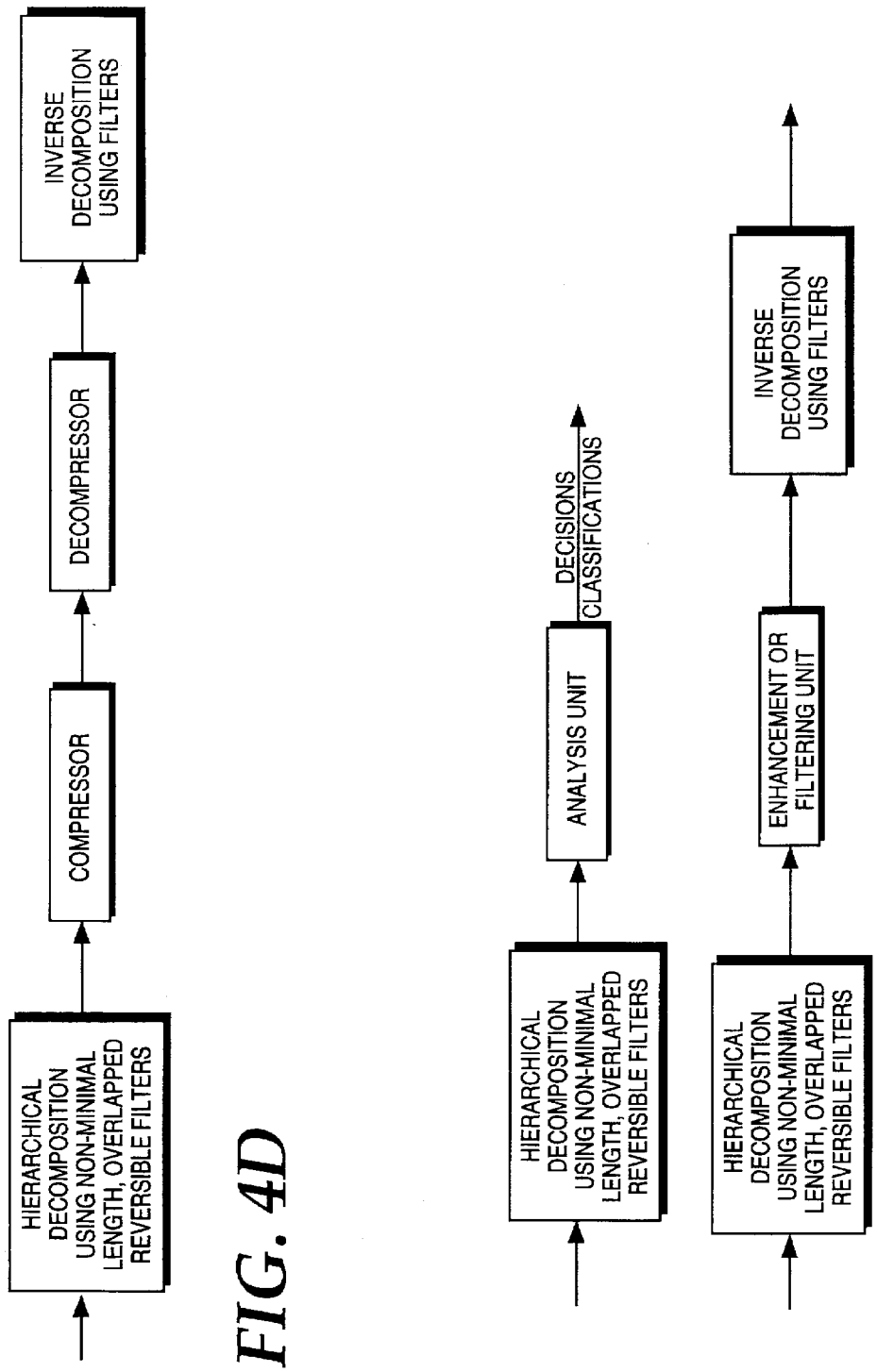
FIG. 4D is a block diagram of a system using the reversible wavelets of the present invention.
FIG. 4E are block diagrams of enhancement and analysis system using the reversible wavelets of the present invention.

Therefore, the present invention provides a system for compression and decompression in which non-minimal length, overlapped reversible filters are used. FIG. 4D is a block diagram of one embodiment of such a system. Referring to FIG. 4D, hierarchical decompression is initially performed. The results of the hierarchical decompression are sent to a compressor for compression. The compression performed may include vector quantization, scalar quantization, zero run length counting, Huffman coding, etc. The output of the compressor compresses data representing a compressed version of the original input data. A decompressor may receive the data at sometime in the future and decompress the data. The present invention then performs an inverse decomposition using non-minimal length, overlapped reversible filters to generate a reconstructed version of the original data.

The reversible wavelet filters of the present invention may also be used in exemplary analysis and enhancement systems, such as shown in FIG. 4E. Referring to FIG. 4E, hierarchical decomposition is performed on input data using non-minimal length, overlapped reversible wavelet filters. The analysis unit receives the coefficients generated by the filters and classifies them into decisions, e.g., rather than encoding the coefficients completely, only relavent information is extracted. For example, in a document archiving system, blank pages might be recognized using only the coarsest low-pass subband. Another example would be to only use high pass information from a particular subband to distinguish between image of text and images of natural scenes. The hierarchical decomposition may be used for registering multiple images, such that coarse registration is done first with coarse subbands. In another embodiment, the coefficients undergo enhancement or filtering followed by inverse decomposition. Sharpening, edge enhancements, noise control, etc. may be performed using a hierarchical decomposition. Thus, the present invention provides a wavelet transform for use in joint time/space and frequency domain analysis and filtering/enhancement systems.

Bit-Significance Embedded Coding

In the present invention, the coefficients generated as a result of the wavelet decomposition are entropy coded. In the present invention, the coefficients initially undergo embedded coding in which the coefficients are ordered in a visually significant order or, more generally, ordered with respect to some error metric (e.g., distortion metric). Error or distortion metrics include peak error, and means squared error (MSE). Additionally, ordering can be performed to give preference to bit-significance spatial location, relevance for data base querring, and directionally (vertical, horizontal, diagonal, etc.). The present invention uses multiple embedded coding techniques, wherein a portion of the coefficients at one significance level are coded with one encoding technique, while the remaining coefficients are coded with another techniques. In the present invention, frequency-based modeling and joint spatial/frequency modeling are two different embedded coding systems used to encode the coefficients generated by the wavelet transform of the present invention. Frequency-based modeling involves predicting a number of coefficients at a higher frequency that when coding a coefficient at a lower frequency. The joint space/frequency modeling takes advantage of both the known frequency bands and the neighboring pixels (or data). One embodiment of the joint space/frequency modeling is referred to herein as horizon modeling.

The data is initially formatted in sign magnitude format, which is followed by the data being sorted based on significance. After the data is sorted with respect to the given significance metric, the data is encoded. Both the frequency-based coding and the horizon coding may based on bit-significance ordering, but use different methods of encoding the events.

Assuming a digital signal, $x(n)$, for each $x(n)$ is represented with R bits of precision, then the embedded coding of the present invention encodes the most significant bit (or bits) of every $x(n)$ of the signal, then the next significant bit (or bits) and so on. For example, in the case of visually defined ordering, an image that requires better quality in the center than along the corners or near the edges (such as some medical images) may be subjected to encoding such that the low-order bits of the central pixels might be coded prior to the higher-order bits of the boundary pixels.

For an embedded system based on a bit significance distortion measure, binary values of the data are ordered by magnitude. In the case where the values are non-negative integers, such as occurs with respect to the intensity of pixels, the order that may be used is the bitplane order (e.g., from the most significant to the least significant bitplane). In embodiments where two's complement negative integers are also allowed, the embedded order of the sign bit is the same as the first non-zero bit of the absolute value of the integer. Therefore, the sign bit is not considered until a non-zero bit is coded. As a result, the possible values for an event in the bit significance embedded system of the present invention is ternary before the sign bit is coded. The ternary events are "not significant", "positive significant" and "negative significant". For example, using sign magnitude notation, the 16-bit number −7 is:

1000000000000111

On a bit-plane basis, the first twelve decisions will be "not significant." The first 1-bit occurs at the thirteenth decision. The thirteenth decision will be "negative significant." After the sign bit is coded, the possible events are reduced to binary, i.e. 0, 1. The fourteenth and fifteenth decisions are both "1".

In one embodiment of the present invention, a list is used to keep track of the coefficients. In one embodiment, a one bit flag, referred to herein as the group flag, associated with each coefficient differentiates coefficients whose sign bit has not yet been coded from the coefficients with the sign bit already coded. In another embodiment, two or more lists can be used instead of a flag bit. In another embodiment, a single list is used without a flag.

In another embodiment, lists are not used. All decisions for a coefficient are generated and labeled by significance, before any decisions for the next coefficient are generated. This eliminates the need for storing all coefficients in lists.

The Encoding and Decoding Process of the Patent Invention

The following flow charts, FIGS. 25–30, depict embodiments of the encoding and decoding processes of the patent invention.

Figure 25A:
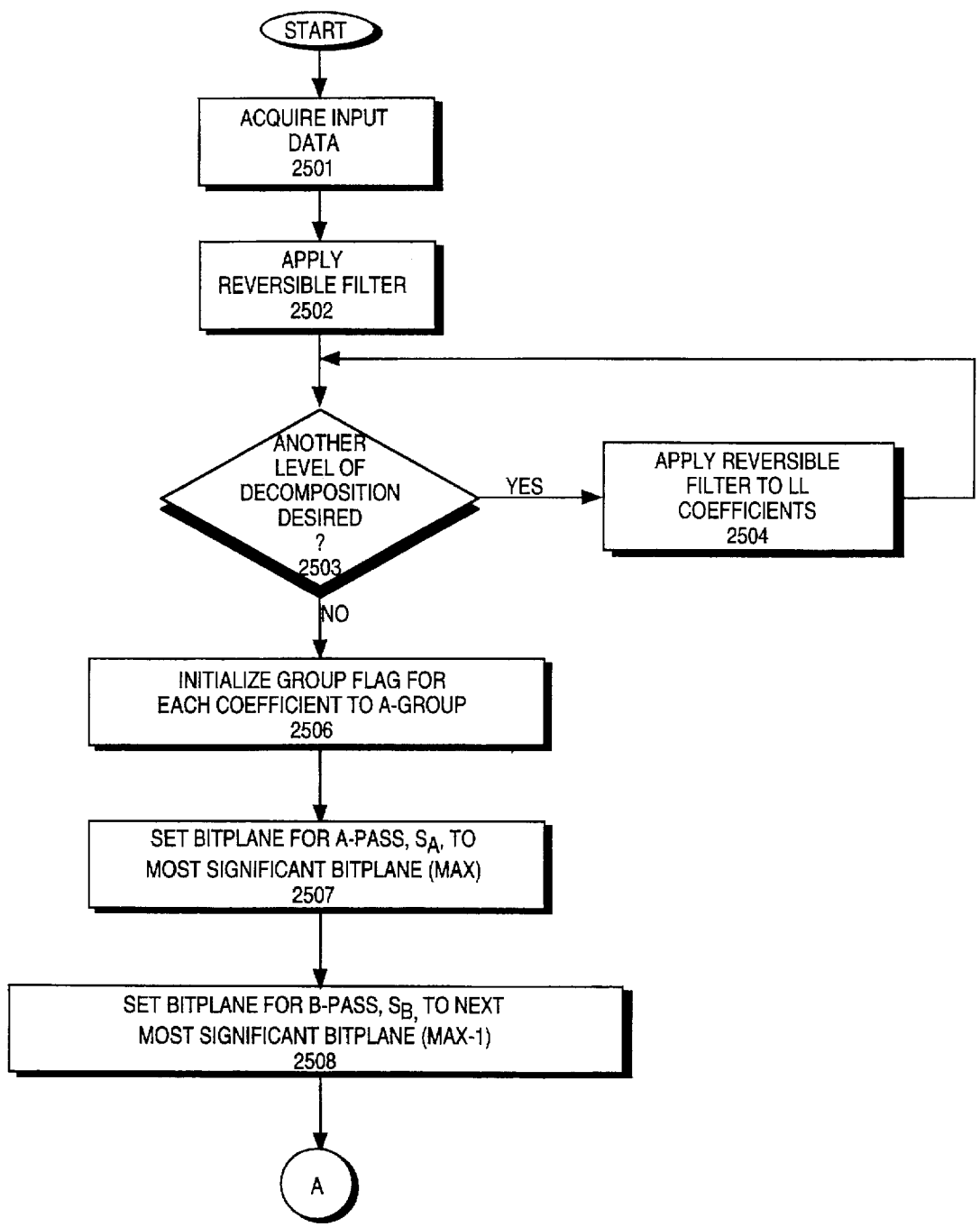
FIGS. 25A and B is a flow chart of one embodiment of the encoding process of the present invention.
Figure 25B:
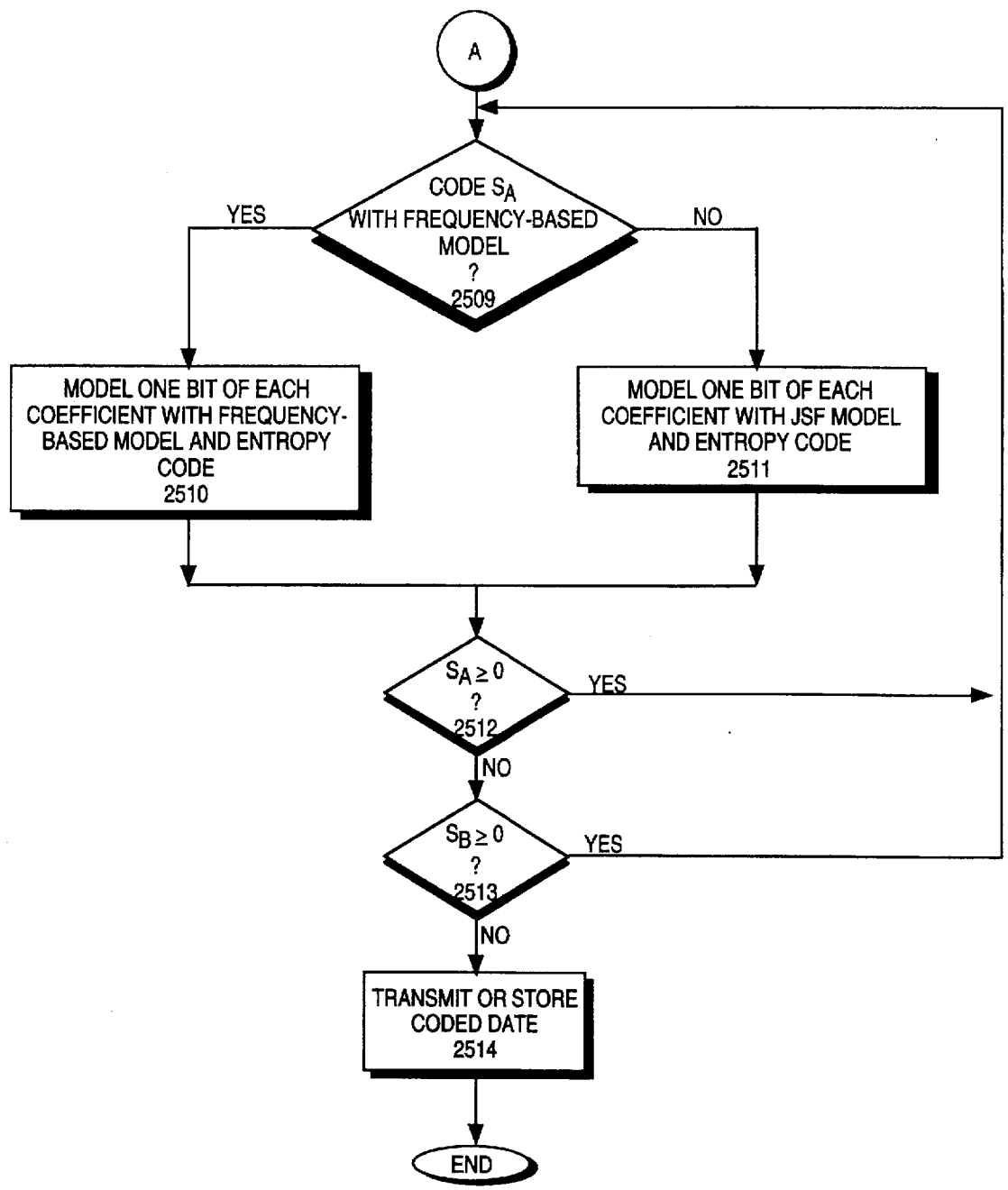

FIG. 25 is a flow chart illustrating the encoder transform and modeling process of the present invention. Referring to FIG. 25, the encoder transform and modeling process begins by acquiring input data (processing block 2501). After acquiring input data, the present invention applies a reversible wavelet filter (processing block 2502).

Next, a test determines if another level of decomposition is desired (processing block 2503). If another level of decomposition is desired, processing continues at processing 2504 where the reversible filter is applied to the LL coefficients that resulted from the immediately previous decomposition, and processing continues back at processing 2503. In this manner, the present invention allows any number of levels of decomposition to be performed.

If another level of decomposition is not desired, processing continues at processing block 2506 where the group flag for each coefficient is initialized to the A-group. After initializing the group flag, the bitplane for the A-pass, $S_A$, is set to the most significant bitplane (max) (processing block 2507). Next, the bitplane for the B-pass, $S_B$, is set to he next most significant bitplane (max −1) (processing block 2508).

Then, a test determines whether to code the bitplane for the A-pass, $S_A$, with a frequency based model (processing block 2509). If the bitplane $S_A$ is to be coded with the frequency-based model, processing continues at processing block 2510 where each coefficient is modeled with the frequency-based model and entropy code. On the other hand, if bitplane $S_A$ is not to be coded with the frequency-based model, processing continues at processing block 2511 where each coefficient is modeled with a joint space/frequency model and entropy code.

In either case, processing thereafter continues at processing block 2512 where a test determines if the bitplane $S_A$ is greater than or equal to zero, thereby indicating whether it is the last bitplane. If bitplane $S_A$ is greater than or equal to zero, processing loops back to processing block 2509. On the other hand, if bitplane $S_A$ is not greater than or equal to zero, processing continues at processing block 2513 where a test determines whether the bitplane $S_B$ is greater than or equal to zero, such that the process determines if the bitplane is the last bitplane to undergo a B-pass. If bitplane $S_B$ is greater than or equal to zero, processing continues at processing block 2509. However, if bitplane $S_B$ is not greater than or equal to zero, processing continues at processing block 2514 where coded data is either transmitted onto a channel or stored in memory. After storing or transmitting the coded data, the encoder transform and modeling process of the present invention ends.

Figure 26A:
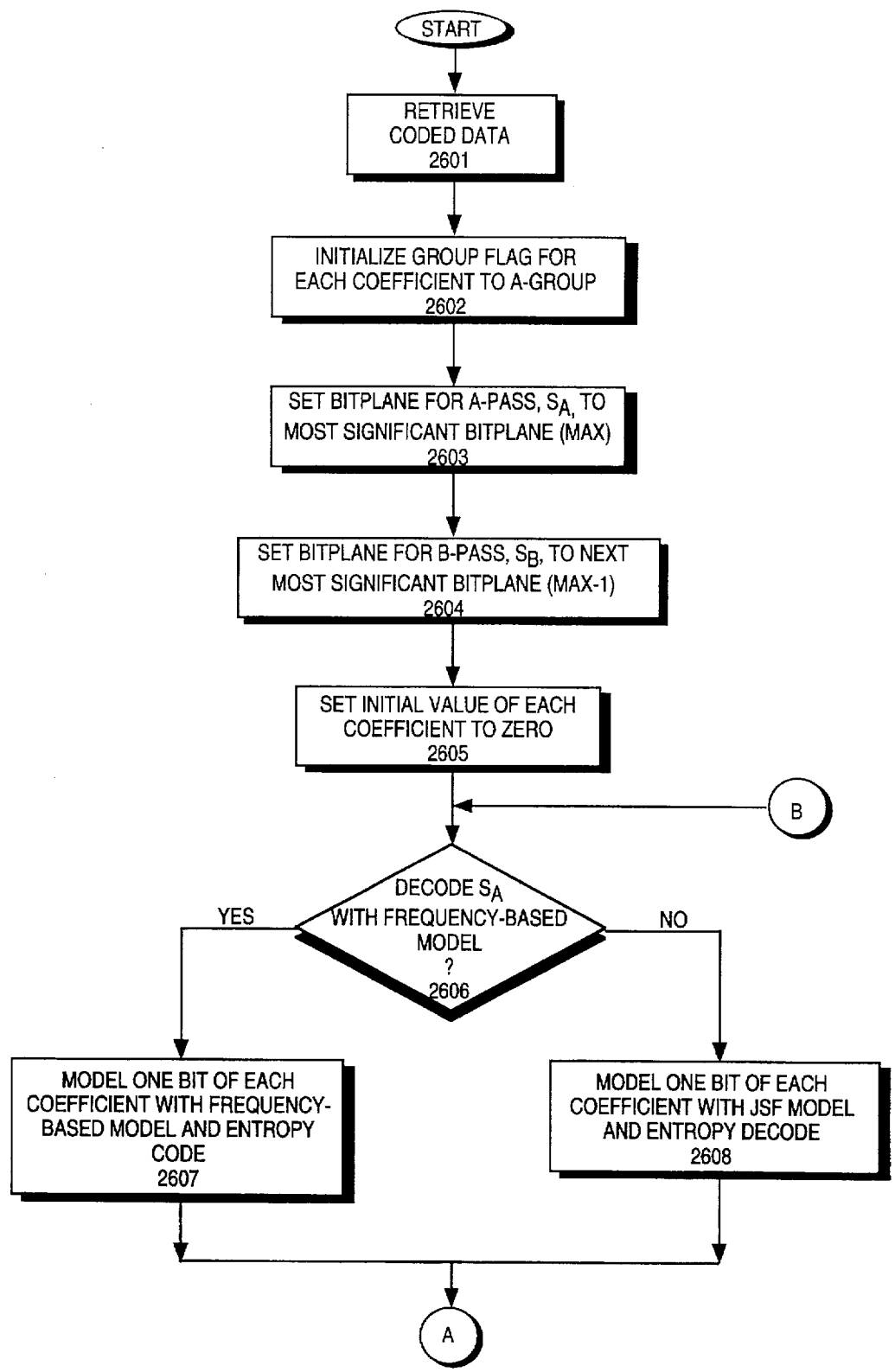
FIGS. 26A and B is a flow chart of the decoding of one embodiment of the decoding process of the present invention.
Figure 26B:
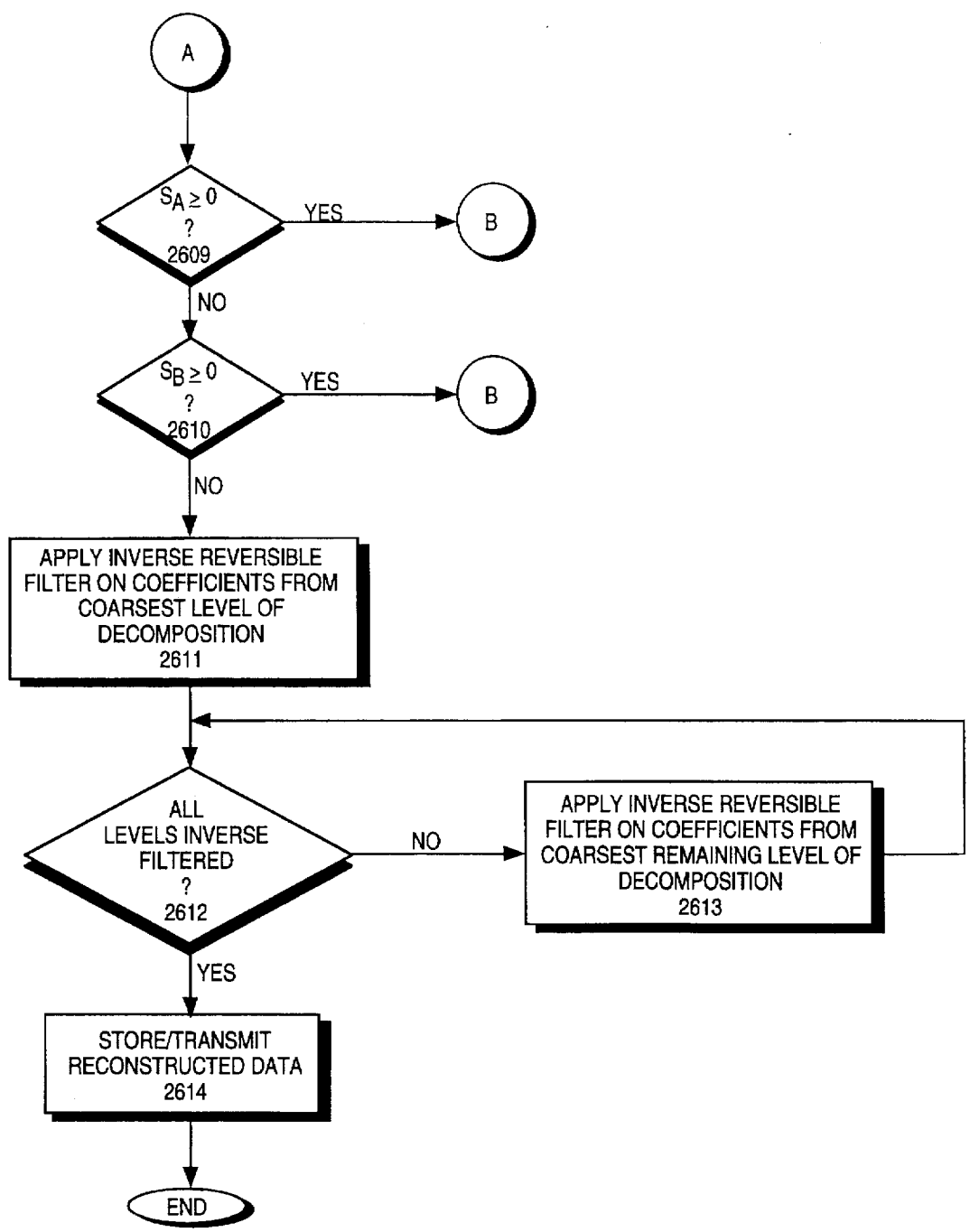

FIG. 26 illustrates a decoder transform and modeling process of the present invention. Referring to FIG. 26, the decoder transform and modeling process of the present invention begins by retrieving coded data (processing block 2601). The coded data may be received from a channel or memory or other transmission system. After retrieving the coded data, a group flag for each coefficient is initialized to the A-group (processing block 2602). Following this initialization, the bitplane for the A-pass, $S_A$, is set to the most significant bitplane (max) (processing block 2603) and the bitplane for the B-pass, $S_B$, is set to the next most significant bitplane (max −1) (processing block 2604). Then, the value of each coefficient is set to an initial value of zero (processing block 2605).

After initializing the value of each coefficient to zero, a test determines whether the bitplane $S_A$ is to be decoded with a frequency-based model or not (processing 2606). If bitplane $S_A$ is to be decoded with a frequency-based model, processing continues to processing block 2607 where each coefficient is modeled with a frequency-based model and entropy decode. If the bitplane $S_A$ is not to be decoded with a frequency-based model, processing continues at processing 2608 where each coefficient is modeled with a joint space/frequency model and entropy decode.

After each coefficient is modeled, processing continues at processing block 2609 where the bitplane $S_A$ determines if it is the last bitplane by testing if it is greater than or equal to zero. If the bitplane $S_A$ is greater than or equal to zero, processing continues at processing block 2606. On the other hand, if bitplane $S_A$ is not greater than or equal to zero, then a test determines if the B-pass bitplane $S_B$ is greater than or equal to zero (processing block 2610), thereby indicating that it is the last bitplane for a B-pass. If so, processing continues at processing block 2606 for further decoding. On the other hand, if the bitplane for the B-pass, $S_B$, is not greater than or equal to zero, an inverse reversible filter is applied on the coefficients from the coarsest level of decomposition (processing block 2611). A test then determines if all the levels have been inverse filtered (processing block 2612). If not, the inverse reversible filter is applied again on the coefficients on the coarsest remaining level of composition (processing block 2613). Thereafter, processing continues back at processing 2612 to test once again whether all of the levels have been inverse filtered.

Once all the levels have been inverse filtered, processing continues at processing block 2612 where a store or transmission of reconstructed data occurs.

Figure 27A:
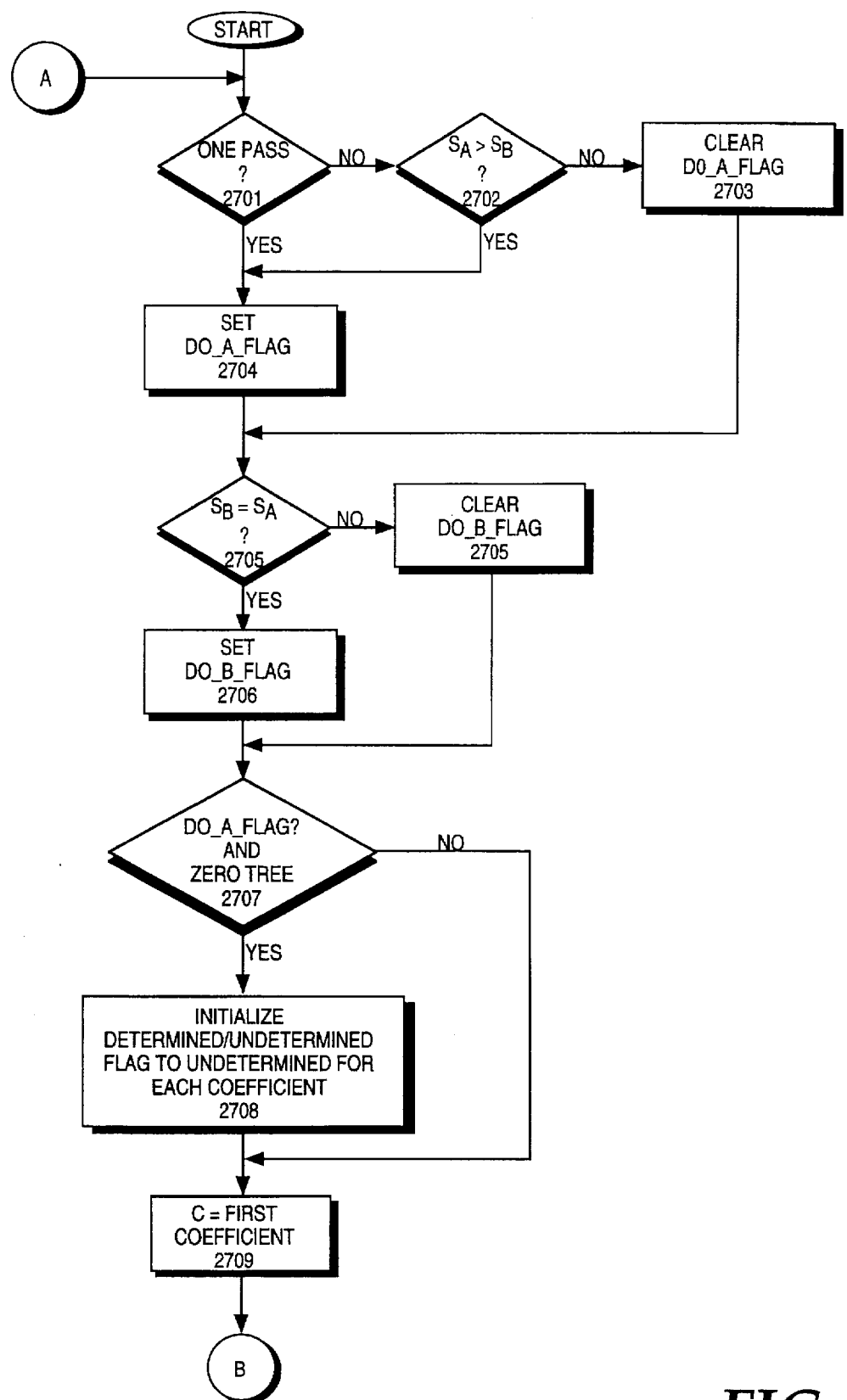
FIGS. 27A and B is a flow chart of one embodiment of the process for modeling each coefficient for both the encoding and decoding processes of the present invention.
Figure 27B:
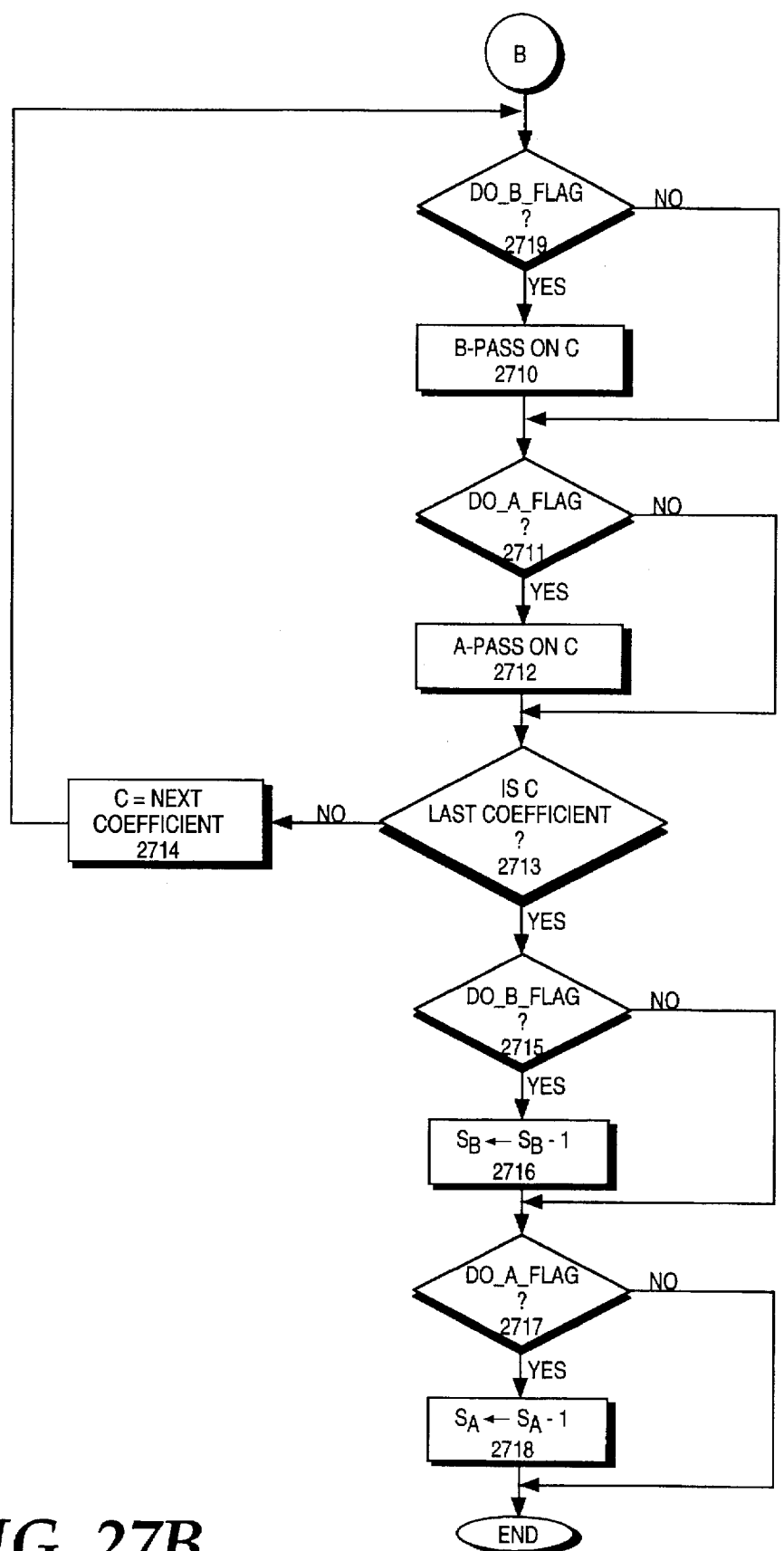

FIG. 27 illustrates one embodiment of the process for modeling each coefficient. The process depicted represents the modeling process for either the frequency-based or JSF modeling and encode or decode. That is, each of the four blocks (2507, 2508, 2607, 2608) may be implemented with the modeling process of FIG. 27. Referring to FIG. 27, an initial process begins by initially testing whether the modeling is to be performed in one pass (processing block 2701). If the modeling is not to occur in one pass, a test determines whether the bitplane $S_A$ is greater than the bitplane $S_B$ (processing block 2702). If it is not, then the process transitions to processing block 2703 where a flag (do__A__flag) is cleared to indicate that an A-pass is not to be performed. If bitplane $S_A$ is greater than the bitplane $S_B$ then processing continues at processing block 2704 where the flag (do__A__flag) is set to indicate that an A-pass is to be performed.

After either of processing blocks 2703 or 2704, processing continues at processing block 2705 where a test determines if the bitplane $S_B$ is equal to bitplane $S_A$. If the bitplanes are not equal, the present invention clears a flag (do__B__flag) to prevent a B-pass from occuring (processing block 2705) and processing thereafter continues at processing block 2707. If the bitplane $S_B$ is equal to the bitplane $S_A$, the do__B__flag flag is set to indicate that a B-pass is to be performed (processing block 2706), and processing also thereafter continues at processing block 2707.

At processing block 2707, a test determines if the A-pass flag is set and the zerotree modeling is to be performed. If the flag indicates that an A-pass is to occur and zerotree modeling is to be performed, a "determined/undetermined" flag is initialized to the "undetermined" state for each coefficient (processing block 2708), and processing continues at processing block 2709. On the other hand, if either the A-pass indication flag or the zerotree modeling indication are not set, processing continues directly to processing block 2709. At processing block 2709, the first coefficient is set to the variable C.

Once the first coefficient has been assigned to the variable C, a test determines if the B-pass indication flag is set (processing block 2719). If the B-pass indication flag (do__B__flag) is set, the present invention performs a B-pass on coefficient C (processing block 2710), and processing continues at processing block 2711. On the other hand, if the B-pass flag is not set, then a B-pass is not performed on C, and procesing continues directy to processing block 2711.

A test then determines whether the A-pass indication flag (do__A__flag) is set (processing block 2711). If the A-pass indication flag is set, then an A-pass is performed on coefficient C (processing block 2717). Thereafter, processing continues at processing block 2713. If the A-pass indication flag is not set, processing continues at processing block 2713 without performing an A-pass on coefficient C.

At processing block 2713, a test determines if coefficient C is the last coefficient. If coefficient C is not the last coefficient, then processing continues at processing block 2714 where the next coefficient is assigned to the variable C and processing continues at processing block 2719. However, if coefficient C is the last coefficient, processing continues at processing block 2715 where a test determines if the B-pass flag (do__B__flag) is set. If the B-pass flag is set, the bitplane $S_B$ is set equal to the bitplane $S_B-1$ (processing block 2716), and processing continues at processing block 2717. If the B-pass indication flag is not set, processing continues at processing block 2717. At processing block 2717, a test determines if the A-pass flag is set. If it is set, then the bitplane $S_A$ is set equal to the bitplane $S_A-1$ (processing block 2718) and processing ends. Also, if the A-pass flag is not set, then processing ends immediately.

In some embodiments, whether a coefficient at a particular bitplane is in the A-group or the B-group can be determined without using a flag bit. This saves one bit of memory per coefficient, which may be significant for large images. Instead a mask is compared using AND logic to a coefficient. If the result of the AND is zero, the bit is in the A-group; otherwise, it is in the B-group. An example of these masks are shown in Table 7 for 8 bitplanes. Note that these masks are the two's complement of $2^{(bitplane+1)}$ (without the sign bit).

TABLE 7

Masks

| Bitplane | Mask (binary) |
|---|---|
| 7 | 00000000 |
| 6 | 10000000 |
| 5 | 11000000 |
| 4 | 11100000 |
| 3 | 11110000 |
| 2 | 11111000 |
| 1 | 11111100 |
| 0 | 11111110 |

Since independent masks can be assigned to the A-pass and B-pass respectively (called herein $M_A$ and $M_B$), as many A-passes as desired can be performed before the corresponding B-pass. In one embodiment with 17 bitplanes, 3 A-passes are performed, then 14 simultaneous A-passes and B-passes are performed, and finally 2 B-passes are performed. Since A-pass decisions can typically be coded more efficiently than B-pass decisions, performing multiple A-passes initially can improve quality for lossy compression.

Figure 28A:
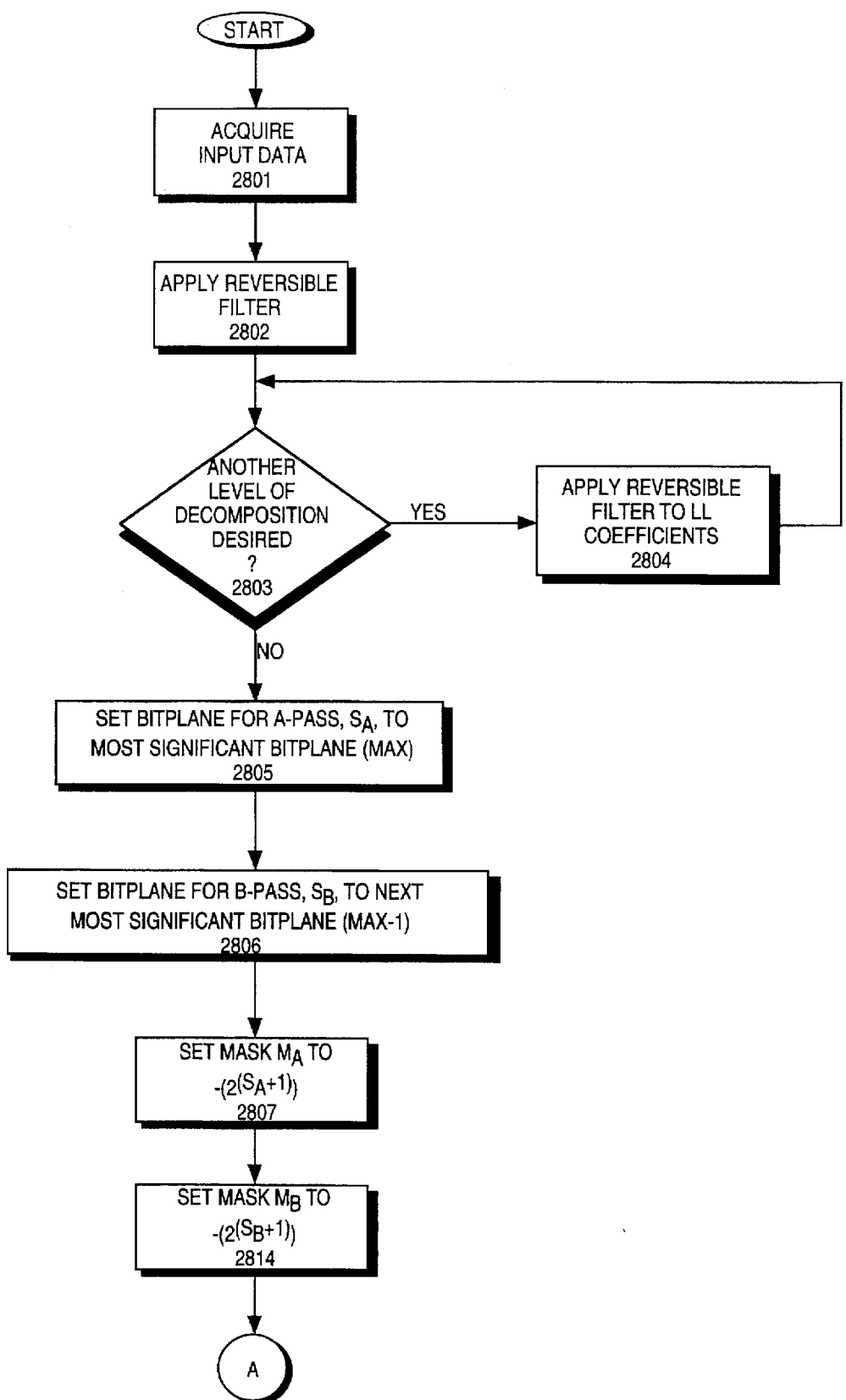
FIGS. 28A and B is a flow chart of an alternate embodiment of the encoding process of the present invention.
Figure 28B:
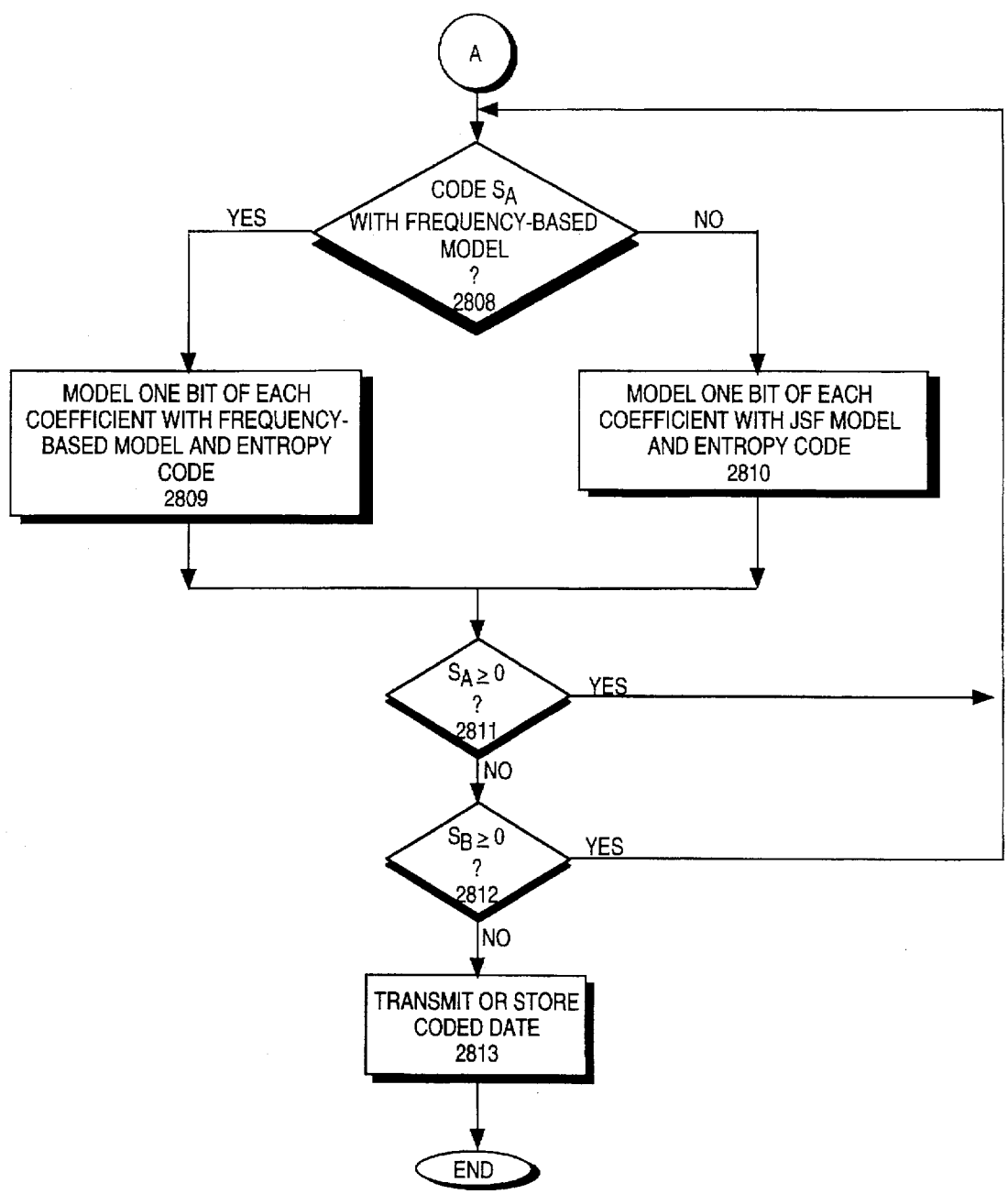

FIG. 28 illustrates one embodiment of an encoder of the present invention that uses a reduced flag memory (as is described later in the Detailed Description). Referring to FIG. 28, the encoder transform and modeling process begins by acquiring input data (processing block 2801). After acquiring input data, the present invention applies a reversible wavelet filter (processing block 2802).

Next, a test determines if another level of decomposition is desired (processing block 2803). If another level of decomposition is desired, processing continues at processing 2804 where the reversible filter is applied to the LL coefficients that resulted from the immediately previous decompression, and processing continues back at processing 2803. In this manner, the present invention allows any number of levels of decomposition to be performed.

If another level of decomposition is not desired, processing continues at processing block 2805 where the bitplane for the A-pass, $S_A$, is set to the most significant bitplane (max). Next, the bitplane for the B-pass, $S_B$, is set to the next most significant bitplane (max -1) (processing block 2806).

Next, mask $M_A$ is set to $-2^{(S_A+1)}$ (processing block 2807) and mask $M_B$ is set to $-2^{(S_B+1)}$ (processing block 2808). Then, a test determines whether to code the bitplane for the A-pass, $S_A$, with a frequency based model (processing block 2808). If the bitplane $S_A$ is to be coded with the frequency-based model, processing continues at processing block 2809 where one bit of each coefficient is modeled with the frequency-based model and entropy code. On the other hand, if bitplane $S_A$ is not to be coded with the frequency-based model, processing continues at processing block 2810 where one bit of each coefficient is modeled with a joint space/frequency model and entropy code.

In either case, processing thereafter continues at processing block 2811 where a test determines if the bitplane $S_A$ is greater than or equal to zero, thereby indicating whether it is the last bitplane. If bitplane $S_A$ is greater than or equal to zero, processing loops back to processing block 2808. On the other hand, if bitplane $S_A$ is not greater than or equal to zero, processing continues at processing block 2812 where a test determines whether the bitplane $S_B$ is greater than or equal to zero, such that the process determines if the bitplane is the last bitplane to undergo a B-pass. If bitplane $S_B$ is greater than or equal to zero, processing continues at processing block 2808. However, if bitplane $S_B$ is not greater than or equal to zero, processing continues at processing block 2813 where coded data is either transmitted onto a channel or stored in memory. After storing or transmitting the coded data, the encoder transform and modeling process of the present invention ends.

Figure 29A:
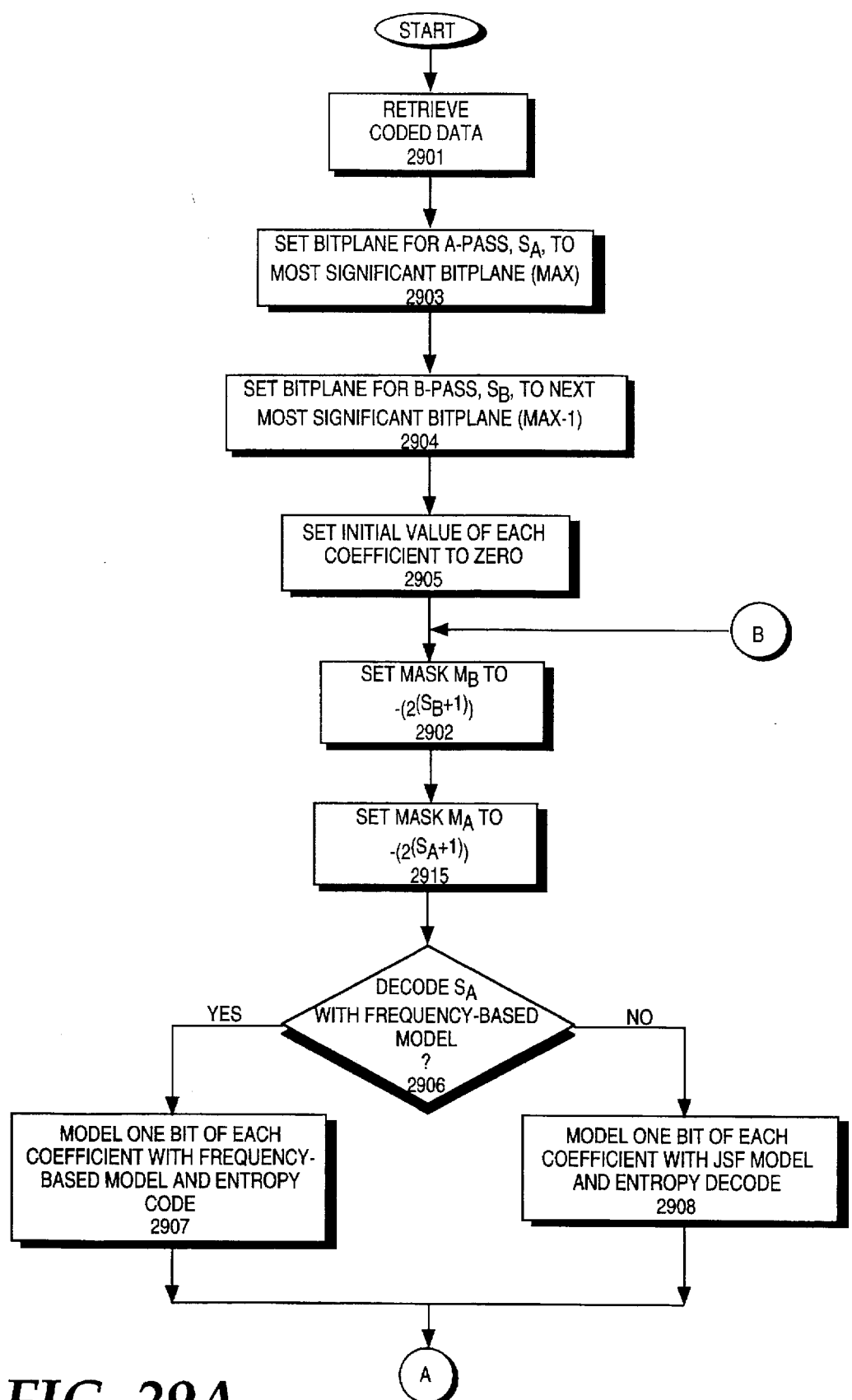
FIGS. 29A and B is a flow chart of an alternative embodiment of the decoding process of the present invention.
Figure 29B:
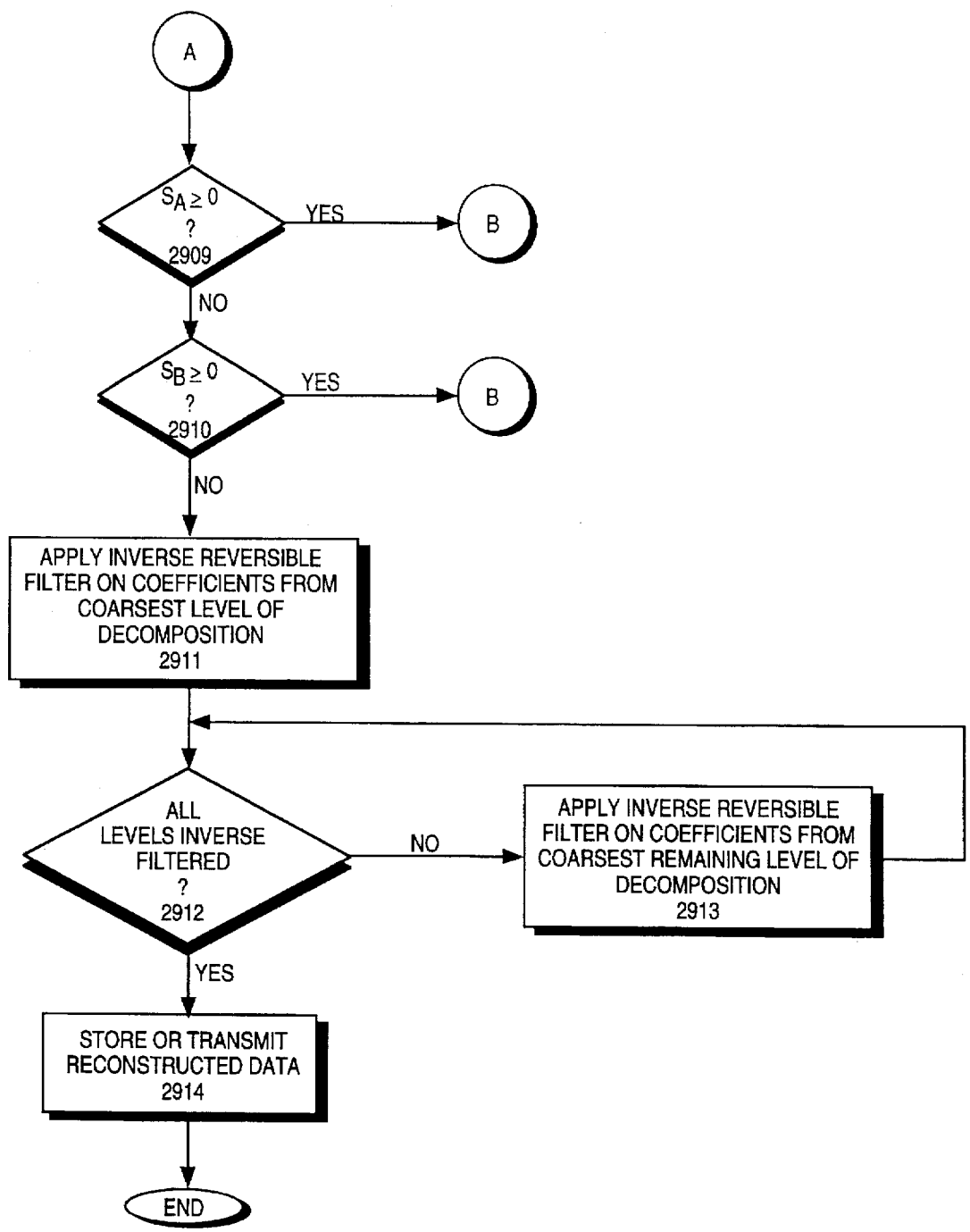

FIG. 29 illustrates an alternative embodiment of the decoder transform and modeling process of the present invention when using a reduced flag memory. Referring to FIG. 29, the decoder transform and modeling process of the present invention begins by retrieving coded data (processing block 2901). The coded data may be received from a channel or memory or other transmission system. Once the coded data is received, the bitplane for the A-pass, $S_A$, is set to the most significant bitplane (max) (processing block 2903) and the bitplane for the B-pass, $S_B$, is set to the next most significant bitplane (max -1) (processing block 2904). After initializing the value of each coefficient to zero, the value of each coefficient is set to an initial value of zero (processing block 2905). Then, mask $M_B$ is set to $-2^{(S_B+1)}$ (processing block 2902) and mask $M_A$ is set to $-2^{(S_A+1)}$ (processing block 2915).

Then, a test determines whether the bitplane $S_A$ is to be decoded with a frequency-based model or not (processing 2906). If bitplane $S_A$ is to be decoded with a frequency-based model, processing continues to processing block 2907 where one bit of each coefficient is modeled with a frequency-based model and entropy decode. If the bitplane $S_A$ is not to be decoded with a frequency-based model, processing continues at processing 2908 where one bit of each coefficient is modeled with a joint space/frequency model and entropy decode.

After each coefficient is modeled, processing continues at processing block 2909 where the bitplane $S_A$ determines if it is the last bitplane by testing if it is greater than or equal to zero. If the bitplane $S_A$ is greater than or equal to zero, processing continues at processing block 2906. On the other hand, if bitplane $S_A$ is not greater than or equal to zero, then a test determines if the B-pass bitplane $S_B$ is greater than or equal to zero (processing block 2910), thereby indicating that it is the last bitplane for a B-pass. If so, processing continues at processing block 2902 for further decoding. On the other hand, if the bitplane for the B-pass, $S_B$, is not greater than or equal to zero, an inverse reversible filter is applied on the coefficients from the coarsest level of decomposition (processing block 2911). A test then determines if all the levels have been inverse filtered (processing block 2912). If not, the inverse reversible filter is applied again on the coefficients on the coarsest remaining level of composition (processing block 2913). Thereafter, processing continues back at processing 2912 where a test once again whether all of the levels have been inverse filtered.

Once all the levels have been inverse filtered, processing continues at processing block 2912 where a store or transmission of reconstructed data occurs.

Figure 30A:
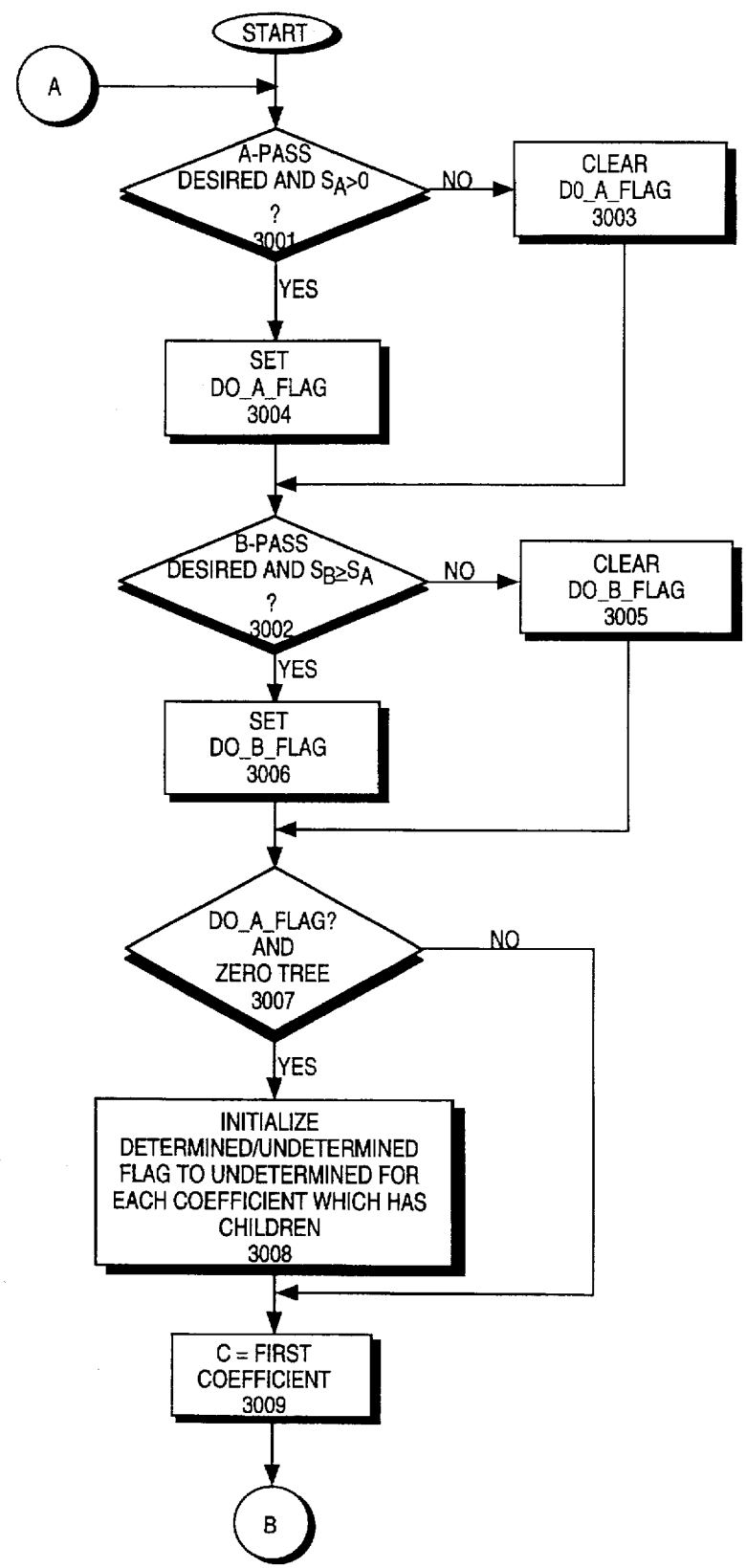
FIGS. 30A and B is a flow chart of an alternate embodiment of the process for modeling each coefficient in the encoding and decoding processes of the present invention.
Figure 30B:
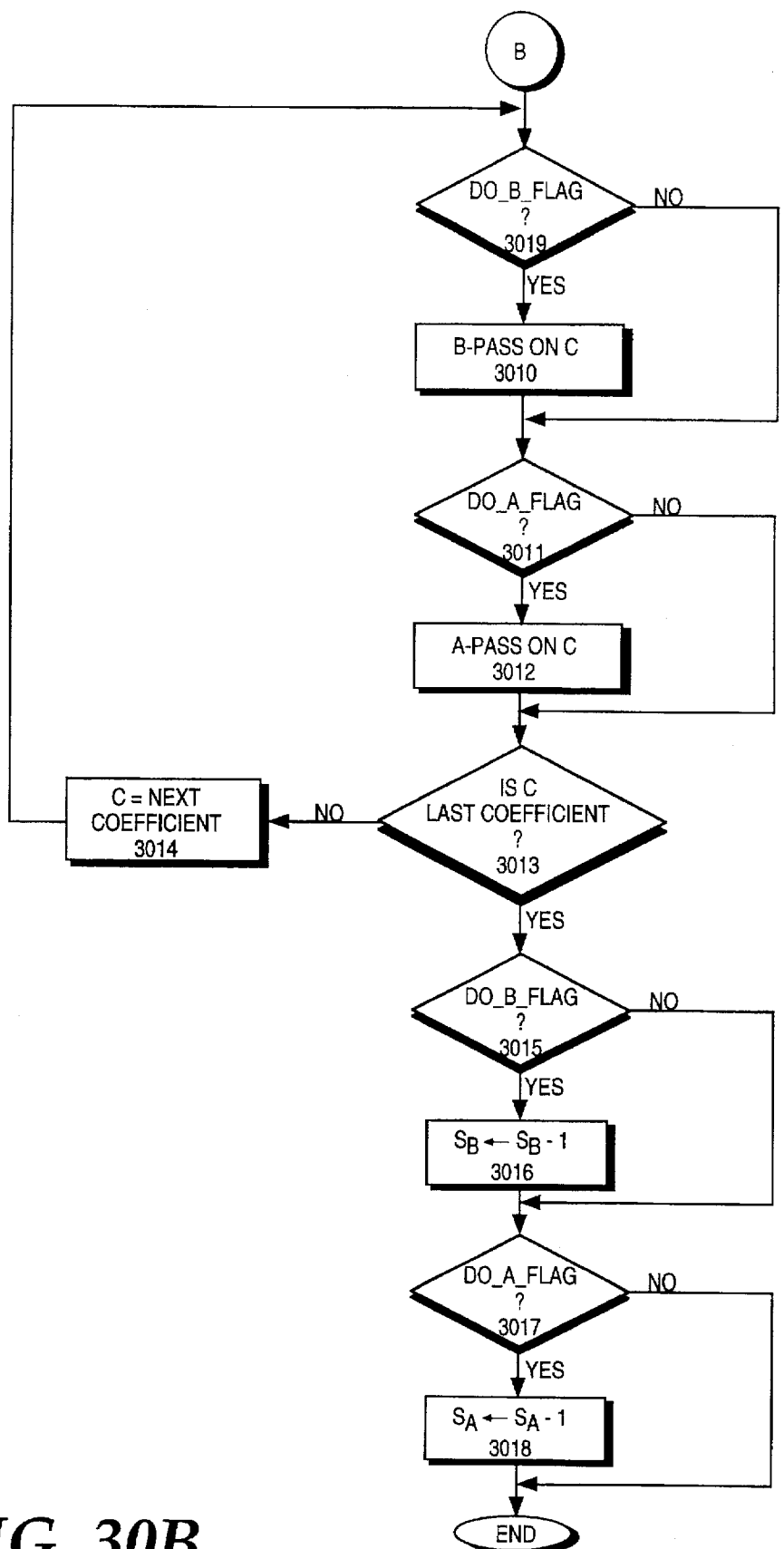

FIG. 30 illustrates one embodiment of the process for modeling each coefficient. Note that like FIG. 27, the process of FIG. 30 may be used to implement the modeling steps in FIGS. 28 and 29. Referring to FIG. 30, an initial process begins by initially testing an A-pass is desired and whether $S_A$ is greater than or equal to 0 (processing block 3001). If so, then the flag (do_A_flag) indicating that an A-pass is to be performed is set (processing block 3004), and processing continues at processing block 3002. Otherwise, the do_A_flag flag is cleared (processing block 3003).

If bitplane $S_A$ is greater than the bitplane $S_B$ then processing continues at processing block 3004 where a flag is set to indicate that an A-pass is to occur. If bitplane $S_A$ is not greater than the bitplane $S_B$, then processing continues at processing block 3003 where the flag indicating an A-pass is supposed to occur is clear.

After either of processing blocks 3003 or 3004, processing continues at processing block 3002 where a test determines if the bitplane $S_B$ is greater than or equal to bitplane $S_A$ and if a B-pass is desired. If the bitplanes are not equal, the present invention clears a flag (do_B_flag) to prevent a B-pass from occurring (processing block 3005), and processing thereafter continues at processing block 3007. If the bitplane $S_B$ is equal to the bitplane $S_A$, the do_B_flag flag is set to indicate that a B-pass is to be performed (processing block 3006), and processing also thereafter continues at processing block 3007.

At processing block 3007, a test determines if the A-pass flag is set and the zerotree modeling is to be performed. If the flag indicates that an A-pass is to occur and zerotree modeling is to be performed, a "determined/undetermined" flag is initialized to the "undetermined" state for each coefficient which has children (processing block 3008), and processing continues at processing block 3009. On the other hand, if either the A-pass indication flag or the zerotree modeling indication are not set, processing continues directly to processing block 3009. At processing block 3009, the first coefficient is set to the variable C.

Once the first coefficient has been assigned to the variable C, a test determines if the B-pass indication flag is set (processing block 3019). If the B-pass indication flag (do_B_flag) is set, the present invention performs a B-pass on coefficient C (processing block 3010), and processing continues at processing block 3011. On the other hand, if the B-pass flag is not set, then a B-pass is not performed on C, and processing continues directly to processong block 3011.

The test then determines is the A-pass indication flag has been set (processing block 3011). If the A-pass indication flag has been set, then an A-pass is performed on coefficient C (processing block 3017). Thereafter, processing continues at processing block 3013. If the A-pass indication flag is set, processing continues at processing block 3013 without performing an A-pass on coefficient C.

At processing block 3013, a test determines if coefficient C is the last coefficient. If coefficient C is not the last coefficient, then processing continues at processing block 3014 where the next coefficient is assigned to the variable C and processing continues at processing block 3019. However, if coefficient C is the last coefficient, processing continues at processing block 3015 where a test determines if the B-pass flag (do_B_flag) is set. If the B-pass flag is set, the bitplane $S_B$ is set equal to the bitplane $S_B-1$ (processing block 3016), and processing continues at processing block 3017. If the B-pass indication flag is not set, processing continues at processing block 3017. At processing block 3017, a test determines if the A-pass flag is set. If it is set, then the bitplane $S_A$ is set equal to the bitplane $S_A-1$ (processing block 3018) and processing ends. Also, if the A-pass flag is not set, then processing ends immediately.

Coefficient Trees

Figure 5:
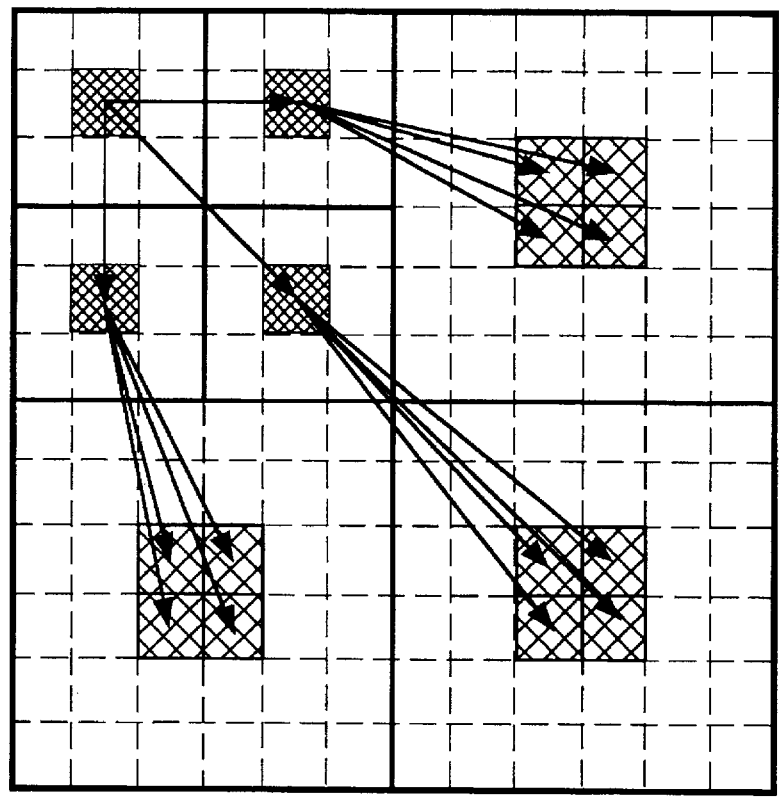
FIG. 5 illustrates a tree structure on wavelets coefficients.

In a pyramidal system, the coefficients can be grouped into sets using a tree structure. The root of each tree is a purely low-pass coefficient. FIG. 5 illustrates the tree structure of one purely low-pass coefficient of the transformed image. For a two-dimensional signal such as an image, the root of the tree has three "children" and the rest of the nodes have four children each. The tree hierarchically is not limited to two dimensional signals. For example, for a one dimensional signal, a root has one child and non-root nodes have two children each. Higher dimensions follow from the one-dimensional and two-dimensional cases.

The tree structure is also apparant from the operation of the filters shown in FIGS. 4A–4C. The operation of the pairs of filters with subsampling causes the previously described coefficients to be related.

In the present invention, after the coefficients have been placed in sign magnitude format, a context model determines which of the multiple encoding methods is to be used to further encode the coefficients. A frequency-based coding scheme, such as zerotree coding, efficiently codes the significance data associated with a given subband decomposition for a specified threshold. In addition to using symbols indicating the significance or insignificance of a single isolated coefficient in the associated subband decomposition, the entries of insignificant parents with all children insignificant (those with magnitudes less than or equal to the given threshold) are grouped together and jointly coded. These trees are sometimes referred to as zerotrees. These insignificant trees are coded with a single dedicated symbol, sometimes called a zero tree root. If, however, there is a significant descendant, the entry of an insignificant coefficient is encoded using the symbol for an "isolated zero". Thus, a tree is encoded with four symbols (positive significant, negative significant, isolated zero or zerotree root) for decisions where the sign of the coefficient has not been coded yet.

Frequency-based coding is particularly useful in compression systems because the joint coding of insignificant trees allows a small number of parent coefficients to predict the insignificance of a large number of descendant coefficients. Since the entries in the tree associated with descendant coefficients can be predicted from the root, no additional symbols are needed to encode their insignificance. The insignificance of the entire tree is encoded at a very low cost. Hence, the high order bitplanes consist mostly of insignificant coefficients of which many are neither zerotree roots nor isolated zeros (i.e., they are children in insignificant trees which do not have to be coded).

Shapiro discloses a frequency-based model called Zerotree in U.S. Pat. No. 5,321,776. In Shapiro's method, two lists, a dominant list and a subordinate list are used to store all of the coefficients. For each significance level, two passes are made, a dominant pass and a subordinate pass. In one embodiment, the frequency-based model of the present invention is Zerotree.

In another embodiment, a frequency-based model similar to Zerotree (as described by Shapiro) is used. Instead of using multiple lists, only a single list is used, with each of the list elements being marked as being members of one of the two groups. The separation of coefficients into an A-group and a B-group is equivalent to the separation Shapiro achieves with dominant and subordinate lists (respectively). Shapiro's use of multiple lists allows greater flexibility in ordering of coefficients in the subordinate list at the expense of greater software/hardware complexity. This Single List Zerotree method uses two passes, the A-pass and the B-pass that are equivalent to Shapiro's dominant pass and subordinate pass, respectively. The Single List Zerotree model will be described below.

The coding system of the present invention maintains a list of the coefficients in sign-magnitude form in memory. Each element in the list has a one-bit label which indicates whether the element is a member of the "A-group or the "B-group". At the beginning of a stage, those coefficients that have not yet been found to be significant are labeled as being in the A-group. Those coefficients that have been previously found to be significant with respect to previous, larger, thresholds are labeled as being in the B-group. The list contains the coefficients in the order in which they will be processed for coding. At the beginning of the very first stage, all coefficients are labeled as members of the A-group, since no coefficient has been established as being significant. As coefficients are determined to be significant or insignificant, the labels for their entries are changed from the original A-group designation to B-group designation. This list is subsequently refined at progressively finer thresholds. That is, multiple passes through the list occur.

In one embodiment, the binary events which correspond to the coefficients of the B-group are binary arithmetically coded under a zeroth order Markov context model. The 4-ary events corresponding to the coefficients of the A-group are also encoded under a zeroth order Markov context model.

The order of coefficients in the list of the present invention preserves the tree structure such that no child can be modeled prior to its parent. Thus, an ordering which preserves the tree structure is fixed and used consistently. In one embodiment, the coefficients are stored in memory in order from the first storage location used. In another embodiment, a linked list may be used.

In one embodiment, the coefficients are coded in a bit significance, or bit-plane embedded system. Since the coefficients are coded from most significant bitplane to least significant bitplane, the number of bitplanes in the data must be determined. In the present invention, this is accomplished by finding an upper bound on the magnitudes of the coefficient values calculated from the data or derived from the depth of the image and the filter coefficients. For example, if the upper bound is 149, then there are 8 bits of significance or 8 bitplanes.

Figure 6A:
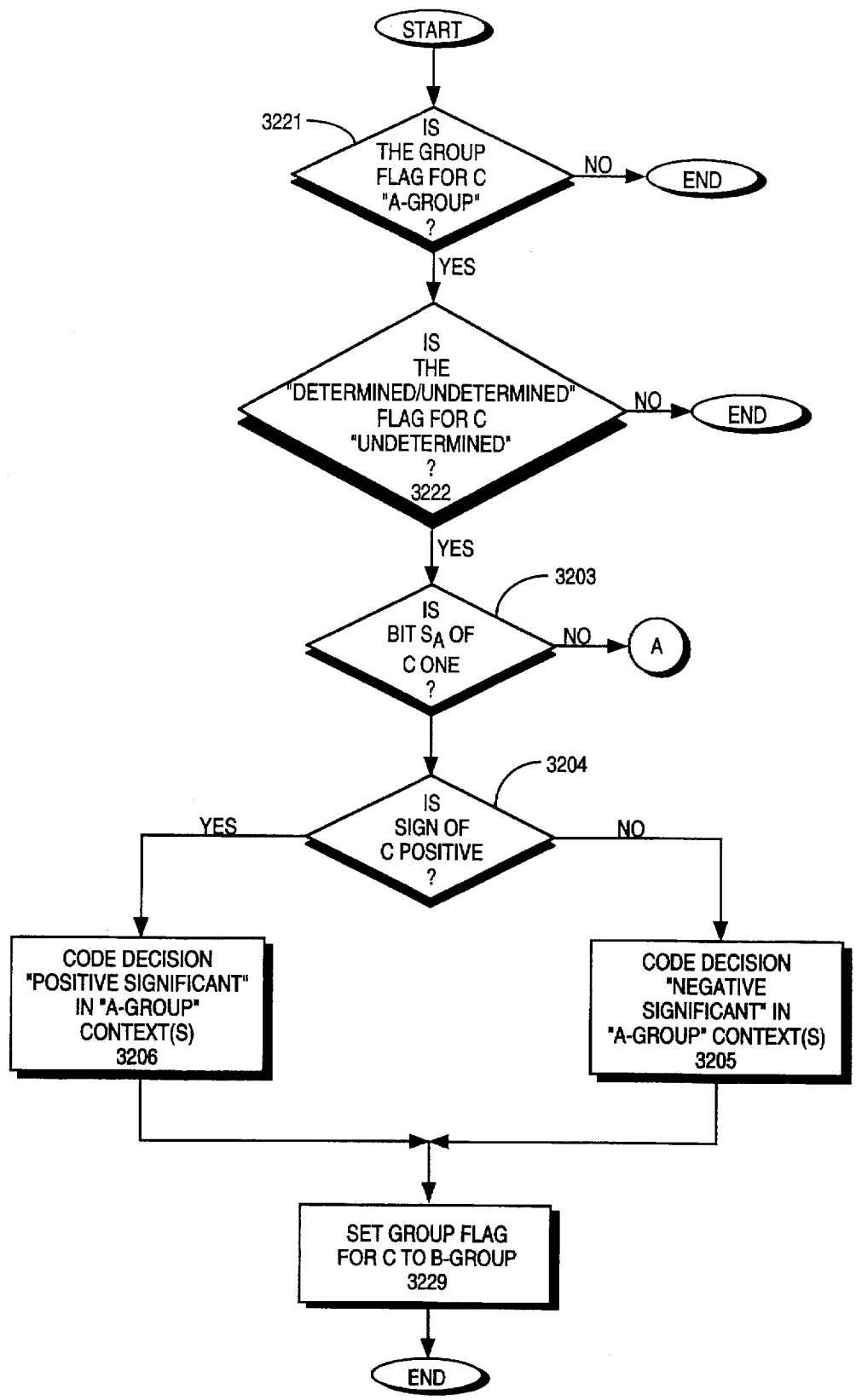
FIG. 6A-1 and 6A (contnued) is a flow chart of one embodiment of the single list zerotree modeling for encoding in the present invention.

FIG. 6A illustrates one embodiment of the single list zerotree encoding process of the present invention. In one embodiment, the process in FIG. 6A may be used in the modeling process of FIG. 27. Referring to FIG. 6A, the process begins by testing whether the group flag for the coefficient C is set to the "A-group" (processing 3221). If not, then the process ends. On the other hand, if the group flag for coefficient C is set to the "A-group", then processing continues at processing block 3222 where a test determines if the "determined/undetermined" flag for the coefficient C is set to "undetermined". If the "determined/undetermined" flag for the coefficient is not set to "undetermined", the process ends. If, however, the "determined/undetermined" flag for the coefficient C is set to "undetermined", processing continues at processing block 3203 where a test determines if the bit $S_A$ of the coefficient C is one.

If the bit $S_A$ of the coefficient C is not one, processing continues at processing block 3207. On the other hand, if the bit $S_A$ of coefficient C is one, processing continues at processing block 3204 where a test determines is the sign of the coefficient C is positive. If the sign of the coefficient C is not positive, the decision is coded at "negative significant" in "A-group context(s) (processing block 3205), and the process continues at processing block 3229. If the sign of the coefficient C is positive, the decision is coded as "positive significant" in "A-group" context(s) (processing block 3206), and the process continues at processing block 3229. At processing block 3229, the group flag for C is set to the "B-group".

At processing block 3207, a test determines whether the bit $S_A$ is zero for all the descendants (children) of the coefficient C. If bit $S_A$ is not zero, the decision is coded as "insignificant with significant children" (01) in "A-group" context(s) (processing block 3208), and the process ends. On the other hand, if the bit $S_A$ is zero for all the descendants (children) of the coefficient C, the decision is coded as "zerotree root" (00) is "A-group" context(s) (processing block 3209). Thereafter, the "determined/undetermined" flag for all of the descendants of the coefficient C are set to "determined" (processing block 3221), and the process ends.

In another embodiment, the termination test for the process may be whether or not a desired compression ratio is reached.

In one embodiment, the binary events resulting from the B-pass are entropy encoded under zeroth order Markov source context model. The 2-bit alphabet (size 4) resulting from the A-pass are encoded also under zeroth order Markov source, by a 4-ary (alphabet of size 4) arithmetic coder.

Figures 1, 6A:
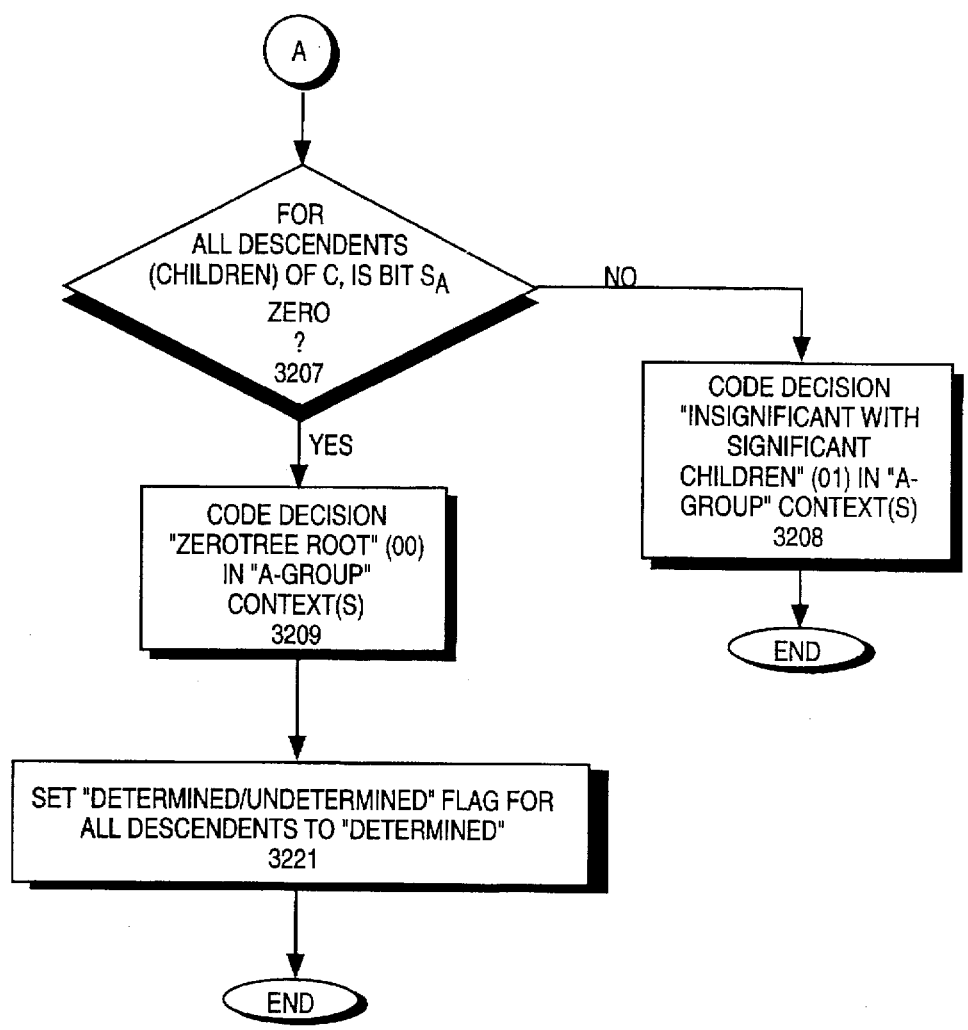
Figure 6B:
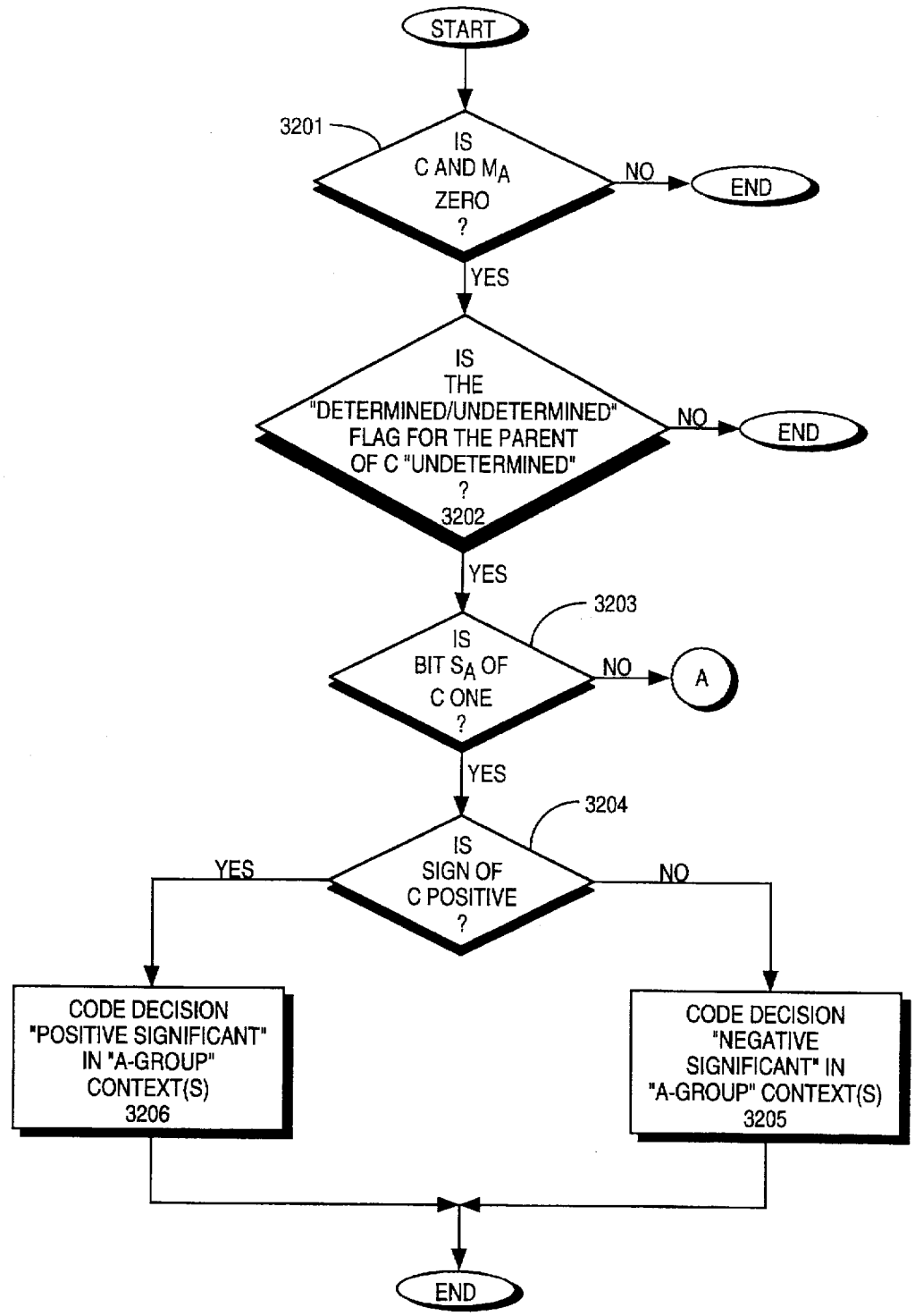
Figures 1, 6B:
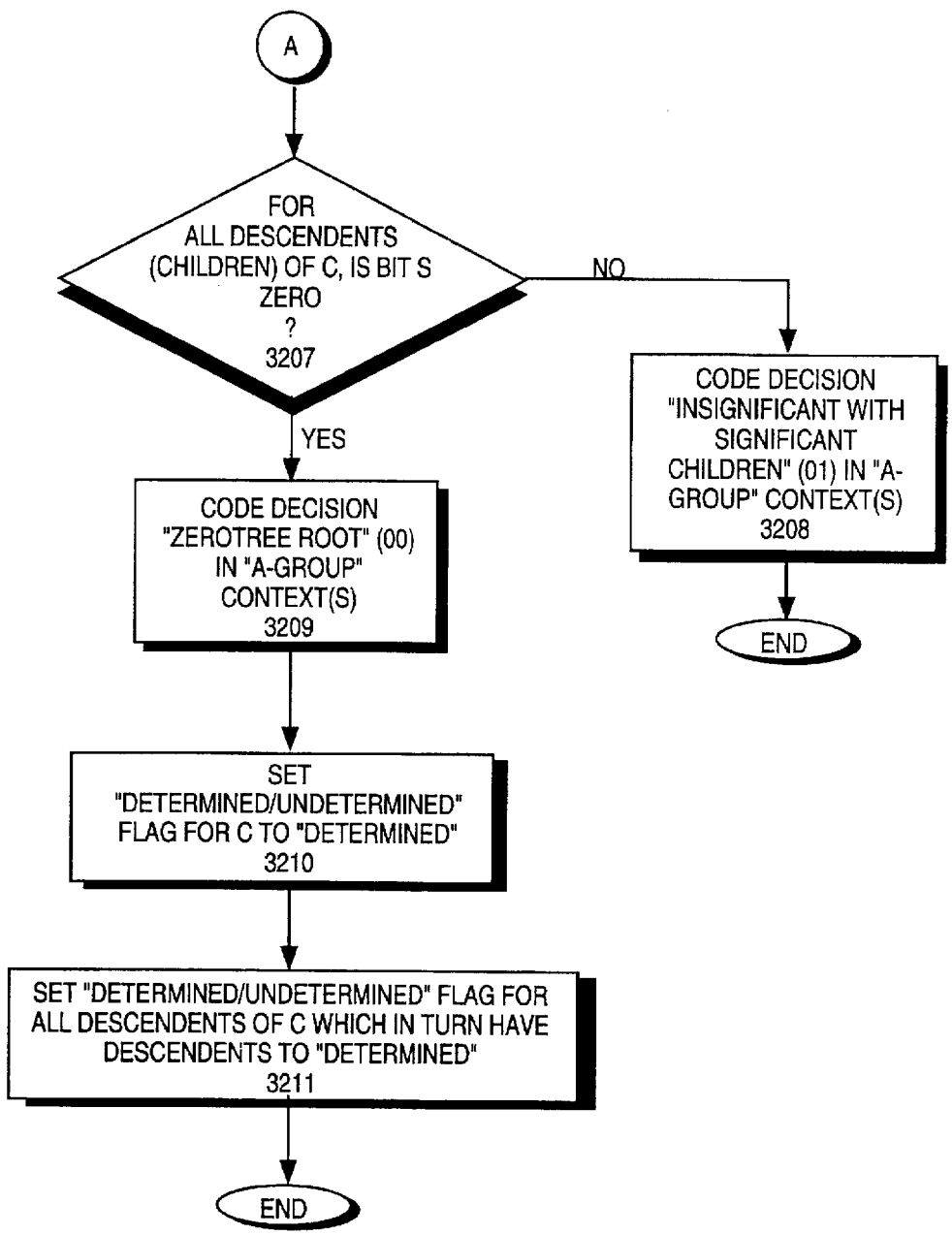

FIG. 6B and 6B-1 (continued) illustrates an alternative embodiment of the single list zerotree encoding process of the present invention using reduced flag memory. In one embodiment, the process of FIG. 6B may be used as the A-pass in the process of FIG. 30. Referring to FIG. 6B and 6B-1 (continued), the process begins by testing whether the result of ANDing coefficient C with the mask $M_A$ is zero (processing 3201). If not, the process ends. On the other hand, if the result of ANDing coefficient C with the mask $M_A$ is zero, processing continues at processing block 3202 where a test determines if the "determined/undetermined" flag for the parent of the coefficient C is set to "undetermined". If the flag for the parent of the coefficient is not set to "undetermined", the process ends. If, however, the "determined/undetermined" flag for the parent of the coefficient C is set to "undetermined", processing continues at processing block 3203 where a test determines if the bit $S_A$ of the coefficient C is one.

If the bit $S_A$ of the coefficient C is not one, processing continues at processing block 3207. On the other hand, if the bit $S_A$ of coefficient C is one, processing continues at processing block 3204 where a test determines is the sign of the coefficient C is positive. If the sign of the coefficient C is not positive, the decision is coded at "negative significant" in "A-group context(s) (processing block 3205), and the process ends. If the sign of the coefficient C is positive, the decision is coded as "positive significant" in "A-group" context(s) (processing block 3206), and the process ends. In one embodiment, a 4-ary coder is used and 4-ary decisions are coded in one context. In another embodiment, a binary coder is used and three contexts are used (e.g., the three contexts being the first bit of the decision, the second bit where the first bit is zero and the second bit when the first bit is a one).

At processing block 3207, a test determines whether the bit $S_A$ is zero for all the descendants (children) of the coefficient C. If bit $S_A$ is not zero, the decision is coded as "insignificant with significant children", "isolated zero", (01) in "A-group" context(s) (processing block 3208), and the process ends. On the other hand, if the bit $S_A$ is zero for all the descendants (children) of the coefficient C, the decision is coded as "zerotree root" (00) is "A-group" context(s) (processing block 3209). Then, the "determined/undetermined" flag for the coefficient C is set to "determined" (processing block 3210). Thereafter, the "determined/undetermined" flag for all of the descendants of the coefficient, which in turn have descendants, are set to "determined" (processing block 3211), and the process ends.

Decoding Steps

In the present invention, decoding is performed in lock-step with the encoding.

Figure 6C:
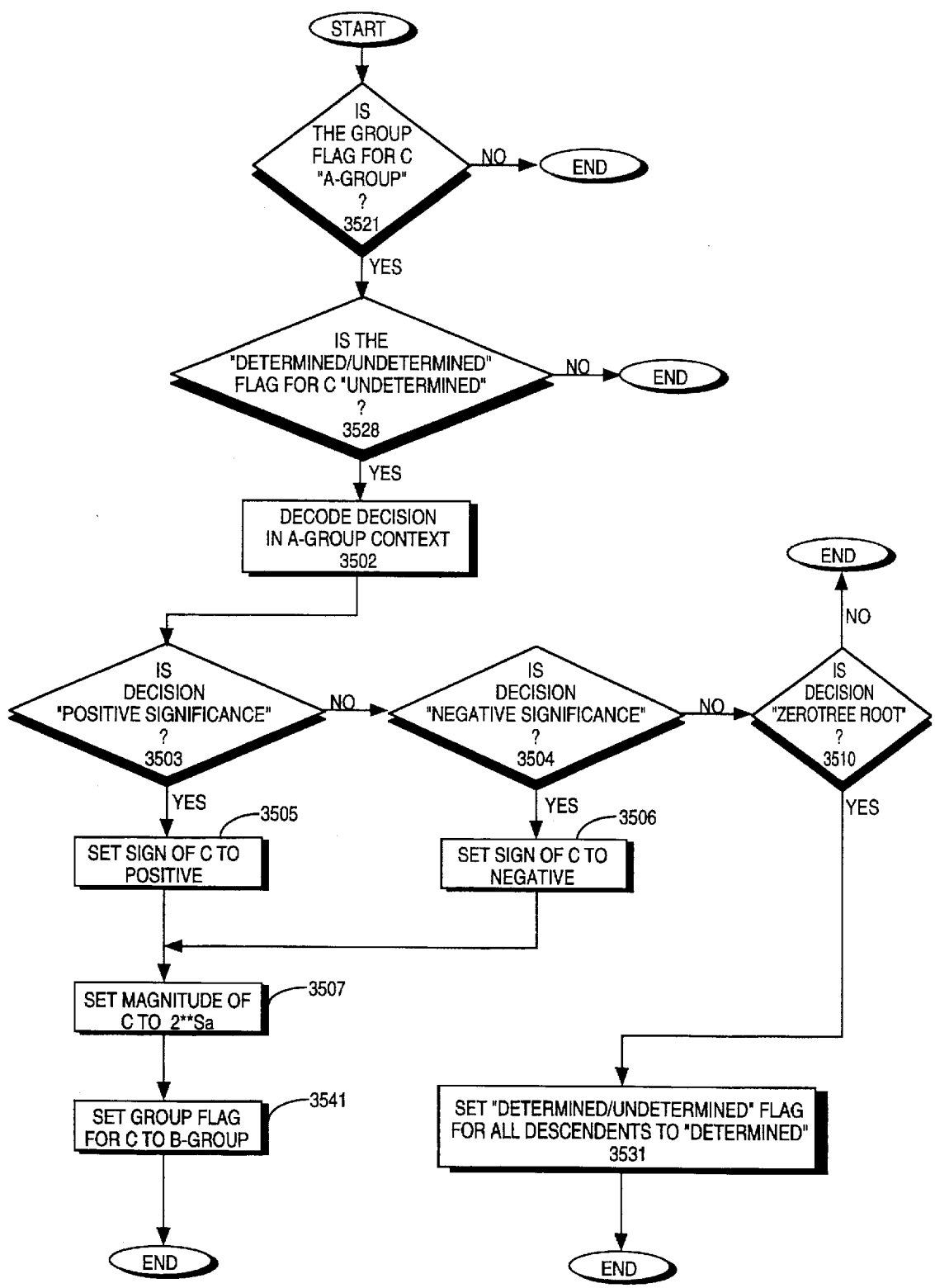
FIG. 6C is a flow chart of one embodiment of the single list zerotree modeling for decoding in the present invention.

FIG. 6C illustrates one embodiment of the A-pass process for a zerotree horizon decoding process, and may be used in conjunction with the process of FIG. 27. Referring to FIG. 6C, the process begins by testing whether the group flag for coefficient C is set to the "A-group" (processing block 3521). If not, then the process ends. However, if so, processing continues at processing block 3528 where a test determines if the "determined/undetermined" flag for the coefficient C is set to "undetermined". If not, the process ends. If it is, then the process continues to processing block 3502 where the ternary decision is decoded in A-group context(s).

Then a test determines if the decision is "positive significant" (processing block 3503). If the decision is "positive significant", the sign of the coefficient C is set to positive (processing block 3505), the magnitude of the coefficient is set to $2^{S_A}$ (processing block 3507), the group flag for coefficient C is set to the "B-group" (processing block 3541), and the process ends.

If the decision is not "positive significant" (processing block 3503), a test determines if the decision is "negative significant" (processing block 3504). If the decision is not "negative significant", the process continues at processing block 3509 where a test determines if the decision is a zerotree root. If the decision is not a zerotree root, the process ends. If the decision is zerotree root, the "determined/undetermined" flag for all decendants of coefficient C is set to "undetermined" (processing block 3531), and the process ends.

However, if the test of processing block 3504 determines that the decision is "negative significant", then the sign of the coefficient C is set to negative (processing block 3506), the magnitude of coefficient C is set to $2^{S_A}$ (processing block 3507), the group flag for coefficient C is set to the B-group (processing block 3541), and the process ends.

Figure 6D:
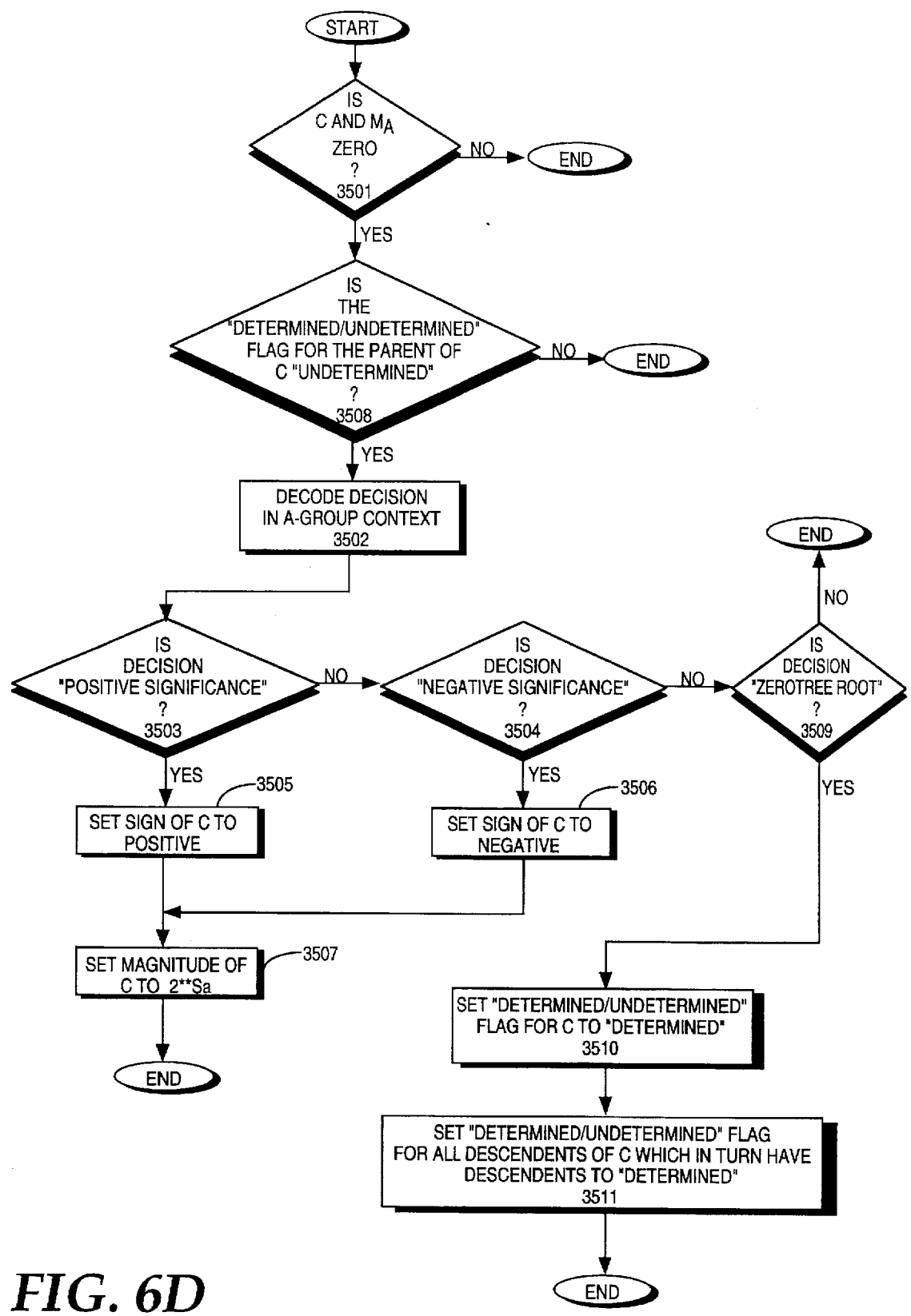
FIG. 6D is a flow chart of one embodiment of the single list zerotree modeling for decoding in the present invention using reduced flag memory.

FIG. 6D illustrates an alternative embodiment of the A-pass process for a zerotree horizon decoding process using reduced flag memory, and may be used in the process described in FIG. 30. Referring to FIG. 6D, the process begins by testing whether the result of ANDing coefficient C with the mask $M_A$ is zero (processing block 3501). If not, then the process ends. However, if the result of ANDing coefficient C with the mask $M_A$ is zero, processing continues at processing block 3508 where a test determines if the "determined/undetermined" flag for the parent of C is "undetermined". If not, the process ends. If it is, then the process continues to processing block 3502 where the ternary decision is decoded in A-group context(s).

Then a test determines if the decision is "positive significant" (processing block 3503). If the decision is "positive significant", the sign of the coefficient is set to positive (processing block 3505), the magnitude of the coefficient is set to $2^{S_A}$ (processing block 3507), and the process ends.

If the decision is not "positive significant", a test determines if it is "negative significant" (processing block 3504). If the decision is not "negative significant", the process continues at processing block 3509 where a test determines if the decision is a zerotree root. If the decision is not a zerotree root, the process ends. If the decision is zerotree root, the "determined/undetermined" flag for the coefficient C is set to "determined" (processing block 3510), the "determined/undetermined" flags for all decendants of coefficient C, which in turn have decendants, are set to "undetermined" (processing block 3511), and the process ends.

However, if the test of processing block 3504 determines that the decision is "negative significant", then the sign of the coefficient C is set to negative (processing block 3506), the magnitude of coefficient C is set to $2^{S_A}$ (processing block 3507), and the process ends.

Alternatives exist to the choice made by Shapiro to use 4-ary decisions to describe trees. Larger alphabets may be used to further specify the characteristics of an entire tree when coding the root of the tree. In one embodiment, the following set of 6-ary decisions are used.

insignificant with insignificant children (zerotree root)
insignificant with at least one significant child
significant, positive and all children non-negative
significant, positive and at least one child is negative
significant, negative and all children are non-positive
significant, negative and at least one child is positive In this embodiment, sign information in addition to insignificance is predicted for an entire tree. In other embodiments, trees with other sign constraints or with magnitude constraints can be predicted. Alternative predictors might be especially useful in representing texture or in representing multi-resolution features. With larger alphabets, the use of higher order Markov contexts (as described later) may be useful.

Multipass List Based Joint Space/Frequency Embedded Modeling

In the present invention, frequency embedded coding, such as Horizon order modeling disclosed herein, encodes the ternary events corresponding to the coefficients in the A-group. In horizon coding, all of the initializations preceding the coding steps are identical to the frequency-based system. In one embodiment, binary entropy coding is performed with three contexts, "A-group magnitude," "A-group sign" and "B-group."

Figure 7A:
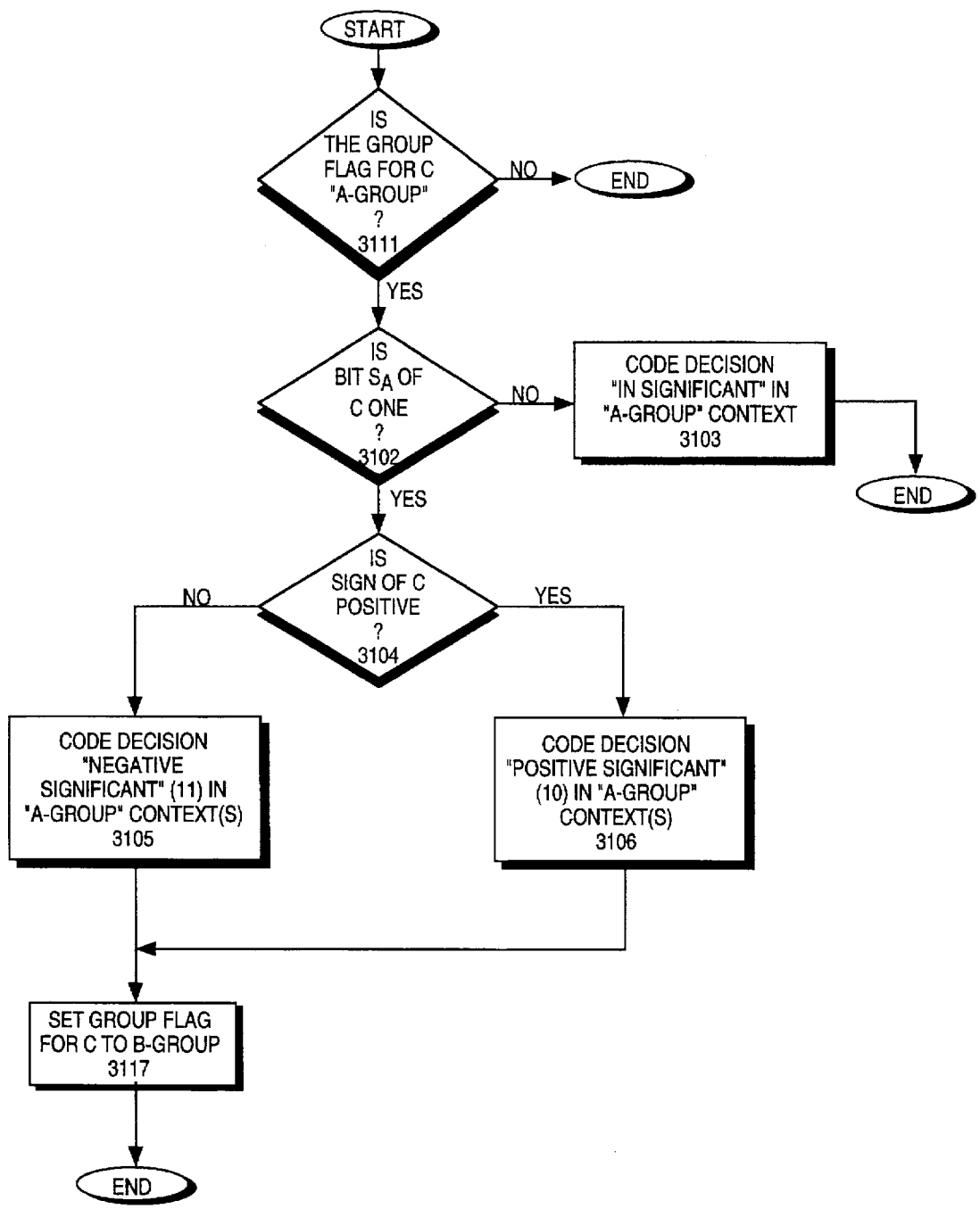
FIG. 7A is a flow chart of one embodiment of the horizon modeling for encoding in the present invention.

FIG. 7A is a flow diagram of one embodiment of the A-pass for a single list horizon encoding process of the present invention. This process may be used in the process of FIG. 27. Referring to FIG. 7A, the A-pass process begins by testing whether the group flag for coefficient C is set to the "A-group" (processing block 3111). If not, the process ends. If the group flag for coefficient C is set to the "A-group", processing continues at processing block 3102 where a test determines if the bit $S_A$ of coefficient C is one. If the bit $S_A$ of coefficient C is not one, the decision is coded as insignificant (0) in "A-group" context (processing block 3103) and the process ends. If the bit $S_A$ of coefficient C is one, then processing continues at processing block 3104 where a test determines whether the sign of coefficient C is positive. If the sign of coefficient C is positive, the decision is coded as "positive significant" (10) in "A-group" context(s) (processing block 3106), and the process continues at processing block 3117. On the other hand, if the sign of coefficient C is not positive, the decision is coded as "negative significant" (11) in "A-group" context(s) (processing block 3105), and the process continues at processing block 3117. At processing block 3117, the group flag for coefficient C is set to the "B-group".

Figure 7B:
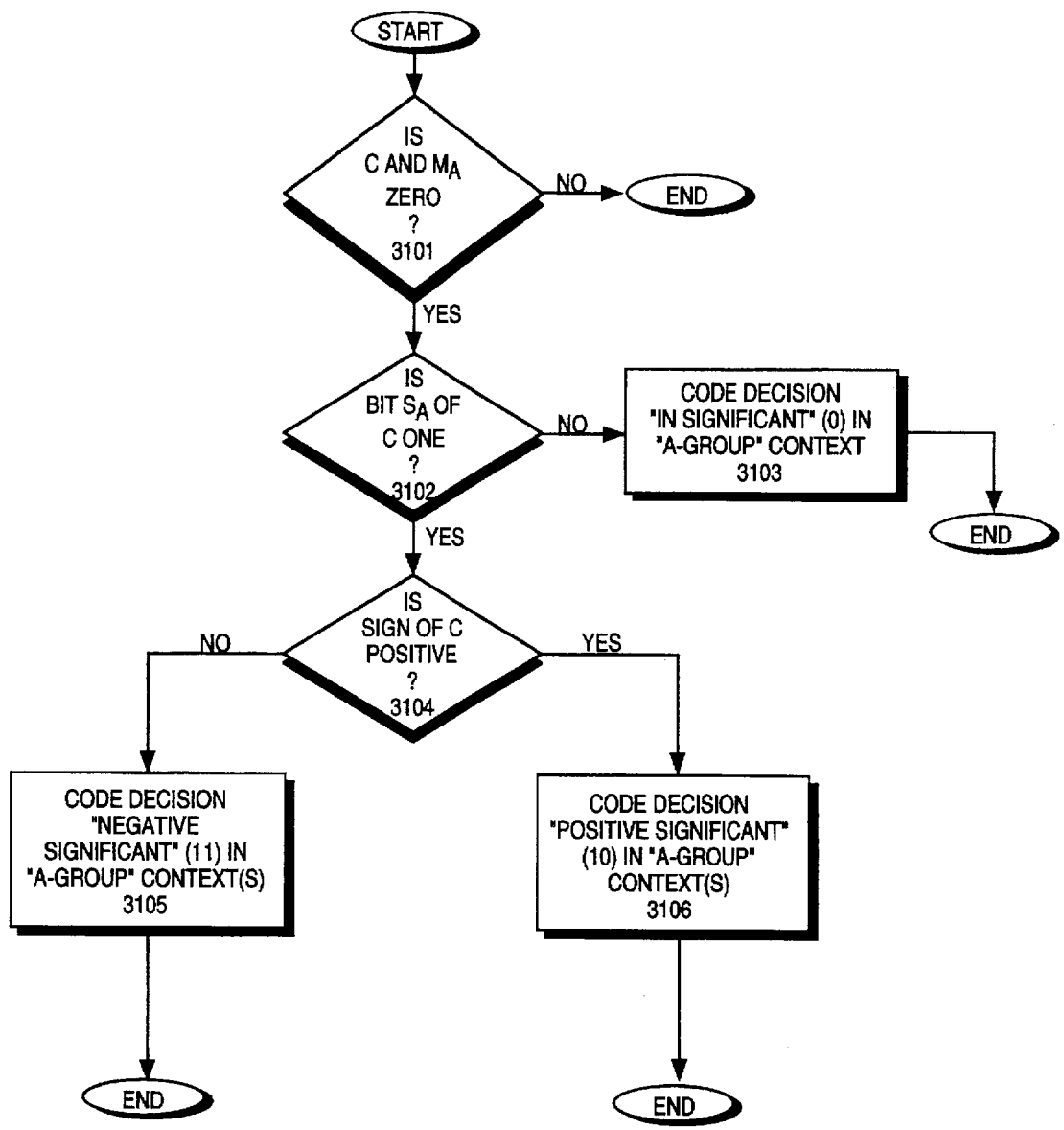
FIG. 7B is a flow chart of one embodiment of the horizon modeling for encoding in the present invention using reduced flag memory.

FIG. 7B is a flow diagram of an alternative embodiment of the A-pass for a single list horizon encoding process using reduced flag memory. This process may be used in the process of FIG. 30. Referring to FIG. 7B, the A-pass process begins by testing whether the result of ANDing coefficient C with the mask $M_A$ is zero (processing block 3101). If not, then the process ends. If the result of ANDing coefficient C with the mask $M_A$ is zero, processing continues at processing block 3102 where a test determines if the bit $S_A$ of coefficient C is one. If the bit $S_A$ of coefficient C is not one, the decision is coded as insignificant (0) in "A-group" context (processing block 3103) and the process ends. If the bit $S_A$ of coefficient C is one, then processing continues at processing block 3104 where a test determines whether the sign of coefficient C is positive. If the sign of coefficient C is positive, the decision is coded as "positive significant" (10) in "A-group" context(s) (processing block 3106), and the process ends. On the other hand, if the sign of coefficient C is not positive, the decision is coded as "negative significant" (11) in "A-group" context(s) (processing block 3105), and the process ends.

Decoding Steps

Figure 7C:
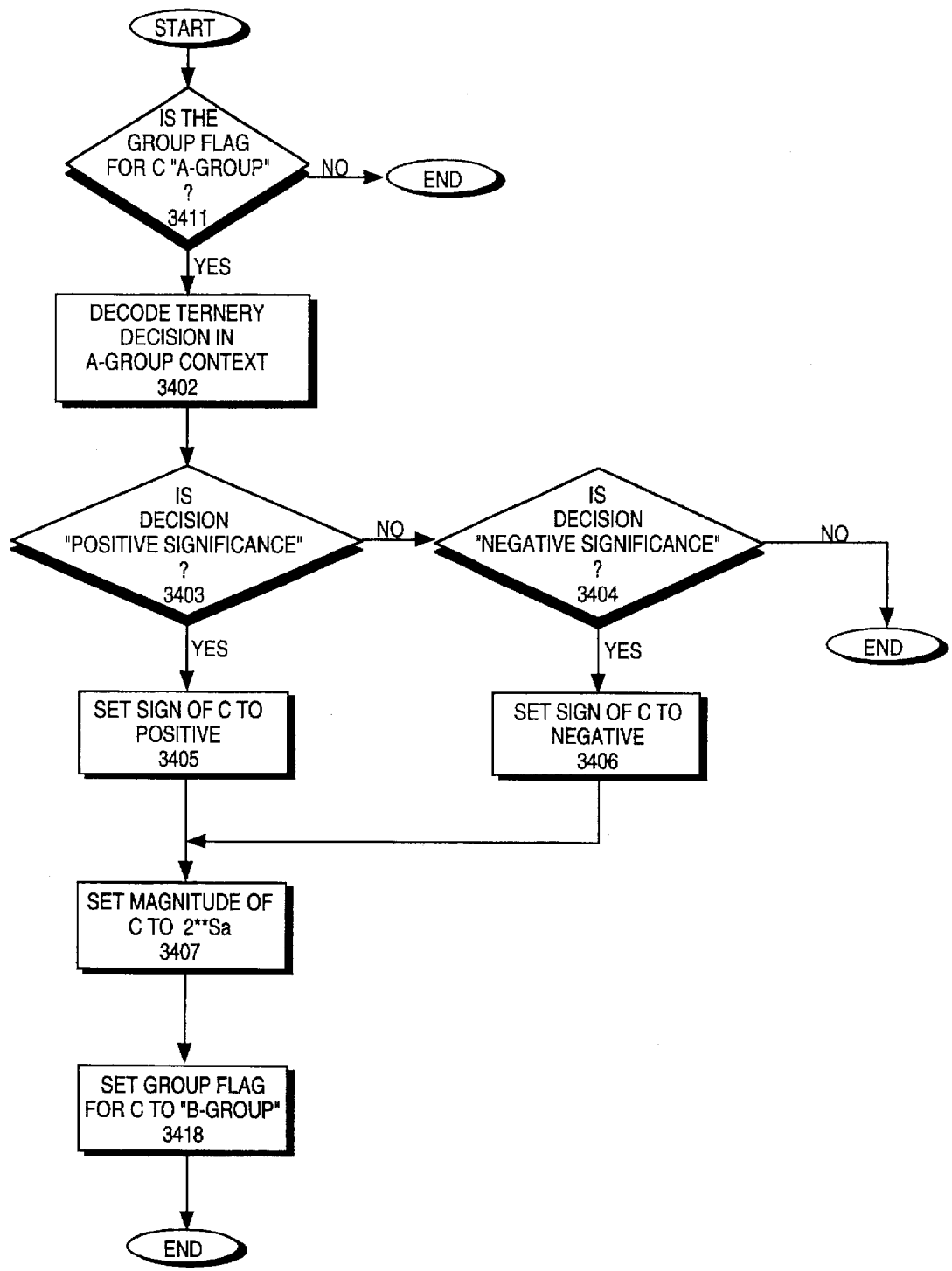
FIG. 7C is a flow chart of the horizon modeling for decoding in the present invention.

FIG. 7C illustrates one embodiment of the A-pass process for a single list horizon decoding process of the present invention, and may be used in the process of FIG. 27. Referring to FIG. 7C, the process begins by testing whether the group flag for coefficient C is set to the "A-group" (processing block 3411). If not, then the process ends. However, if the group flag for coefficient C is set to the "A-group", processing continues at processing block 3402 where the ternary decision is decoded in A-group context(s).

Then a test determines if the decision is "positive significant" (processing block 3403). If the decision is "positive significant", the sign of the coefficient C is set to positive (processing block 3405), the magnitude of the coefficient is set to $2^{S_A}$ (processing block 3407), the group flag for coefficient C is set to the "B-group" (processing block 3418), and the process ends.

If the decision is not "positive significant", a test determines if it is "negative significant" (processing block 3404). If the decision is not "negative significant", the process ends. However, if the decision is "negative significant", then the sign of the coefficient C is set to negative (processing block 3406), the magnitude of C is set to $2^{S_A}$ (processing block 3407), the group flag for coefficient C is set to the "B-group" (processing block 3418), and the process ends.

Figure 7D:
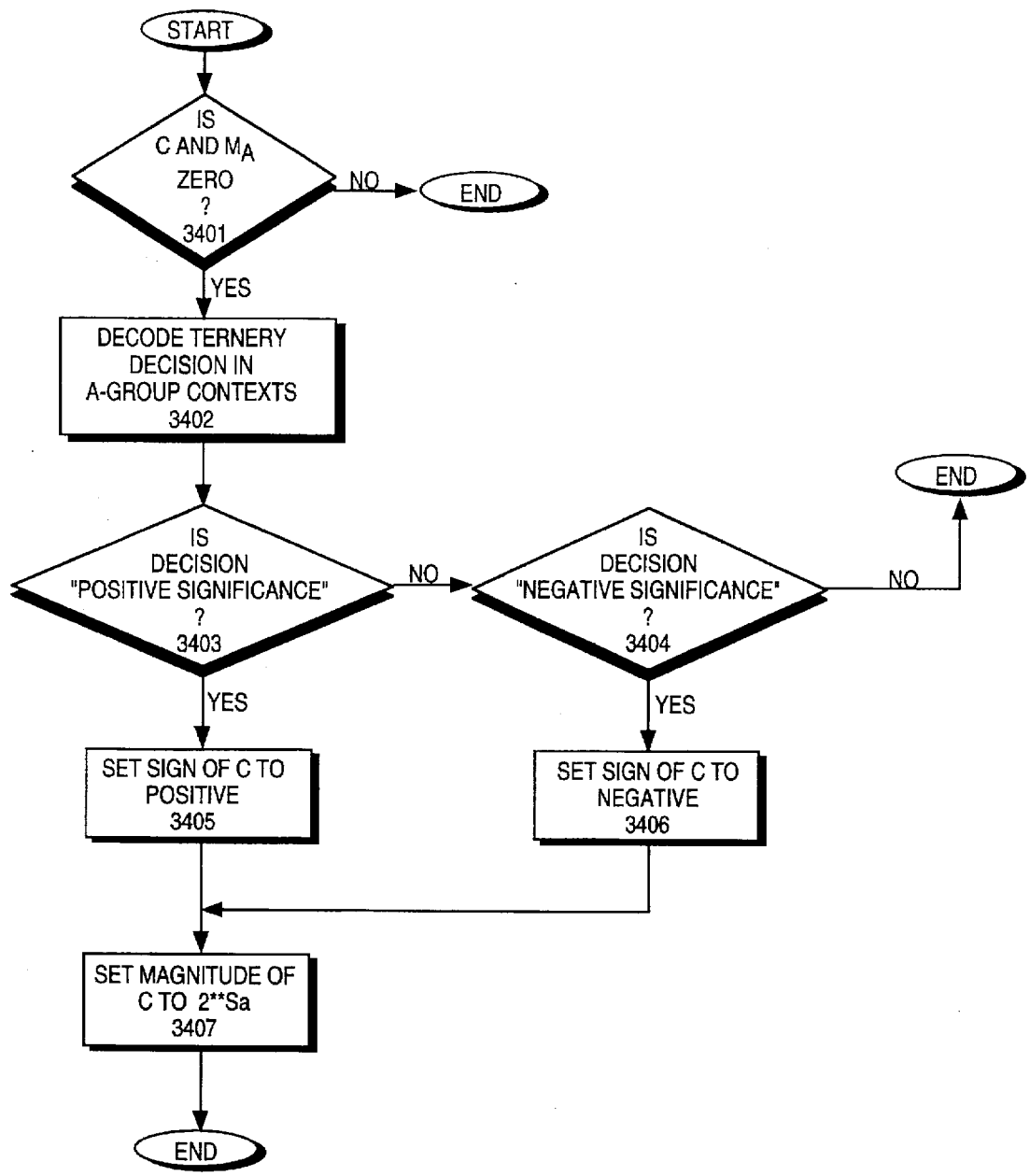
FIG. 7D is a flow chart of the horizon modeling for decoding in the present invention using reduced flag memory.

FIG. 7D illustrates an alternative embodiment of the A-pass process for a single list horizon decoding process using reduced flag memory, and may be used in the process of FIG. 30. Referring to FIG. 7D, the process begins by testing whether the result of ANDing coefficient C with the mask $M_A$ is zero (processing block 3401). If not, then the process ends. However, if the result of ANDing coefficient C with the mask $M_A$ is zero, processing continues at processing block 3402 where the ternary decision is decoded in A-group context(s).

Then a test determines if the decision is "positive significant" (processing block 3403). If the decision is "positive significant", the sign of the coefficient C is set to positive (processing block 3405), the magnitude of the coefficient is set to $2^{S_A}$ (processing block 3407), and the process ends.

If the decision is not "positive significant", a test determines if it is "negative significant" (processing block 3404). If the decision is not "negative significant", the process ends. However, if the decision is "negative significant", then the sign of the coefficient C is set to negative (processing block 3406), the magnitude of C is set to $2^{S_A}$ (processing block 3407), and the process ends.

B-pass for Both Zerotree and Horizon

In one embodiment, the B-pass process for both zerotree and horizon of the present invention are the same. Embodiments for the B-pass algorythm for the encoding process and the decoding process are shown in FIGS. 8A & 8B and 9A & 9B respectively.

Figure 8A:
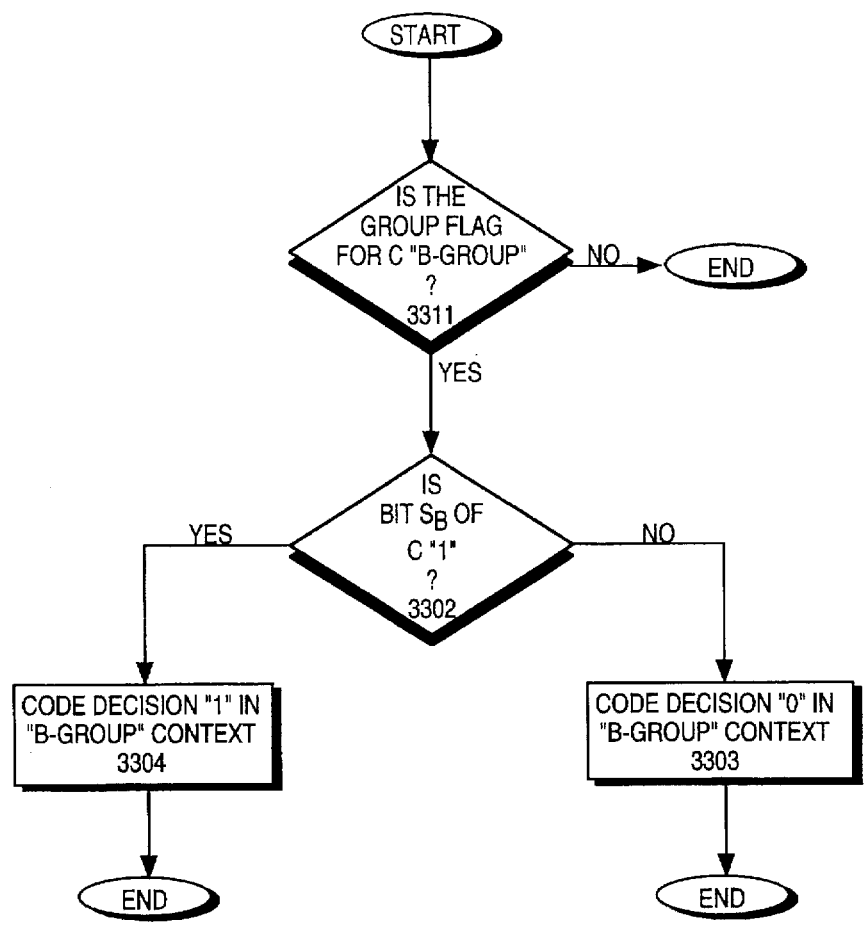
FIG. 8A is a flow chart of one embodiment of the B-pass for encoding in the present invention.

FIG. 8A illustrates one embodiment of the B-pass process that is used partially for zerotree and single list horizon encoding process, and may be used in the process of FIG. 27. Referring to FIG. 8A, the process initially tests whether the group flag for coefficient C is set (processing block 3311). If not, then the process ends. On the other hand, if the group flag is set, processing continues at processing block 3302 where a test determines if the bit $S_B$ of coefficient C is "1". If the bit of $S_B$ of the coefficient C is not "1", then the decision is coded as "0" in "B-group" context(s) (processing block 3303), and the process ends. If the bit $S_B$ of the coefficient C is "1", then the decision is coded as "1" in "B-group" context(s) (processing block 3304), and the process ends.

Figure 8B:
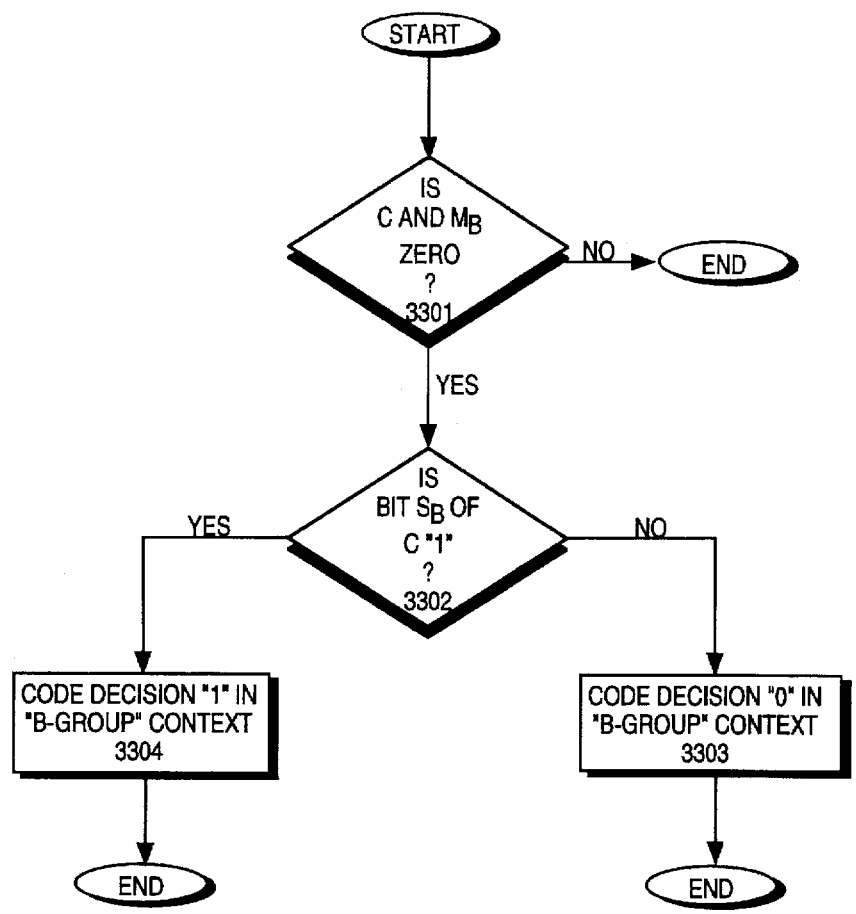
FIG. 8B is a flow chart of one embodiment of the B-pass for encoding in the present invention using reduced flag memory.

FIG. 8B illustrates an alternative embodiment of the B-pass process that is used partially for zerotree and single list horizon encoding process and uses reduced flag memory, and may be used in the process of FIG. 30. Referring to FIG. 8B, the process initially tests whether the result of ANDing the coefficient C with the mask $M_B$ is non-zero (processing block 3301). If not, then the process ends. On the other hand, if the result of ANDing coefficient C with mask $M_B$ is non-zero, processing continues at processing block 3302 where a test determines if the bit $S_B$ of coefficient C is "1". If the bit of $S_B$ of the coefficient C is not "1", then the decision is coded as "0" in "B-group" context(s) (processing block 3303), and the process ends. If the bit $S_B$ of the coefficient C is "1", then the decision is coded as "1" in "B-group" context(s) (processing block 3304), and the process ends.

Figure 9A:
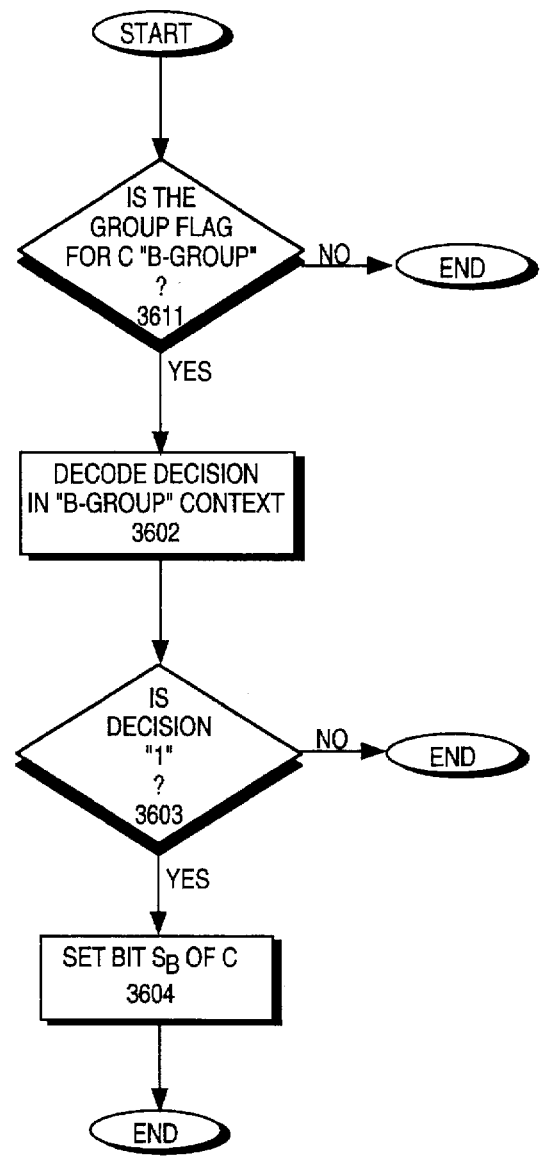
FIG. 9A is a flow chart of one embodiment of the B-pass for decoding in the present invention.

FIG. 9A illustrates one embodiment of the B-pass decoding of the present invention, and may be used in the process of FIG. 27. Referring to FIG. 9A, a test initially determines if the group flag for coefficient C is set to the "B-group" (processing block 3611). If not, then the process ends. However, if the group flag for coefficient C is set to the "B-group", then the decisions are decoded in the "B-group" context(s) (processing block 3602). A test then decides if the decision is a "1" (processing block 3603). If the decision is not a "1", the process ends. If the decision is a "1", the bit $S_B$ of coefficient C is set (processing block 3604) and the proces ends.

Figure 9B:
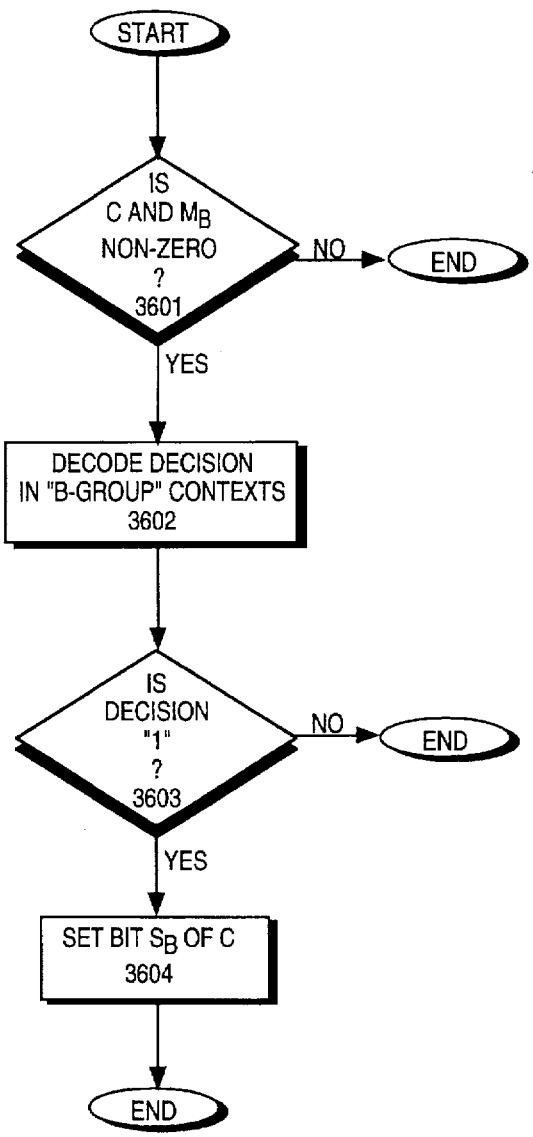
FIG. 9B is a flow chart of one embodiment of the B-pass for decoding in the present invention using reduced flag memory.

FIG. 9B illustrates an alternative embodiment of the B-pass decoding of the present invention using reduced flag memory, and may be used in the process of FIG. 30. Referring to FIG. 9B, a test initially determines if the result of ANDing coefficient C with the mask $M_B$ is non-zero (processing block 3601). If the result of ANDing coefficient C with the mask $M_B$ is zero, then the process ends. However, if the result of ANDing coefficient C with the mask $M_B$ is non-zero, then the decisions are decoded in the "B-group" context(s) (processing block 3602). A test then decides if the decision is a "1" (processing block 3603). If the decision is not a "1", the process ends. If the decision is a "1", the bit $S_B$ of coefficient C is set (processing block 3604) and the process ends.

Using the combination of zerotree order coding and horizon order coding, the present invention provides bit-significance encoding of the coefficients generated by the reversible wavelets. Note that the use of both the A-group and the B-group, and the ternary and the binary events, corresponding to the "A" and "B" passes, respectively, is especially important in view of the fact that a switch is made from using the zerotree ordering to the horizon ordering at the end of any A pass. This compensates for the inefficiency in prediction that accompanies zerotree ordering at the low order bits. Therefore, in the present invention, the system begins by zerotree coding the higher order bits data, and after a number of passes through the lists, i.e., after a number of bitplanes are encoded, the encoder of the present invention switches to encode the remainder of the data using horizon coding. The number of passes can be chosen statistically or can be chosen adaptively by monitoring the performance of the zerotree ordering coding block.

Context Model Alternatives

In one embodiment, five binary context bins are used. This is small when compared with other systems such as JBIG which uses slightly more than 1024 contexts. Compression may be improved by using more context bins. Decisions may be conditioned on spatial location, level, and/or bit position. Decisions may also be conditioned on previously decoded data that is close to the current data in spatial location, level, and/or bit position. In general, zeroth order Markov contexts described earlier may be replaced with higher order Markov contexts.

Some examples are as follows. The most significant (and therefore most easily predicted) bit of each mantissa (B-group data in some embodiments) could use a different context than the rest of the bits. The significant/not significant decision could be conditioned on the same decision made for spatially close previous coefficients at the same transform level. Similarly, the sign bits for significant coefficients might be conditioned on the sign of spatially close previous coefficients at the same level or the sign of the coefficient of the parent.

Context model improvements might be especially important when compressing images that have spatial or multiresolution structure. Grayscale images of line drawings or text are an example of images with both of these types of structure. Improvements are also important for compressing files that already have to be compressed and decompressed with a specified peak error.

Alternative Embodiments of the Present Invention

The present invention may be implemented in hardware and/or software. A hardware implementation of the present invention requires implementation of the wavelet filters, memory/data flow management to provide the data for the filters, a context model to control the embedded coding of the present invention, memory/data flow management to provide the data for the context model, and a binary entropy coder.

Wavelet Filters

Figure 10:
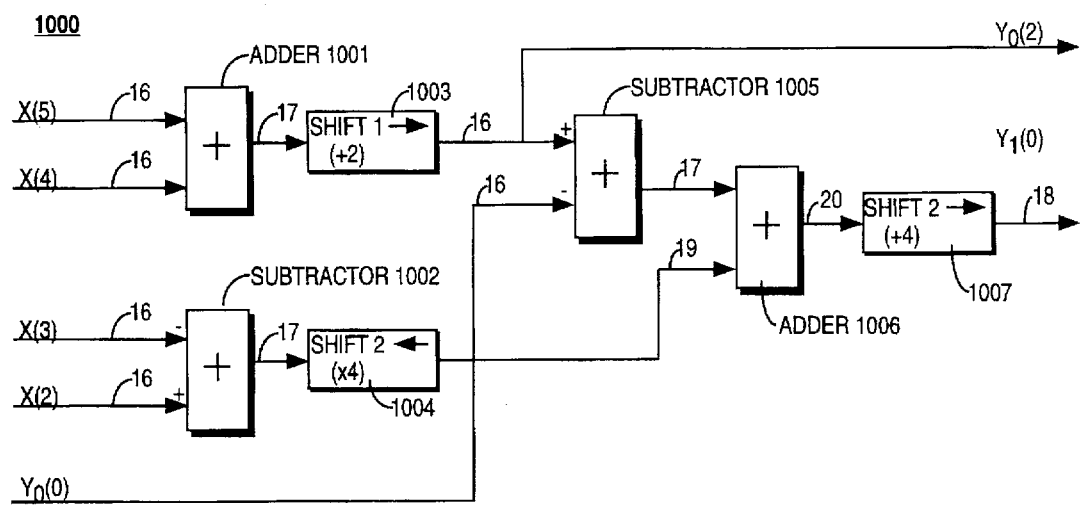
FIG. 10 is one embodiment of the forward wavelet filter of the present invention.

One embodiment of the forward wavelet filter of the present invention is shown in FIG. 10. The wavelet filter shown in FIG. 10 accommodates 4 16-bit two's complement input pixels, shown as x(2)–x(5).

Referring to FIG. 10, the two tap "1 1" low-pass filter uses one 16-bit adder 1001. The outputs are called S and D, respectively. The output of the adder (S) is truncated to 16 bits using shift-by-1 block 1003. The shift-by-1 block 1003 performs a divide-by-2 function by shifting its 17-bit input to the right one bit.

The six tap "−1 −1 8 −8 1 1" high-pass filter requires the computation of $-S_0+4D_1+S_2$. The function $S_2-S_0$ is computed with 16-bit subtractor 1005 receiving the output of shift-by-1 block 1003 and the $Y_0(0)$. The $4D_1$ term is computed using subtractor 1002 and shift-by-2 block 1004. The output produced by 16-bit subtractor 1002 is shifted to the left two places, thereby effectively multiplying its output by four. Adding the $4D_1$ output from shift-by-2 block 1004 to the output of subtractor 1005 is performed by 20-bit adder 1006. The output of the final adder is truncated to 18 bits using shift-by-2 block 1007. Shift-by-2 block 1007 performs a divide-by-4 function by shifting its 20 bit input to the right two bits.

Thus, the total computational hardware required (not counting registers for storing temporary results) is:

1 @ 16-bit adder,
2 @ 16-bit subtractors,
1 @ 19-bit adder.

Note that shifting is performed by the wiring, such that no logic is needed.

In other embodiments, for inputs of size N, one N-bit adder, two N-bit subtractors and one (N+3) bit adder may be used.

Due to the extremely low hardware cost of these adders/subtractors, parallel implementations of the filters can be used if desired.

Note that alternatively, instead of subtracting X(3) and X(2), X(4)–X(5) can be computed and saved until needed later as X(2)–X(3) for the next shift or application of the filter. Both the forward filter (and the inverse filter described below) may be pipelined to achieve higher throughput.

Figure 11:
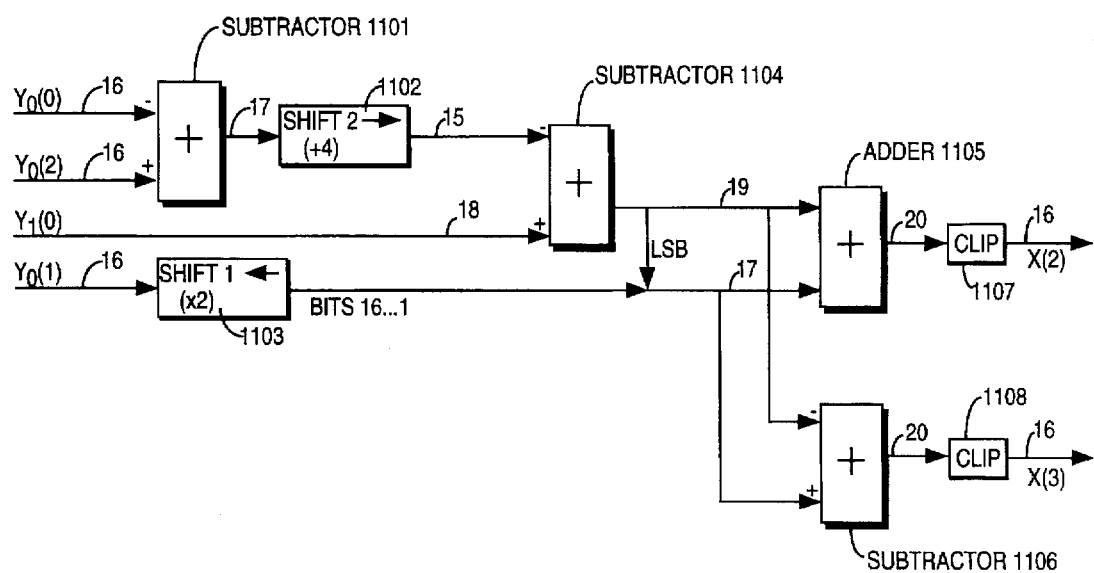
FIG. 11 is a block diagram of one embodiment of a reverse wavelet filter of the present invention.

The inverse wavelet filter is shown in FIG. 11. The inputs of $Y_0(0)$ and $Y_0(2)$ are subtracted by subtractor 1101. The result of the subtraction is shifted to the right two bits by shift-by-2 block 1102. This effectively divides the output of the subtractor by 4. A subtraction is performed between the output of shift-by-2 block 1104 and the $Y_1(0)$ input. The input $Y_0(1)$ is shifted one bit to the left by shift-by-1 block 1103, thereby multiplying the input by two. After $Y_0(1)$ is shifted by 1 (multiplied by two), the LSB of the shifted value is the LSB taken from the output of subtractor 1104 and combined with the 16 bits output from shift-by-1 block 1103 to form an input for adder 1105 and subtractor 1106. The other input for adder 1105 and subtractor 1106 is the output of subtractor 1104. The outputs of adder 1105 and subtractor 1106 may subsequently undergo clipping.

A choice of two clip operations may be used. In both cases, the 20-bit value is shifted by 1 (divided by 2), to a 19-bit value. For a system that only performs lossless compression, the least significant 16 bits can be output (the remaining 3 bits can be ignored). In a lossy system (or a lossy/lossless system), the 19-bit value is set to zero if it is negative or set to $2^{16}-1$ if it is greater than $2^{16}-1$; otherwise, the least significant 16 bits can be output.

For inputs of size N bits, one N-bit subtractor, one (N+2) bit subtractor, one (N+3) bit adder and one (N+3) bit subtractor may be used, and the clip unit outputs N bits.

Memory Usage

With respect to memory and data flow management for the wavelet filters of the present invention, for images where a full frame can fit in memory, memory/data flow management is not a difficult issue. Even for 1024 X 1024 16-bit medical images (e.g., 2 Mbytes in size), requiring a full frame buffer is reasonable for many applications. For larger images (e.g., A4, 400 DPI 4-color images are about 50 Mbytes in size), performing the wavelet transform with a limited amount of line buffer memory is desirable.

Note that a full frame buffer is not necessary for the present invention to implement a one-pass system. Because of this, the memory required may be reduced by about a factor of 100 (compared to using a full frame buffer for large images). The one-pass system of the present invention is described later.

The data stored in the filter memory is a series of coefficients that are to be subjected to the embedded coding and binary entropy coding. The embedded coding uses a context model to coordinate the use of frequency based coding or horizon coding, and to provide data in the proper order. The context model operates in conjunction with a memory management scheme. For systems with a full frame buffer, providing data in the proper order is not difficult. For systems without a full frame buffer, the transform data management scheme of the one-pass embodiment of the present invention (described below) provides coefficients to the context model such that the context model only needs to buffer coefficients for one tree. A one pass frequency based context model and one pass joint space/frequency context model operate on one tree at a time.

The results of the embedding operation of the present invention is to produce bit streams from the frequency based modeling mechanism of the present invention and the joint space/frequency modeling mechanism of the present invention. These bit streams are then encoded using a binary entropy coder.

For system with a full frame buffer, any binary entropy coder (or other appropriate coder) can be used. For systems without a full frame buffer, either multiple independent coders must be used, or the coder must be able to simulate multiple independent coders. Also, memory or channel management is needed to keep track of the outputs from the independent coders. An advantage of the present invention is that the data to be managed is prioritized (embedded). If sufficient space or bandwidth is not available during compression or transmission less important data can be discarded on the fly, providing for reasonable lossy compression.

One Pass System of the Present Invention

The present invention provides a one-pass transform that allows the input data in the system to be completely processed as it is received. In such a system, the processing of the data is not dependent on data that follows. The memory required to compess an image is independent of the length of the image. By removing the dependency, the present invention provides a system that can output compressed data before all of the data has been processed.

A. Data Management for One-Pass Transform

Figure 12:
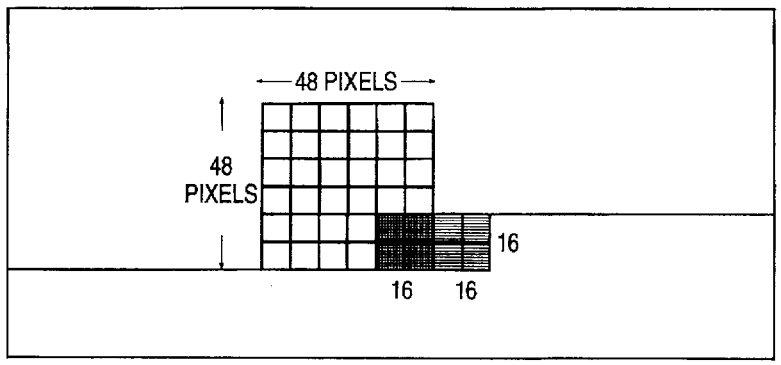
FIG. 12 illustrates an image and coefficients in a line buffer for a four level pyramidal decomposition.

FIG. 12 illustrates a section of an image that is being compressed in a raster order by band fashion using the teachings of the present invention. Consider a four level decomposition. Each tree has $2^4 \times 2^4 = 16 \times 16 = 256$ coefficients. However, since the high-pass filter of the wavelet transform in the present invention is overlapped, each tree depends on more than 256 input pixels. The two tap "1 1" low-pass filter (L) does not cause any overlap, all of the overlap comes from the six tap "−1 −1 8 −8 1 1" high-pass filter (H). The largest overlap occurs for the cascade of three applications of the low-pass filter followed by one application of the high-pass filter (LLLH). Three applications of the low-pass filter (LLL) require a support of $2^3=8$ input pixels. Support regions 8×8 pixels in size are shown in FIG. 12. When the high-pass filter is included in the cascade, the support regions is $(6 \times 2^3) \times (6 \times 2^3) = 48 \times 48$ pixels. A 48×48 pixel support region, consisting of thirty six 8×8 blocks as shown in FIG. 12.

Assume that the coefficients in 48×48 pixel support region shown in FIG. 12 are currently being processed. The lightly shaded portion of the support region depicts pixels that have already been used in previous support regions. The lightly shaded part that is outside the support region illustrates pixels that have already been used in previous support regions and will be needed in future support regions. The black 16×16 region is the part of the support region that contains pixels that have not been used previously. Similarly, the darkly shaded 16×16 region contains pixels that have not been used previously but which will be used in the next 48×48 support region. One three-level 16×16 transform is computed, the pervious results for eight other three-level 16×16 transforms are recalled from a buffer, and the fourth level of the transform is applied to the nine 16×16 three-level transforms. The buffering required to accomplish this is enough to store the three level transform coefficients for (2×width_of_image+32)×16 pixels, plus enough to store a 16 line (one band) buffer of pixels.

Figure 13:
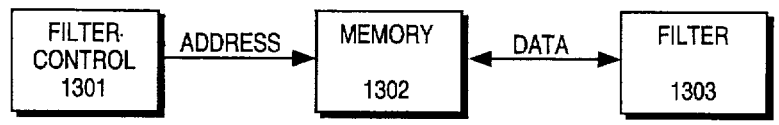
FIG. 13 is a block diagram of one embodiment of wavelet filtering using a filter control unit.

FIG. 13 is a block diagram of one embodiment of the one pass wavelet filtering unit which includes a filter control unit 1301, a memory 1302 and a filter 1303. Filter 1303 comprises the filter described in conjunction with FIG. 10. Memory 1302 refers to the memory described above in conjunction with FIG. 12 and stores either pixels or coefficients. Filter control unit 1301 determines the data flow between memory 1302 and filter 1303. The operation of the filter control unit 1301 is explained below.

Figure 14:
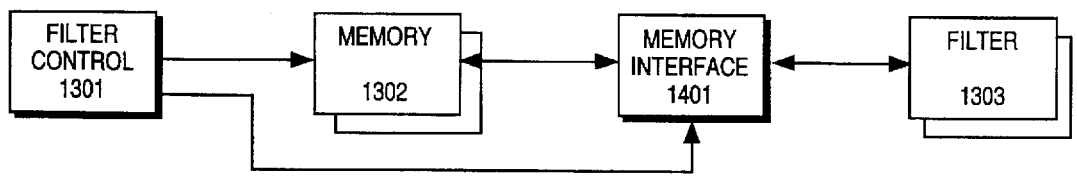
FIG. 14 is a block diagram of another embodiment of wavelet filtering using a filter control unit.

FIG. 14 illustrates an alternative wavelet filter unit. To achieve high speed operation, multiple filters can be used. In one embodiment, since filter 1303 requires 4 or 5 inputs (e.g., inverse filter, forward filter) and produces two outputs, the memory bandwidth required could be substantial. The memory might have multiple pixels/coefficients per location, multiple banks and/or multiple ports. A memory interface unit 1401 reduces the memory bandwidth required by providing small buffers for local data used during processing. Memory interface unit 1401 also provides multiplexing/demultiplexing between the input/output (I/O) of memory 1302 and the I/O of filter 1303.

In addition to the memory bandwidth required for filtering, additional bandwidth may be required for input of the pixels into memory 1302 and output of the coefficients to the context model. If pixels are input in raster order, additional memory may be required for the band buffer.

If a memory stores multiple elements (pixels or coefficients) per location, instead of storing horizontally or vertically adjacent elements in a row or column, it may reduce the amount of memory accesses and buffering required if elements in a N×N block, when N is a power of 2, share the same location. This allows equal convenience for vertical and horizontal accesses.

Figures 15, 16, 17:
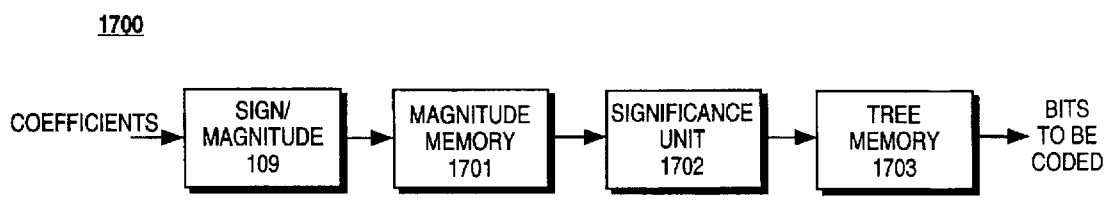
FIG. 15 illustrates the assignment of memory banks to support horizontal and vertical accesses.
FIG. 16 illustrates the filter operation for a two-level decomposition.
FIG. 17 is a block diagram of one embodiment of the context model of the present invention.

Multiple banks of memory may also be implemented so that both horizontal and vertical access can take equal advantage of multiple banks as shown in FIG. 15. For the two bank case, a bank select bit provided for selecting either of the banks may be formed, in one embodiment, by exclusive ORing the LSBs of the horizontal and vertical coordinates. For the four bank case, the two bank select bits may be formed by adding (module 4 with a 2-bit adder) the two LSBs of the horizontal and vertical coordinates.

FIG. 16 illustrates the one-pass filter operation for a 2-level decomposition implementation by the filter control unit 1301 (FIG. 13). Note that for illustration purposes, a 2-level description will be discussed first to illustrate the general technique of the present invention. In other embodiments, 3-level, 4-level, or higher level decompositions are used. A two level decomposition has 16 coefficients per tree and requires computation with 16 input pixels that have not been used previously. The filtering for a tree of coefficients is performed in 16 or fewer time units to correspond with the input and output rate. For this example, two filters operating in parallel are used to achieve the desired throughput of two filtering operations per unit time. For each spatial location, where the leading edge of a filter is applied, FIG. 16 shows a number that indicates the time that each filtering operation is performed.

Since the order of filtering is determined by the leading edge of the filter, filtering does not generate all the coefficients of one tree before generating any of the coefficients of the next tree. The filtering of the children of the tree occurs before the filtering of the parents, and low-pass filtering is done before the corresponding high-pass filtering. The filtering operates on A-group of coefficients which has the same number of coefficients of a type that a tree does.

The level 1 horizontal filtering is performed during time 0 through 7 and the results are stored in a temporary buffer. (Each spatial location results in two coefficients). During time 2 through 9, vertical filtering is performed (using the second filter) on data in the buffer and data from previous horizontal filtering from memory (twice per spatial location). Vertical filtering can begin as soon as the second horizontal filtering operation is complete. The HH, HL and LH coefficients are ready for output to the context model (at the appropriate time). The LL coefficients are used in the next level.

With only two filters, level 0 zero horizontal filtering cannot begin until time 8 when the level 1 horizontal filtering is complete, making a filter available. Level 0 horizontal filtering cannot finish until time 10 one cycle after the level 0 vertical filtering is complete, proving all the required data. Next during time 11 and 12, the level 1 vertical filtering can occur.

Table 1 below summarizes the operation of each filter during each time unit. The format of the entries is level number, horizontal or vertical ("H" or "V") and the spatial location of the leading edge. The inputs of vertical filtering operations are identified as either lowpass to highpass with a subscript "$_L$" or "$_H$". Note that it is not necessary to assign one filter to perform horizontal filtering and the other to perform vertical filtering, since both filters are identical.

TABLE 1

| Time | Filter 1 | Filter 2 |
|------|----------|----------|
| 0 | 1H(0,0) | (idle) |
| 1 | 1H(0,1) | |
| 2 | 1H(2,0) | $1V_L(0,0)$ |
| 3 | 1H(2,1) | $1V_H(0,0)$ |
| 4 | 1H(0,2) | $1V_L(0,2)$ |
| 5 | 1H(0,3) | $1V_H(2,0)$ |
| 6 | 1H(2,2) | $1V_L(0,2)$ |
| 7 | 1H(2,3) | $1V_H(0,2)$ |
| 8 | 0H(0,0) | $1V_L(2,2)$ |
| 9 | (idle) | $1V_H(2,2)$ |
| 10 | 0H(0,1) | (Idle) |
| 11 | (idle) | $0V_L(0,0)$ |
| 12 | | $0V_H(0,0)$ |
| 13 | | (idle) |
| 14 | | |
| 15 | | |

While level 1 horizontal filtering can begin again for the next group of input pixels at time 11, this would cause the filter to operate faster than the input and output rate. Instead, in the present invention, the filters will be idle and the next group will be started at time 16. Idle filtering cycles may be used for memory transfers. Instead of occurring at the end of the filtering for each group, the idle cycles may be distributed among the filtering cycles if desired.

In view of the explanation of the 2-level case, the three level case is shown in Table 2. Concatenations of two or four time units are used to transfer the information onto one page, thereby making it easier to read.

TABLE 2

| Time | Filter 1 | Filter 2 |
|------|----------|----------|
| 0–3 | 2H(0,0), 2H(0,1), 2H(2,0) 2H(2,1) | (idle),(idle) $2V_L(0,0)$, $2V_H(0,0)$ |
| 4–7 | 2H(4,0), 2H(4,1), 2H(6,0) 2H(6,1) | $2V_L(2,0)$, $2V_H(2,0)$, $2V_L(4,0)$, $2V_H(4,0)$ |
| 8–11 | 2H(0,2), 2H(0,3), 2H(2,2) 2H(2,3) | $2V_L(6,0)$, $2V_H(6,0)$, $2V_L(0,2)$, $2V_H(0,2)$ |
| 12–15 | 2H(4,2), 2H(4,3), 2H(6,2) 2H(6,3) | $2V_L(2,2)$, $2V_H(2,2)$, $2V_L(4,2)$, $2V_H(4,2)$ |
| 16–19 | 2H(0,4), 2H(0,5), 2H(2,4) 2H(2,5) | $2V_L(6,2)$, $2V_H(6,2)$, $2V_L(0,4)$, $2V_H(0,4)$ |
| 20–23 | 2H(4,4), 2H(4,5), 2H(6,4) 2H(6,5) | $2V_L(2,4)$, $2V_H(2,4)$, $2V_L(4,4)$, $2V_H(4,4)$ |
| 24–27 | 2H(0,6), 2H(0,7), 2H(2,6) 2H(2,7) | $2V_L(6,4)$, $2V_H(6,4)$, $2V_L(0,6)$, $2V_H(0,6)$ |
| 28–31 | 2H(4,6), 2H(4,7), 2H(6,6) 2H(6,7) | $2V_L(2,6)$, $2V_H(2,6)$, $2V_L(4,6)$, $2V_H(4,6)$ |
| 32–35 | 1H(0,0), 1H(0,1), 1H(2,0) 1H(2,1) | $2V_L(6,6)$, $2V_H(6,6)$, $1V_L(0,0)$, $1V_H(0,0)$ |
| 36–39 | 1H(0,2), 1H(0,3), 1H(2,2) 1H(2,3) | $1V_L(2,0)$, $1V_H(2,0)$, $1V_L(0,2)$, $1V_H(0,2)$ |
| 40–43 | 0H(0,0, (idle), 0H(0,1), (idle) | $1V_L(2,2)$, $1V_H(2,2)$, (idle), $0V_L(0,0)$, |
| 44–47 | (idle) | $2V_H(0,0)$, (idle), (idle), (idle) |
| 48–51 | | (idle) |
| 52–55 | | |
| 56–59 | | |
| 60–63 | | |

Table 3 illustrates the four level case. Since there are now 256 time units per group of coefficients, for simplicity, only the level and direction of filtering is shown.

TABLE 3

| Time | Filter 1 | Filter 2 |
|------|----------|----------|
| 0–1 | Level 3 Horizontal | (idle) |
| 2–127 | Level 3 Horizontal | Level 3 Vertical |
| 128–129 | Level 2 Horizontal | Level 3 Vertical |
| 130–159 | Level 2 Horizontal | Level 2 Vertical |
| 160–161 | Level 1 Horizontal | Level 2 Vertical |
| 162–167 | Level 1 Horizontal | Level 1 Vertical |
| 168 | Level 0 Horizontal | Level 1 Vertical |
| 169 | (idle) | Level 1 Vertical |

TABLE 3-continued

| Time | Filter 1 | Filter 2 |
| --- | --- | --- |
| 170 | Level 0 Horizontal | (idle) |
| 171 | (idle) | Level 0 Vertical |
| 172 | (idle) | Level 0 Vertical |
| 173–255 | (idle) | (idle) |

The output of the filtering and memory subsystem of the present invention are a series of coefficients that undergo bit-significance embedded coding in the present invention.

B. The Context Model for the One-Pass System

In one embodiment of the present invention, the bit significance embedded context model for the one-pass system, each tree is processed in four parts. The root of the tree, the highest level LL coefficient, is coded by one-pass horizon order coding. The three subtrees starting with each of the roots three children, the highest level HH, HL and LH coefficients, are processed with both one pass joint space/frequency modeling and one pass frequency-based modeling. The coefficients are coded such that encoded data may be output prior to the bit significance embedding context model operating on all of the data.

One-Pass Significance Tree

The zerotree context model cannot be used in the one-pass system. Zerotree requires a list (or multiple lists) that contains every coefficient and zero-tree makes multiple passes through the lists(s). An alternative frequency-based model, one-pass significance tree, does not require any lists containing all the coefficients. Another difference between one pass significance tree and zerotree is that significance tree processes all children before processing its parents when generating decisions, in contrast to zerotree which processes parent first.

The context model of the present invention is shown in block diagram form in FIG. 17. Context model 1700 contains two processing units, the sign/magnitude unit 109 (FIG. 1A) and the significance unit 1702. Context model 1700 also uses two memories (with memory control logic), a magnitude memory 1701 and a tree memory 1703. Each of these two memory units may be implemented with multiple storage areas to allow for alternating use during high speed operation (i.e., while data is being written into one, the other is being read, or emptied).

The magnitude memory 1701 reorders coefficients in the tree into an order based on significance, such as an order based on their magnitude. This is accomplished by maintaining a queue for each possible magnitude. The significance unit 1702 receives coefficients in order of significance (e.g., magnitude) and generates decisions for a coder that handles the A-pass algorithm. Tree memory 1703 is coupled to significance unit 1702 and eliminates zerotrees after all zeros.

The following discussion assumes that the coefficients are 18-bits and that the input data has undergone a four level decomposition.

Figure 18:
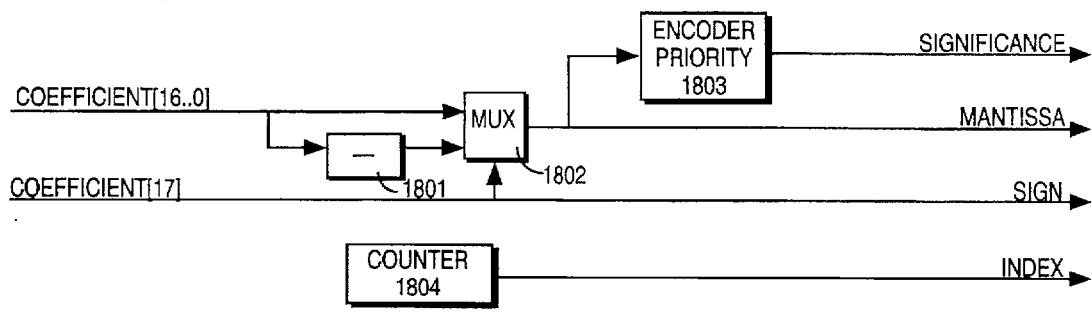
FIG. 18 is a block diagram of one embodiment of the sign/magnitude unit of the present invention.

One embodiment of the sign/magnitude unit 109 is shown in FIG. 18 and converts input coefficients into a sign/magnitude format. Sign/magnitude unit 109 is coupled to receive 18 bits of the coefficients and includes an inverter 1801, a multiplexer (MUX) 1802, a priority encoder 1803 and a counter 1804. The sign/magnitude unit 109 outputs a significance indication (e.g., a 5-bit value), the mantissa of the input coefficient, (e.g., 17 bits), the sign of the input coefficient 1 bit and an index from counter 1804, (e.g., 7 bits.)

MUX 1802 is coupled to receive 17 bits of the coefficient directly input into sign/magnitude unit 109 and an inverted version of the 17 bits from two's complementer 1801. Based on the sign bit (coefficient bit 17) received on the select input of MUX 1802, the positive of the two inputs is output as the mantissa.

The sign/magnitude unit 109 uses a priority encoder 1803 to determine the first significant bit of each coefficient. Based on the first significant bit of each coefficient, a significance level may be associated with the coefficient.

Counter 1804 is used to associate an index with the current tree element. For a four level decomposition, the index varies from 0 to 84 (because 1+4+16+64=85, the number of elements in a subtree). The input coefficients are in tree order, which is assumed to be parents first, children last in this example. The coefficients are from different levels of decomposition as shown in Table 4 for the coefficients in order.

TABLE 4

| Level | Coefficients index |
| --- | --- |
| 0 | 0 |
| 1 | 1,22,43,64 |
| 2 | 2,7,12,17,23,28,33,38,44,49,54,59,65,70,75,80 |
| 3 | 3...6, 8...11, 13...16, 18...21, 24...27, 29...32, 34...37, 39...42, 45...48, 50...53, 55...58, 60...63, 66...69, 71...74, 76...79, 81...84 |

Figure 19:
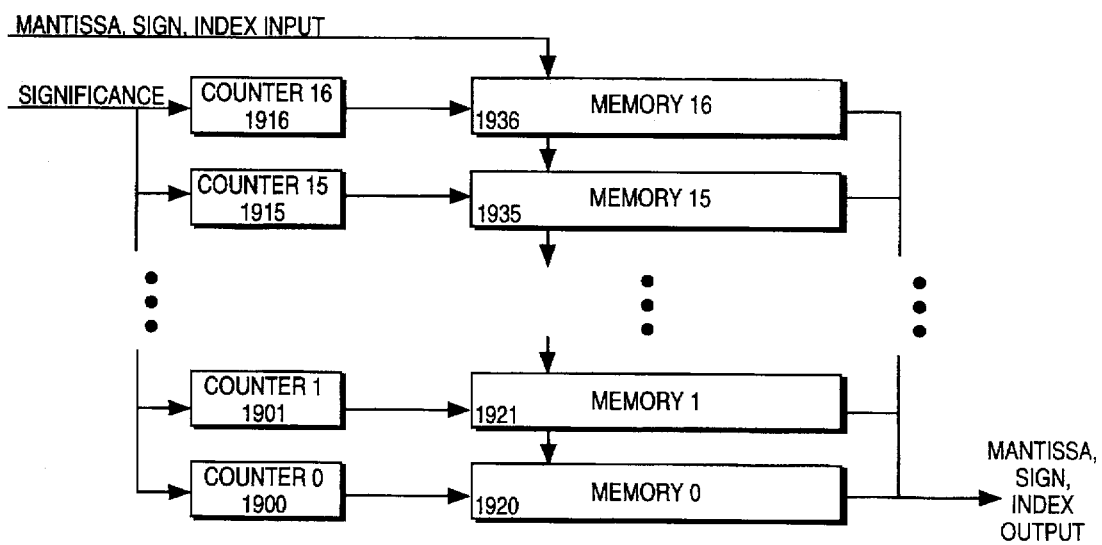
FIG. 19 is a block diagram of one embodiment of the magnitude memory unit of the present invention.

FIG. 19 is one embodiment of the block diagram of magnitude memory 1701. A counter and a memory is associated with each possible significance level (except nothing is needed for zero coefficients which do not need to be coded). For instance, counter 1916 and memory 1936 are associated with significance level 17. In one embodiment, there are sixteen levels of significance. Therefore, there are 17 counters and 17 associated memories.

In one embodiment, each memory must have 85 locations, for each possible coefficient in a subtree (since each subtree contains 85 coefficients), but the memory size might be rounded up to a power of 2, such as 128, for convenience. Each memory entry can contain a sign bit, a 7-bit index and N magnitude bits, where N is the significant level. If the use of a fixed width memory is desired, entries for significant 16 and 0, 15 and 1, etc. can be combined, so that each word has two entries totaling 32 bits. Of course, with an odd number of significance levels, one word must contain only one entry, which is level 7 in this example.

Sign, index, and mantissa values received from sign/magnitude unit 109 are written to the appropriate memory at the address provided by the associated memory's counter. The associated counter is then incremented so that the next coefficient at that significance level may be stored in the next location.

Memory is read out from each of the memories 1920–1926 in descending order of significance. The output of each coefficient includes its mantessa, sign, and index output. If counter for the highest level of significance (e.g., level 16) is nonzero, it is decremented and the memory is read at that address. This is repeated until the counter value is zero. Then the next level of significance (e.g., level 15) is considered. Each level of significance is considered in turn until all the counters have been decremented to zero and all the memories emptied.

In a real-time system, it may be desirable to use two banks of counters and memories, so that one bank can be used for input while the other is used for output.

The counters address their associated memory such that a LIFO (last in, first out) is implemented. A LIFO is the correct order for when subtrees are input in the order of parents first. Alternatively, if subtrees were input child first, the operation of the counters could be changed to implement a FIFO (first in, first out).

Figure 20:
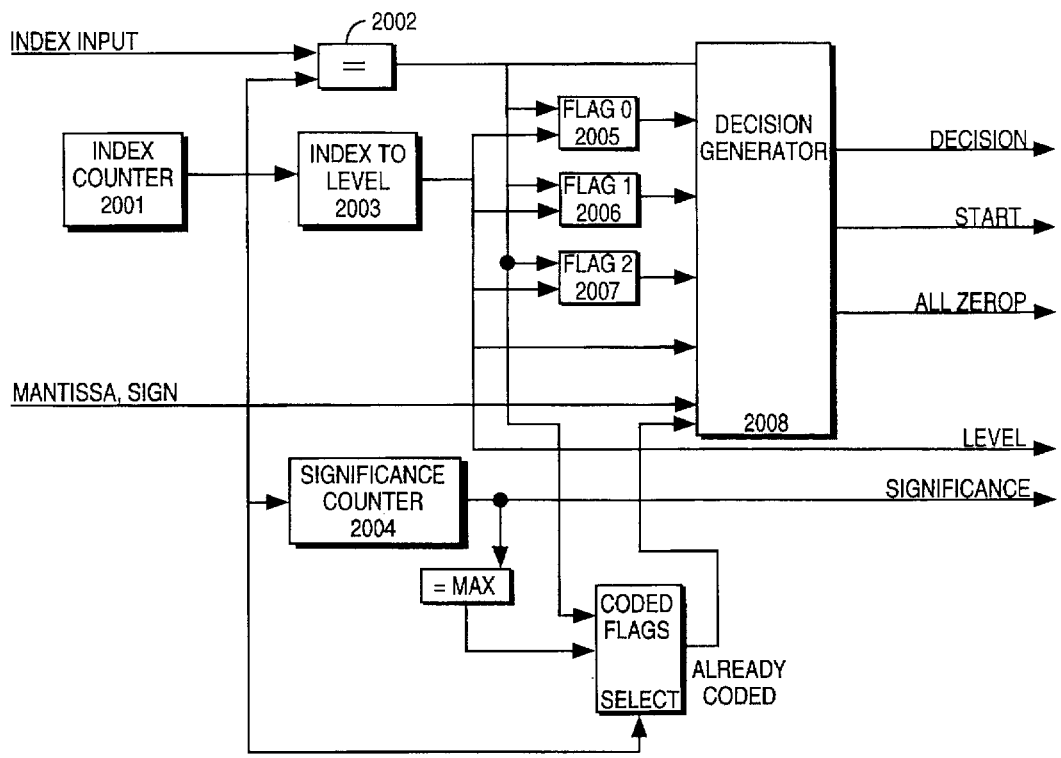
FIG. 20 is a block diagram of one embodiment of the significance unit of the present invention.

FIG. 20 is a block diagram of one embodiment of significance unit 1702. Referring to FIG. 20, index counter 2001 is used to step through each coefficient in a subtree, children first. In one embodiment, index counter 2001 is initialized to 84 and counts down to zero. Significance counter 2004 begins at the maximum significance level (e.g., 16 in the example) and counts down every time index counter 84 completes a cycle (returns to 84), such that the significance counter 2004 keeps track of the bitplane. The level of a particular index is determined by logic (index to level 2003) that performs the function shown in Table 4 above.

Magnitude memory unit 1701 provides an index, magnitude and sign of the next coefficient in the memory enabled by the output of the significance counter 2004. If the index input from memory is the same as the index output of index counter 2001, the equivalence logic 2002 asserts the non-zero output indication. The non-zero output indication signifies that the magnitude memory should provide the next index, etc. on the next cycle. If there is not a match, then a non match indication is sent to discussion generator 2008.

In one embodiment, three flip-flops, shown as flag 0 (2005), flag 1 (2006), and flag 2 (2007), are used to keep track of non-zero data and are assigned to decomposition levels 0, 1 and 2, respectively. Note that the number of flip-flops required is one less than the number of decomposition levels. Flip-flops 2005–2007 are initially cleared. When the non-zero signal from equivalence logic 202 is asserted, all of the flip-flops in flip-flops 2005–2007 that assigned to a level less than the current level are set. The flip-flop assigned to the current level is cleared. The level is provided by index-to-level logic 2003, which provides the level in response to the index provided by index counter 2001.

"Coded" flags are stored (in some embodiments a register file), one bit for each index. When the non-zero signal is asserted, the bit associated with the current index counter value in the coded flags storage is set. Otherwise, if the significance counter value is the maximum value, the associated bit is cleared. Otherwise, the value of the bit remains unchanged. The already coded output signal from coded flags storage is the same as the new value of the bit associated with the current index. Note that in an alternative embodiment, the coded flags are not used and the already coded signal is never used.

In one embodiment, decision generator 2008 determines when the current level is 3 and the previous level was not. In response to this determination, decision generator 2008 asserts the start output and the start level output is the previous level. If the non-zero signal is asserted, the decision generator 2008 outputs a decision as "significant" and also outputs the sign (00,01) and the mantissa. Otherwise, if the already coded input is asserted, no decision is output. Otherwise, if the flag flip-flop assigned to the current level is set, decision generator 2008 outputs the decision as "insignificant, with significant children" (10). Otherwise, decision generator 2008 outputs the decision as "insignificant, and children insignificant" (11) and asserts the all zero signal.

Note that to implement both frequency-based modeling and horizon one pass joint space/frequency modeling, the following change is made to significance unit 2000. Significance counter 2004 is compared with a threshold, and the all zero output is only asserted if the counter value is greater than the threshold.

In one embodiment, the significance category input to tree memory 1703 (shown in FIG. 21 and described below) is the output of the significance counter 2004. In this embodiment of the context model (e.g., bit-significance embedding unit), the significance category is based on the number of bitplanes, and there are 17 different categories of significance. This is an arbitrary choice. In another embodiment, bitplanes may be combined to create fewer significance categories. Also, level information can be added to bitplane information to create more significance categories. More significance categories might provide better lossy compression while fewer might reduce hardware complexity.

Figure 21:
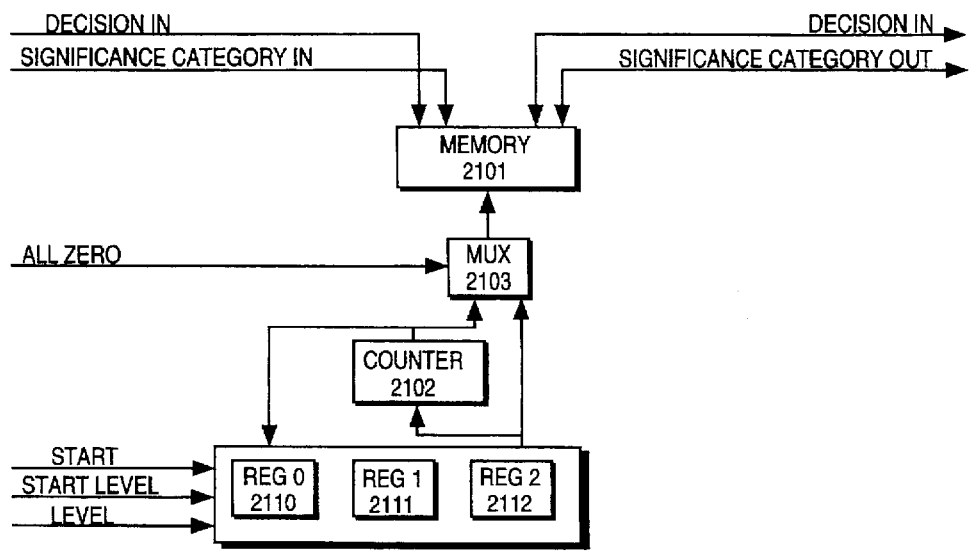
FIG. 21 is a block diagram of one embodiment of the tree memory unit of the present invention.

FIG. 21 is a block diagram of one embodiment of the tree memory unit of the present invention. Referring to FIG. 21, memory 2101 has adequate space for storing a decision and a significance indication for each possible decision. In one embodiment, for a four level decomposition with 17 significance levels, the number of locations in memory 2101 is equal to 85×17=1445.

To access memory 2101, addresses are generated. Counter 2102 is initially zero. When decision generator 2008 does not assert the all zero input, the value in counter 2102 is used to address memory. If decision generator 2008 asserts the start input, the current value of counter 2102 is stored in one of registers 2110–2112 according to the start level, which acts as a selection mechanism. Counter 2102 is then incremented.

When decision generator 2008 asserts the all zero input, the value in the register (e.g., 2110, 2111, 2112) selected by the level input is used to address memory 2101 and this value plus one is loaded into counter 2102. This causes the memory locations used for insignificant children of an insignificant parent to be ignored.

During memory output, counter 2102 is decremented to provide the address of the location to output. Output (and decrementing) stops when counter 2102 reaches zero. The output from tree memory unit 2100 is received by an entropy coder that properly codes the decision at the specified significance.

For real-time operation, two tree memory units can be used so that one is used for input while the other is used for output.

Coefficient Alignment

In one embodiment of the present invention, the zerotree context model uses an unnormalized $1+Z^{-1}$ low-pass filter. However, the zerotree context model may be used with normalized filters, such as $$\frac{1+Z^{-1}}{\sqrt{2}}$$

Figure 22:
FIG. 22 is a block diagram of one embodiment of coefficient shifting of the present invention.

In order to use normalized filters, an alignment unit, such as alignment unit 2200 in FIG. 22 between the forward wavelet filter 1000 and the context model 105, can be used to compensate for the energy gained (or alternatively, lost) from the unnormalized filter, which improves compression. Because alignment allows non-uniform quantization for lossy operation, alignment can enhance the visual quality of lossy image reconstructions. In the one-dimensional case, coefficients from each level of the tree would have different alignment (divisors=$\sqrt{2}$, 2, 2$\sqrt{2}$, 4, multipliers=2$\sqrt{2}$, 2, $\sqrt{2}$, 1). In the two-dimensional case, the divisors would be 2, 4, 8, 16 and the multipliers would be 8, 4, 2, 1.

Since the alignment is just for grouping similar binary decisions for coding, using the exact normalization value is not critical. The alignment must be inverted during decoding, so both multiplication and division are required. Using factors/divisors that are powers of two would allow hardware efficient shifting to be performed instead. When coefficients are multiplied by a power of two, the lessor significant zero bits added do not have to be coded.

Figure 23:
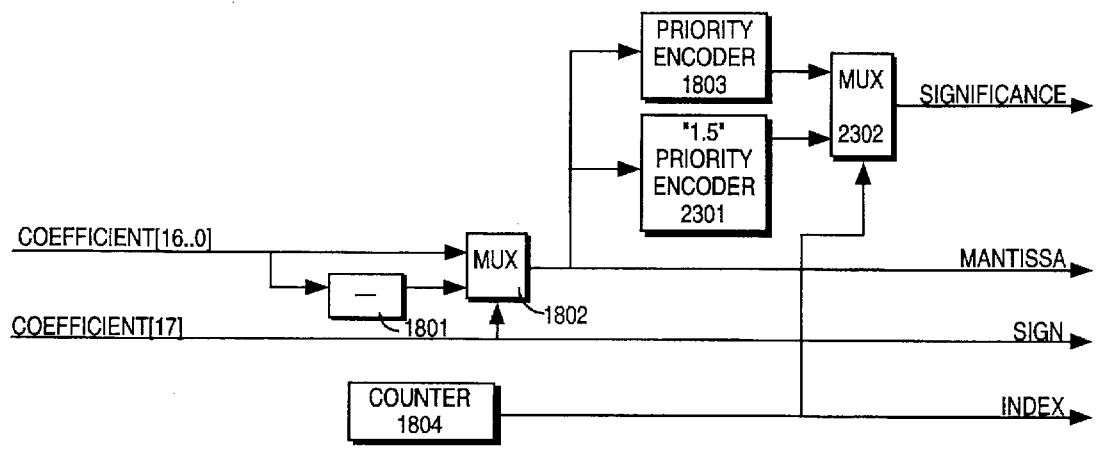
FIG. 23 is a block diagram of an alternative embodiment of the significance unit of the present invention using an alignment by 1.5.

However, instead of limiting the alignment factors/divisors to power of two, an approximation like $\sqrt{2} \approx 1.5$ or $\sqrt{2} \approx 2 \div 1.5$ can be used with the following method. Instead of multiplying/dividing coefficients by the factor/divisor, only the "significant" coefficients would instead be scaled by the factor/divisor. The sign/magnitude unit may be modified as shown in FIG. 23 to include a "1.5" priority encoder 2301 that returns the position of either (1) the most significant "1" bit if the next most significant bit is "1" also, or otherwise (2) the one less than the position of the most significant "1" bit. A truth table for a "1.5" priority encoder for 3 input bits is shown in Table 5.

TABLE 5

| Input (Binary) | Output |
|---|---|
| 001 | 0 |
| 010 | 0 |
| 011 | 1 |
| 100 | 1 |
| 101 | 1 |
| 110 | 2 |
| 111 | 2 |

Depending on the level of the coefficient indicated by the current index value, a multiplexer 2302 selects the significance from either the standard priority encoder or the "1.5" priority encoder. Whenever the "1.5" alignment is used, the mantissa contains N+1 bits, where N is the significance value. Otherwise, the mantissa contains N bits.

An alignment unit 2200 comprising a two input multiplexer acting as a shifter can implement aligning by 1 or 2. Combining this with the 1.5 alignment provided by the sign/magnitude unit allows alignments of 1, 1.5, 2, or 3 which is a good approximation of the desired multipliers for one-dimensional signals since the numbers are simpler (e.g., powers of two). (For two-dimensional signals like images, the numbers are simpler.) During decoding, the N+2th bit of the mantissa (which is not coded) is the complement of the N+1th bit when the "1.5" priority encoder is used.

Figure 31:
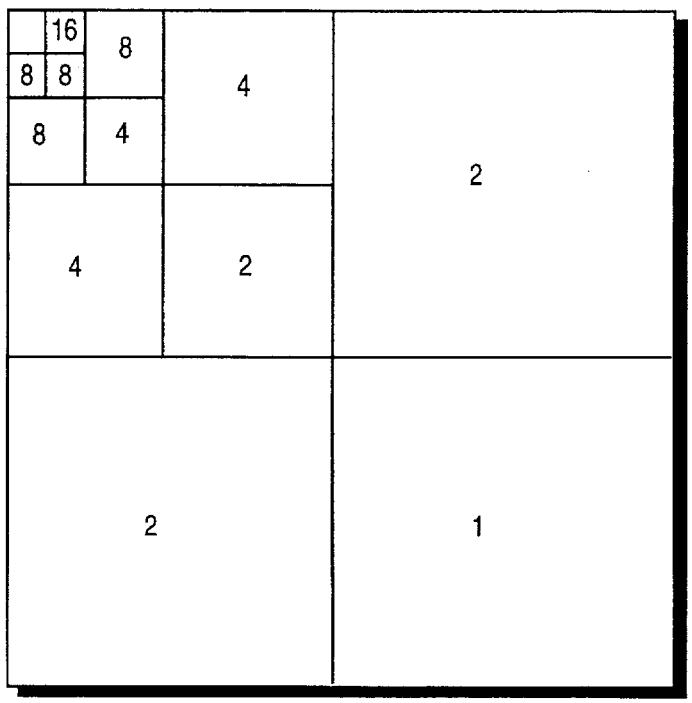
FIG. 31 is one embodiment of the multipliers for the frequency band used for coefficient alignment in the present invention.

Coefficient alignment can be used for tuning the zerotree and for finer and non-uniform quantization. In case of images (two dimensional signals), one embodiment of the RTS-transform aligns the coefficients by multiplying the frequency band by the numbers depicted in FIG. 31. Multiplying these numbers results in the RTS-transform being a very close approximation of the exact reconstruction wavelets of the TS-transforms.

The entropy coder must take into account the alignment process to be efficient.

Frequency-based Context Models by Fractional Bitplanes

An alternative method of frequency-based modeling uses fractional bitplanes or fractional bits of significance. One implementation of this is to process each bitplane twice, such that the passes include an A1-pass, a B1-pass, an A0-pass, and a B0-pass. Note that the names of the passes were chosen because the A1-pass handles coefficients starting with "11" and the A0-pass handles those starting with "10".

During the A1-pass for bitplane S, a coefficient in the A-group is significant only if both bits S and S–1 are non-zero. During the A2-pass, a coefficient in the A-group is significant if bit S is non-zero. Since the two most significant bits are known, the B1-pass and the B0-pass only need to process S–1 bits (assuming S=0 is the least significant bitplane).

Since alternate fractional bitplanes differ by a factor of 1.5 or 2/1.5, alignment for different levels can be achieved by grouping the desired fractional bitplanes for each level.

Fractional bitplanes cause finer modeling of the data by the parent/child relationship used by frequency-based context model. More than two passes, for example, four or eight passes could be used for even finer modeling. For example, in the four pass case, the A11-pass would handle coefficients that started with "111". The other passes would handle "110," "101" and "100." Less fine modeling could also be used. For example, a pass could be made only for every other bitplane. In the less fine modeling case, more bits are coded by the B-group.

C. Coder and Memory/Channel Management for One-Pass System

Memory management for coded data in the one pass system is presented for systems that store all of the data in memory and for systems that transmit data in a channel. In the one-pass system, coded data must be stored such that it can be accessed in an embedded causal fashion, so that less significant data can be discarded without losing more significant data. Since coded data is variable length, dynamic memory allocation can be used.

In one embodiment of the present invention, the embedded coding scheme uses 18 bitplanes and, thus, assigns 18 levels of significance to the data. The coder in a one-pass system must be "embedded causal." That is, the decoding events corresponding to a bitplane do not require information from lower order bitplanes. In the one-pass case, typically all of the bits from one tree will be coded before any of the bits in the next tree are coded, so bits of different significance are not separated. For coders that do not use internal state, like Huffman coders, this is not a problem. However, many sophisticated compressors with better compression use internal state.

One way to solve this problem for these coders is to use 18 different coders, perhaps 18 Q-coder chips. A technique that would allow the use of 9 Q-coder chips is described in U.S. Pat. No. 5,097,261 (Langdon, Jr.), entitled "Data Compression for Recording on a Record Medium," issued Mar. 17, 1992. A better way uses a pipelined coder to implement different virtual codes with a single physical coder, such as that described in U.S. patent application Ser. No. 08/016,035, entitled "Method and Apparatus for Parallel Decoding and Encoding of Data", filed Feb. 10, 1993. In such a coder, the multiple bit generator states for each probability are each assigned to a part of the data. For example, each of 18 states could be assigned to a particular bitplane for 18 bit data. Registers in the shifter in the coder are also assigned to each part of the data. In the encoder, no interleaving is performed; each part of the data is simply bitpacked.

In embodiments either with multiple physical or virtual coders, memory is allocated to each part of the data. When compression is complete, a linked list describing the memory allocated plus the contents of the allocated memory is the result.

If the memory overflows, the memory allocation routing causes more important data to overwrite less important data. For example, the least significant bit of numeric data might be overwritten first. The information that describes how memory is allocated must be stored in addition to the coded data.

Figure 24:
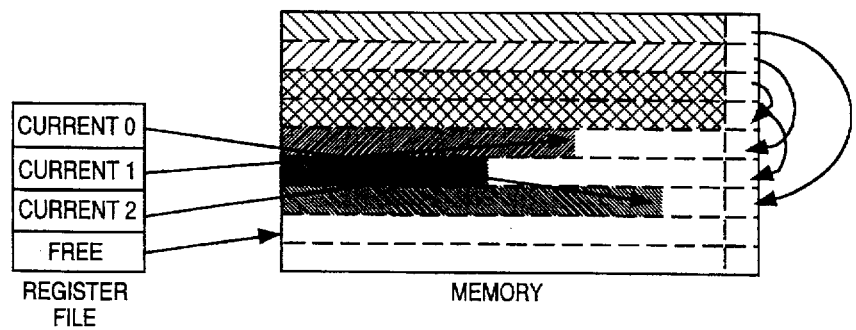
FIG. 24 illustrates the dynamic allocation of coded data memory for one pass operation.

FIG. 24 shows an example dynamic memory allocation unit for three categories of significance. Only three categories are described to avoid obscuring the present invention; typically, a larger number of categories, such as 8, 16 or 18, would be used. A register file (or other storage) holds a pointer for each category of significance plus another pointer for indicating the next free memory location. The memory is divided into fixed size pages.

Initially, each pointer assigned to a significance category points to the start of a page of memory and the free pointer points to the next available page of memory. Coded data, identified with a significance category, is stored at the memory location addressed by the corresponding pointer. The pointer is then incremented to the next memory location.

When the pointer reaches the maximum for the current page, the address of the start of the next free page stored in the free pointer is stored with the current page as a link. In one embodiment, the part of the coded data memory or a separate memory or register file could be used for this purpose. Then the current pointer is set to the next free page. The free pointer is incremented. These steps cause a new page of memory to be allocated to a particular significance category and provide links to pages of memory containing data for a common significance category so that the order of allocation can be determined during decoding.

When all pages in the memory are in use and there is more data that is more significant than the least significant data in memory, memory reassignment may be performed. Three such reassignment techniques are described. In all three cases, memory assigned to the least significant data is reassigned to more significant data and no more least significant data is stored.

First, the page currently being used by the least significant data is simply assigned to the more significant data. Since most typical entropy coders use internal state information, all of the least significant data stored previously in that page is lost.

Second, the page currently being used by the least significant data is assigned to the more significant data. Unlike the previous case, the pointer is set to the end of the page and as more significant data is written to the page, the corresponding pointer is decremented. This has the advantage of preserving the least significant data at the start of the page if the more significant data does not require the entire page.

Third, instead of the current page of least significant data being reassigned, any page of least significant data may be reassigned. This requires that the coded data for all pages be coded independently, which may reduce the compression achieved. It also requires that the uncoded data corresponding to the start of all pages be identified. Since any page of least significant data can be discarded, greater flexibility in quantization is available.

The third alternative might be especially attractive in a system that achieves a fixed rate of compression over regions of the image. A specified number of memory pages can be allocated to a region of the image. Whether lessor significant data is retained or not can depend on the compression achieved in a particular region. Note that the memory assigned to a region might not be fully utilized if lossless compression required less than the amount of memory assigned. Achieving a fixed rate of compression on a region of the image can support random access to the image regions.

When compression is complete, the data may be transferred, if desired, to a channel or storage device in order of significance. The various links and pointers would then no longer be needed and multi-pass decoding could be performed. Alternatively, for one-pass decoding, the pointers to the data for each significance can be kept.

In some applications, some significance categories might not be used. For example, a 16-bit compressor might be used on a 12-bit medical image, so significance categories corresponding to bitplanes 15 . . . 12 would be unused. In implementations with large pages and many unused significance categories, this would waste memory (when the system does not know in advance that some categories are unused), since memory does not have to be allocated to them. Another solution to this memory waste would be to use a small memory (or register) to hold a count for each significance category. The count would keep track of the number of "insignificant, no significant children" decisions that occur before any other decision occurs. The memory required to store these counters must be "traded-off" against the memory used by unused significance categories.

The ability to write data into each page from both ends can be used to better utilize the total amount of memory available in the system. When all pages are allocated, any page that has sufficient free space at the end can be allocated for use from the end. The ability to use both ends of a page must be balanced against the cost of keeping track of the location where the two types of data meet. Note that this is different from the case where one of the data types was not significant and could simply be overwritten.

Using a Channel

In a system where data is transmitted in a channel instead of being stored in a memory and fixed size pages of memory are used (but only one page per significance category is needed), when a page of memory is full, it is transmitted in the channel, and memory location can be reused as soon as they are transmitted. In some applications, the page size of the memory can be the size of data packets used in the channel or a multiple of the packet size. (Note that in one embodiment, two pages per significance level can be used so that data can be written into one while the other is read for output to the channel.

In some communications systems, for example ATM (Asynchronous Transfer Mode), priorities can be assigned to packets. ATM has two priority levels, priority and secondary. Secondary packets are only transmitted if sufficient bandwidth is available. A threshold can be used to determine which significance categories are priority and which are secondary. Another method would be to use a threshold at the encoder to not transmit significance categories that were less significant than a threshold.

Lossy Compression with Bounded Peak Error

In some applications, perfect (lossless) reconstruction is not needed. It may be desirable to achieve compression with a specified maximum peak error. Let the peak error be ±E. This can be achieved by truncating the compressed data, so that all lessor significant data that is not needed to achieve the desired accuracy is discarded.

Another way for achieving compression with a specified maximum peak error is to divide (with integer division) by a value less than or equal to 2×E+1 each pixel of the image to be compressed. During reconstruction, each pixel in the image is processed with:

output pixel=(2×E+1)×input pixel+E.

(Alternatively, instead of adding E during decompression, subtraction can occur during compression prior to dividing by 2×E+1.)

Another way to achieve compression with a specified maximum peak error is to replace the division and multiplication by shifts. The shift amount is $\lfloor \log 2(2 \times E+1) \rfloor$. Because shifting is convenient, a better error specification (replacing peak error) might be errors of the form $(-2^n < \text{error} < -2^n]$.

The preceding should not be confused with quantization of coefficients that is well known in the art of lossy image compression. In many lossy compression systems (e.g., JPEG), transform domain coefficients are assigned a maximum peak error, which only indirectly controls the peak error of the image. A critical difference is that the present invention performs the quantization on pixels and uses lossless compression of coefficients.

Transform domain quantization can also be used. Many coefficients have an effect on peak error propagates through multiple levels of the transform. It is easier to determine the effect on peak error for the high-pass coefficients that have no children.

Consider a one-dimensional signal which is to be encoded with a maximum peak error of ±E. This can be achieved by quantizing the finest detail high-pass coefficients to ±2E. For a two-dimensional signal, since there are two applications of the high-pass filter, the finest detail HH coefficients can be quantized to ±4E.

An alternative to using quantization of the input image is to control the decisions to the entropy coder. One example is the following. For each coefficient, if setting the coefficient to zero would not cause the error in any pixel affected by that coefficient to exceed the maximum error, the coefficient is set to zero. In some implementations only particular coefficients will be tested, perhaps only the AC coefficients that have no children. Coefficients can be considered with a greedy strategy where one is considered at a time. Other strategies can consider small groups of coefficients and choose to zero the largest possible subset of the group.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

---

Example Code for RTS Transform (Forward)
-One Level Decomp.

```
void RTS (T,w,m,n)
int w,m,n:
int *T;
{
    int i,j,k;
    int *X, *Y;
    for (i=0;i<n;i++)
    {
        for (j=0;j<m;j+=2)
        {
            X[j/2] = (T[i*w+j]+T[i*w+2+j+1])>>1;
            Y[j/2] = T[i*w+j]-T[i*w+j+1];
        }
        for (j=0;j<m/2;j++)
        {
            T[i*m+j]=X[j];
            T[i*m+m/2+j]= (-X[j]+(Y[(j+1)%(m/2)]<<2)+X[(j+2)%(m/2)]
>>2;
        }
    }
}
```

Example Code for RTS Transform (Inverse)
-One Level Decomp.

```
void InverseRTS (T,w,m,n)
int w,m,n;
int *T;
{
```

-continued

```
    int i,j;
    int *B, *D;
    for (i=0;i<n;i++)
    {
        for (j=0;j<m/2;j++)
        {
            B[j] = (-T[i*m+j]+T[i*m+((j+2)%(m/2))])&0X3;
            D[J+1)%(m/2)] = ((T[i*m+j]-T[i*m+((j+2)%(m/2))]+
                (T[i*m+m/2+j]<<2)+B[j])>>2);
        }
        for (j=0;j<m/2;j++)
        {
            T[i*w+2*j] = ((T[i*m+j]<<1)+D[j]+1)>>1;
            T[i*w+2*j+1] = T[i*w+2*j] - D[j];
        }
    }
}
```

Two Level Decomp-RTS Transform (Forward)

```
void RTS (T,w,m,n)
int w,m,n;
int *T;
{
    int i,j,k;
    int *temp;
    int *X, *Y;
    for (i=0;i<n;i++)
    {
        for (j=0;j<m,j+=2)
        {
            X[j/2] = (T[i*w+j+1])>>1;
            Y[j/2] = T[i*w+j]-T[i*w+j+1];
        }
        for (j=0,j<m/2,j++)
        {
            temp[i*m+j]=X[j];
            temp[i*m+m/2+j]= (-X[j]+(Y[(j+1)%(m/2)]<<2)+X[(j+2)%(m/2)
])>>2;
        }
    }
    for (j=0;j<m,j++)
    {
        for (i=0;i<n;i+=2)
        {
            X[i/2] = (temp[i*m+j[+temp[(i+1)*m+j])>>1;
            Y[i/2] = temp[i*m+j]-temp[(i+1)*m+j];
        }
        for (i=0;i<n/2;i++)
        {
            T[i*w+j]=X[i];
            T[(i+n/2)*w+j]= (-X[i]+(Y[(i+1)%(n/2)]<<2)+X[(i+2)%(n/2)])
>>2;
        }
    }
}
```

Two Level Decomp.-RTS Transform (Inverse)

```
void InverseRTS (T,w,m,n)
int w,m,n;
int *T;
{
    int i,j;
    int *B, *D;
    int *temp;
    for (j=0;j<m;j++)
    {
        for (i=0;i<n/2;i++)
        {
            B[i] = (-T[i*w+j]+T[((i+2)%(n/2))*w+j])&0X3;
            D[(i+1)%(n/2)] = ((T[i*w+j]-T[((i+2)%(n/2))*w+j]+T[(n/2+i)
*w+j]<<2)+B[i])>>2);
        }
        for (i=0;i<n/2;i++)
        {
            temp[2*i*m+j] = ((T[i*w+j]<<1)+D[i]+1)>>1;
            temp[(2*i+1)*m+j] = temp[2*i*m+j] - D[i];
        }
    }
    for (i=0;i<n;i++)
    {
```

-continued

```
for (j=0;j<m/2;j++)
{
    B[i] = (-temp[i*m+j]+temp[i*m+((j+2)%(m/2))])&0X3;
    D[(j+1)%(m/2)] = ((temp[i*m+j]-temp[i*m+((j+2)%(m/2))]+
        (temp[i*m+m/2+j]<<2)+B[j])>>2);
}
    for (j=0;j<m/2;j++)
{
    T[i*w+2*j] = ((temp[i*m+j]<<D[j]+1)>>1;
    T[i*w+2*j+1] = T[i*w+2*j] - D[j];
    }
}
}
```

We claim:

1. A coder for encoding a plurality of data symbols comprising:

a wavelet transform;

a formatting unit coupled to receive a plurality of coefficients from the wavelet transform and to format the plurality of coefficients into a set of formatted coefficients;

a magnitude memory coupled to receive the set of formatted coefficients and configured to reorder coefficients in trees into an order based on significance, wherein the magnitude memory comprises a plurality of storage areas, wherein each of the plurality of storage areas stores data for a distinct significance level, a plurality of counters, wherein each of the plurality of counters is associated with one of the plurality of storage areas and counter values for each of the plurality of counters provide address locations in the plurality of storage areas for storage of the formatted coefficients and are incremented after storing an individual formatted coefficient;

a significance unit coupled to the formatting unit to generate a plurality of decisions in response to each of the set of formatted coefficients;

a memory mechanism coupled to receive the plurality of decisions from the significance unit; and a coder coupled to the memory mechanism and configured to encode data.

2. The coder defined in claim 1 wherein the coder comprises an entropy coder.

3. The coder defined in claim 1 wherein the formatting unit comprises a sign magnitude unit configured to convert the plurality of coefficients into sign magnitude format.

4. The coder defined in claim 3 wherein the sign magnitude unit comprises:

a significance determination mechanism to output a significance indication for each coefficient;

a sign and mantissa generator coupled to receive each of the plurality of coefficients and to generate a sign and mantissa for said each of the plurality of coefficients; and an index counter for generating an index for each of the plurality of coefficients.

5. The coder defined in claim 4 wherein the significance determination mechanism comprises a priority encoder.

6. The coder defined in claim 4 wherein the significance determination mechanism comprises a pair of priority encoders and a selection mechanism to select between outputs from each of the pair of priority encoders to output the significance indication.

7. The coder defined in claim 3 wherein the sign magnitude unit further comprises means for generating an index for each coefficient indicating a tree location.

8. The coder defined in claim 1 wherein the wavelet transform comprises a reversible wavelet transform.

9. The coder defined in claim 1 wherein each of the plurality of formatted coefficients is stored in the magnitude memory based on significance level.

10. The coder defined in claim 1 wherein the magnitude memory reorders coefficients based on their magnitude.

11. The coder defined in claim 1 wherein each of the plurality of storage areas comprises a location for each possible coefficient in a subtree.

12. The coder defined in claim 1 wherein coefficient information is read out of the magnitude memory in descending order of significance.

13. The coder defined in claim 12 wherein the coefficient information is output from the magnitude memory by, repeatedly, reading out coefficient information at an address indicated by the counter for the highest level of significance and decrementing the counter value until the counter value is zero and then repeating the output of coefficient information for the next highest level of significance, wherein the output of coefficient information continues until all of the plurality of counters have been decremented to zero and all of the plurality of storage areas have been emptied.

14. The coder defined in claim 1 wherein each counter addresses its individual storage area such that a last in, first out buffer (LIFO) is implemented.

15. The coder defined in claim 1 wherein each counter addresses its individual storage area such that a first in, first out buffer (FIFO) is implemented.

16. The coder defined in claim 1 wherein the plurality of counters comprise two banks of counters and the plurality of storage areas comprise two banks of storage areas, and further wherein the magnitude memory uses one of the two banks of counters and one of the two banks of storage areas to receive formatted coefficients from the formatting unit while the magnitude memory uses the other of the two banks of counters and the other of the two banks of storage areas to output formatted coefficients to the significance unit.

17. A coder for encoding a plurality of data symbols comprising:

a wavelet transform;

a sign/magnitude unit coupled to receive a plurality of coefficients from the wavelet transform and to format each of the plurality of coefficients into sign magnitude format;

a magnitude memory coupled to the sign magnitude unit to reorder coefficients in sign magnitude format into an order based on significance, wherein the magnitude memory comprises a plurality of counters; and a plurality of memories coupled to the plurality of counters, such that each of the plurality of counters is coupled to a distinct one of the plurality of memories, wherein each counter and memory pair is associated with a significance level, such that one of the memories stores each coefficient formatted in sign/magnitude format at a location in said one memory based on an address specified by a count in its associated counter and the count is incremented after an individual formatted coefficient is stored at the location specified by the count;

a significance unit coupled to generate a plurality of decisions in response to each of the plurality of coefficients being in sign magnitude format;

a tree memory coupled to receive the plurality of decisions from the significance unit; and a coder coupled to the memory mechanism and configured to encode data.

18. The coder defined in claim 17 wherein the sign/magnitude unit comprises:

a multiplexer (MUX) having a first input, a second input, a selection input, and an output, wherein the first input is coupled to receive a portion of each coefficient and the second input is coupled to receive an inverted version of said each coefficient, and further wherein the selection input is coupled to receive a sign bit indication for said each coefficient, the output being the mantissa; and a priority encoder coupled to receive the mantissa from the MUX to determine the first significant bit of each coefficient.

19. The coder defined in claim 18 wherein the sign/magnitude unit further comprises a counter to associate an index for each coefficient with a current tree element.

20. The coder defined in claim 17 wherein each of the plurality of storage areas comprises a location for each possible coefficient in a subtree.

21. The coder defined in claim 17 wherein each memory location is configured to store a mantissa, a sign bit indication and an index received from the sign/magnitude unit.

22. The coder defined in claim 17 wherein each counter is enabled to count based on a significance indication received from the sign/magnitude unit.

23. The coder defined in claim 17 wherein a mantissa, a sign bit indication and an index for each coefficients are read out of the plurality of memories based on descending order of significance.

24. The coder defined in claim 17 wherein the wavelet transform comprises a reversible wavelet transform.

25. The coder defined in claim 17 wherein coefficient information is read out of the magnitude memory in descending order of significance.

26. The coder defined in claim 25 wherein the coefficient information is output from the magnitude memory by, repeatedly, reading out coefficient information at an address indicated by the counter for the highest level of significance and decrementing the counter value until the counter value is zero and then repeating the output of coefficient information for the next highest level of significance, wherein the output of coefficient information continues until all of the plurality of counters have been decremented to zero and all of the plurality of storage areas have been emptied.

27. The coder defined in claim 17 wherein each counter addresses its individual storage area such that a last in, first out buffer (LIFO) is implemented.

28. The coder defined in claim 17 wherein each counter addresses its individual storage area such that a first in, first out buffer (FIFO) is implemented.

29. The coder defined in claim 17 wherein the plurality of counters comprise two banks of counters and the plurality of storage areas comprise two banks of storage areas, and further wherein the magnitude memory uses one of the two banks of counters and one of the two banks of storage areas to receive formatted coefficients from the formatting unit while the magnitude memory uses the other of the two banks of counters and the other of the two banks of storage areas to output formatted coefficients to the significance unit.

* * * * *